United States Patent
Yu et al.

(10) Patent No.: US 12,218,089 B2
(45) Date of Patent: *Feb. 4, 2025

(54) PACKAGED SEMICONDUCTOR DEVICE AND METHOD OF FORMING THEREOF

(71) Applicant: Taiwan Semiconductor Manufacturing Co., Ltd., Hsinchu (TW)

(72) Inventors: Chen-Hua Yu, Hsinchu (TW); Kuo-Chung Yee, Taoyuan (TW); Chih-Hang Tung, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 69 days.

This patent is subject to a terminal disclaimer.

(21) Appl. No.: 18/153,847

(22) Filed: Jan. 12, 2023

(65) Prior Publication Data
US 2023/0170320 A1   Jun. 1, 2023

Related U.S. Application Data

(63) Continuation of application No. 17/232,528, filed on Apr. 16, 2021, now Pat. No. 11,581,281.

(60) Provisional application No. 63/044,608, filed on Jun. 26, 2020.

(51) Int. Cl.
*H01L 23/00* (2006.01)
*H01L 25/00* (2006.01)
*H01L 25/065* (2023.01)

(52) U.S. Cl.
CPC .............. *H01L 24/08* (2013.01); *H01L 24/80* (2013.01); *H01L 25/0657* (2013.01); *H01L 25/50* (2013.01); *H01L 2224/08145* (2013.01); *H01L 2224/80895* (2013.01); *H01L 2224/80896* (2013.01); *H01L 2225/06541* (2013.01)

(58) Field of Classification Search
CPC ........... H01L 24/80; H01L 2224/80895; H01L 25/0657; H01L 2225/06541
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |

(Continued)

*Primary Examiner* — Dale E Page
*Assistant Examiner* — Wilner Jean Baptiste
(74) *Attorney, Agent, or Firm* — Slater Matsil, LLP

(57) ABSTRACT

A semiconductor device includes a first die, a second die on the first die, and a third die on the second die, the second die being interposed between the first die and the third die. The first die includes a first substrate and a first interconnect structure on an active side of the first substrate. The second die includes a second substrate, a second interconnect structure on a backside of the second substrate, and a power distribution network (PDN) structure on the second interconnect structure such that the second interconnect structure is interposed between the PDN structure and the second substrate.

20 Claims, 52 Drawing Sheets

(56) References Cited

U.S. PATENT DOCUMENTS

| | | |
|---|---|---|
| 9,735,131 B2 | 8/2017 | Su et al. |
| 10,629,616 B1 * | 4/2020 | Kai ........................ H10B 43/35 |
| 10,665,581 B1 | 5/2020 | Zhou et al. |
| 11,393,780 B2 | 7/2022 | Said et al. |
| 11,581,281 B2 * | 2/2023 | Yu ........................ H01L 23/5286 |
| 2014/0151882 A1 | 6/2014 | Morimoto |
| 2019/0006240 A1 | 1/2019 | Or-Bach et al. |
| 2019/0279965 A1 | 9/2019 | Lattard |
| 2019/0287868 A1 | 9/2019 | Zelikson |
| 2020/0043832 A1 | 2/2020 | Mohamed et al. |

* cited by examiner

PACKAGED SEMICONDUCTOR DEVICE AND METHOD OF FORMING THEREOF

PRIORITY CLAIM AND CROSS-REFERENCE

This application is a continuation of U.S. patent application Ser. No. 17/232,528, filed on Apr. 16, 2021, and entitled, "Packed Semiconductor Device and Method of Forming Thereof," which claims the benefit of U.S. Provisional Application No. 63/044,608, filed on Jun. 26, 2020, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
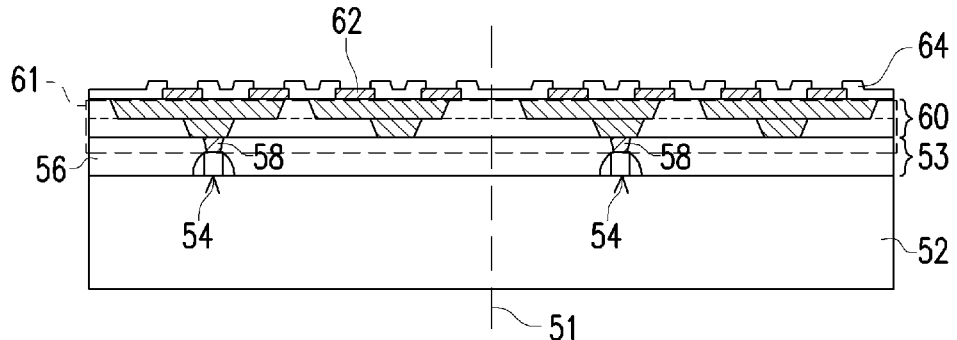
FIGS. 1A, 1B, 2 through 18, 19A, and 19B illustrate cross-sectional views of intermediate steps during a process for forming a package component in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, multiple stacking tiers (such as three or more tiers) of a 3D integrated circuit (3DIC) package may be provided having a better power efficiency. The power efficiency of the stacking system may be improved by integrating a power rail, or power distribution network (PDN), on the back side of at least one power rail chip located in a middle region of the 3DIC package. The power rail chip may be a functional chip integrated with the PDN formed along a backside of the power rail chip, which may be bonded to other chips through bumpless bonds and/or micro bump bonds. The top chip in the 3DIC package may be bonded in a face-to-face (F2F) stacking, and the other bondings of the 3DIC package may be face-to-back (F2B) stackings. The bonding pitches of the 3DIC package may be in a monotonically increasing order from the topmost tier to the bottommost tier, where the topmost bonding tier has the finest bond pitch and the bottommost bonding tier has the coarsest bond pitch.

FIGS. 1A through 18 illustrate a process for forming a package component with three tiers of integrated circuit wafers at the wafer-to-wafer (W2 W) scale, in accordance with some embodiments.

Figure 1B:
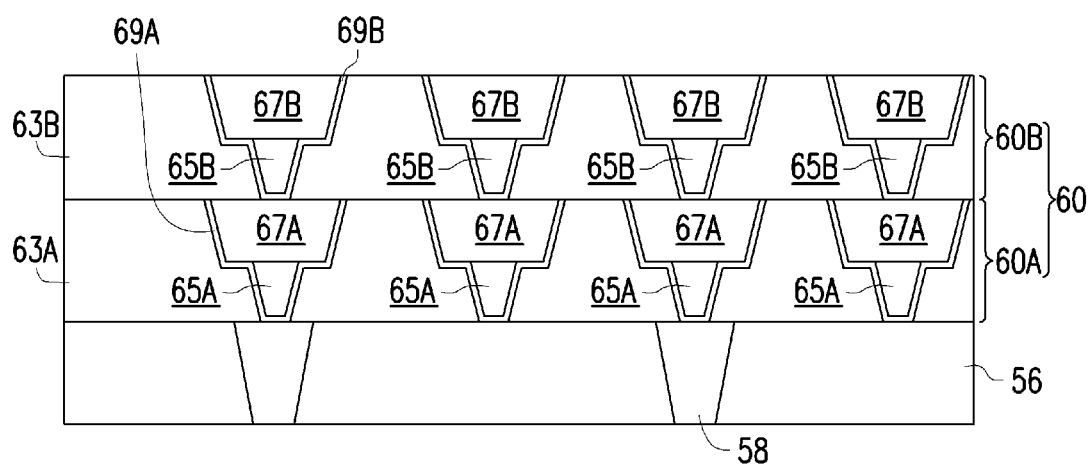
Figure 2:
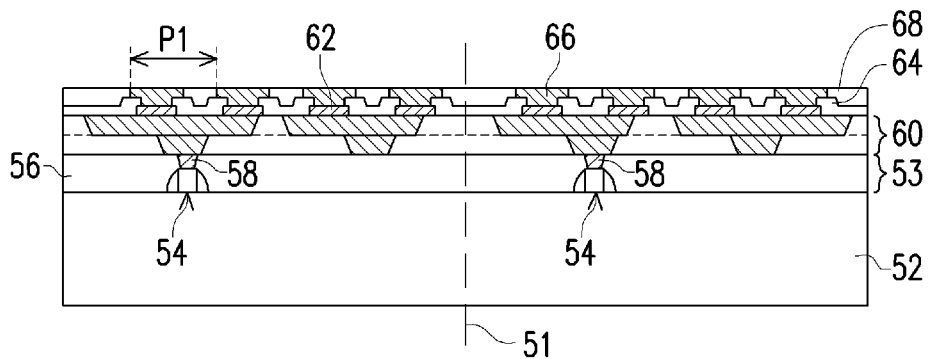

FIGS. 1A through 2 illustrate various intermediate steps in manufacturing an integrated circuit wafer 50, also referred to as a top wafer 50, in accordance with some embodiments. FIG. 1B illustrates a detailed view of region 61 of FIG. 1A. Referring first to FIG. 1A, the top wafer 50 may be a logic wafer (e.g., central processing unit (CPU), graphics processing unit (GPU), system-on-a-chip (SoC), application processor (AP), microcontroller, ASIC, FPGA, etc.), a memory wafer (e.g., dynamic random access memory (DRAM) wafer, static random access memory (SRAM) wafer, Non-Volatile Memory (NVM) wafer, etc.), a radio frequency (RF) wafer, a sensor wafer, a micro-electro-mechanical-system (MEMS) wafer, a signal processing wafer (e.g., digital signal processing (DSP) wafer), a front-end wafer (e.g., analog front-end (AFE) wafers), the like, or combinations thereof.

The top wafer 50 may include different device regions that are singulated in subsequent steps to form a plurality of integrated circuit packages, such as along the scribe line 51.

The top wafer 50 may be processed according to applicable manufacturing processes to form integrated circuits. For example, in some embodiments the top wafer 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

A device layer 53 comprising devices (represented by a transistor) 54 and an inter-layer dielectric (ILD) 56 may be formed at the front surface of the semiconductor substrate 52. The devices 54 may be active devices (e.g., transistors, diodes, etc.), capacitors, resistors, etc. The ILD 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof.

FIG. 1B illustrates the formation of a semi-global interconnect 60, also referred to as an interconnect structure 60, over the ILD 56 and conductive plugs 58. The semi-global interconnect 60 interconnects the devices 54 to form an integrated circuit. FIG. 1B illustrates a detailed view of region 61 as illustrated in FIG. 1A, showing the semi-global interconnect 60 over the top portion of the ILD 56 and conductive plugs 58. FIG. 1B illustrates the semi-global interconnect 60 as having a first interconnect level 60A and a second interconnect level 60B for illustrative purposes. Other embodiments may have more or less levels.

The semi-global interconnect 60 comprises conductive vias and lines embedded in an intermetal dielectric (IMD) layer. In addition to providing insulation between various conductive elements, an IMD layer may include one or more dielectric etch stop layers to control the etching processes that form openings in the IMD layer. Generally, vias conduct current vertically and are used to electrically connect two conductive features located at vertically adjacent levels, whereas lines conduct current laterally and are used to distribute electrical signals and power within one level. In the back end of line (BEOL) scheme illustrated in FIG. 1B, conductive vias 65A connect conductive plugs 58 to conductive lines 67A and, at subsequent levels, vias connect lower lines to upper lines (e.g., a pair of lines 67A and 67B can be connected by via 65B). Other embodiments may adopt a different scheme. For example, vias 65A may be omitted from the second level and the conductive plugs 58 may be configured to be directly connected to lines 67A.

Still referring to FIG. 1B, the first interconnect level 63A of the semi-global interconnect 60 may be formed using, for example, a dual damascene process flow. First, a dielectric stack used to form IMD layer 63A may be deposited using silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the first IMD layer 63A may be deposited using any suitable method, such as CVD, physical vapor deposition (PVD), ALD, PEALD, PECVD, SACVD, FCVD, spin-on, and/or the like, or a combination thereof. In some embodiments, IMD layer 63A includes an etch stop layer (not shown) positioned at the bottom of the dielectric stack. The etch stop layer comprises one or more insulator layers (e.g., SiN, SiC, SiCN, SiCO, CN, combinations thereof, or the like) having an etch rate different than an etch rate of an overlying material. In some embodiments, the materials used to deposit the dielectric stack for the IMD layer 63A may be different from those used in forming the ILD 56 in order to provide an etch selectivity between the IMD layer 63A and the ILD 56.

Appropriate photolithography and etching techniques (e.g., anisotropic RIE employing fluorocarbon chemistry) may be used to pattern the IMD layer 63A to form openings for vias and lines. The openings for vias may be vertical holes extending through IMD layer 63A to expose a top conductive surface of conductive plugs 58, and openings for lines may be longitudinal trenches formed in an upper portion of the IMD layer 63A. In some embodiments, the method used to pattern holes and trenches in the IMD layer 63A utilizes a via-first scheme, wherein a first photolithography and etch process form holes for vias, and a second photolithography and etch process form trenches for lines and extends the holes for vias. Other embodiments may use a different method, for example, a trench-first scheme, or an incomplete via-first scheme, or a buried etch stop layer scheme. The etching techniques may utilize multiple steps. For example, a first main etch step may remove a portion of the dielectric material of IMD layer 63A and stop on an etch stop dielectric layer. Then, the etchants may be switched to remove the etch stop layer dielectric materials. The parameters of the various etch steps (e.g., chemical composition, flow rate, and pressure of the gases, reactor power, etc.) may be tuned to produce tapered sidewall profiles with a desired interior taper angle.

One or more conductive materials may be deposited to fill the holes and trenches forming the conductive features 65A and 67A of the first interconnect level 60A. The openings may be first lined with a conductive diffusion barrier material to form a conductive diffusion barrier liner 69A and then completely filled with a conductive fill material deposited over the conductive diffusion barrier liner 69A. In some embodiments, a thin conductive seed layer may be deposited over the conductive diffusion barrier liner 69A to help initiate an electrochemical plating (ECP) deposition step that completely fills the openings with a conductive fill material.

The conductive diffusion barrier liner 69A in the vias 65A and lines 67A comprises one or more layers of TaN, Ta, TiN, Ti, Co, or the like, or combinations thereof. The conductive fill layer in the vias 65A and lines 67A may comprise metals such as Cu, Al, W, Co, Ru, or the like, or combinations thereof, or multi-layers thereof. The conductive materials used in forming the conductive features 65A and 67A may be deposited by any suitable method, for example, CVD, PECVD, PVD, ALD, PEALD, ECP, electroless plating and the like. In some embodiments, the conductive seed layer may be of the same conductive material as the conductive fill layer and deposited using a suitable deposition technique (e.g., CVD, PECVD, ALD, PEALD, or PVD, or the like). In some embodiments, the sidewalls of the vias 65A and lines 67A are tapered inwards moving down in the direction towards a top surface of the ILD 56.

Any excess conductive material over the IMD layer 63A outside of the openings may be removed by a planarizing process (e.g., CMP) thereby forming a top surface comprising dielectric regions of IMD layer 63A that are substantially coplanar (within process variations) with conductive regions of conductive lines 67A. The planarization step embeds the conductive vias 65A and conductive lines 67A into IMD layer 63A, as illustrated in FIG. 1B.

The interconnect level positioned vertically above the first interconnect level 60A in FIG. 1B, is the second interconnect level 60B. In some embodiments, the structures of the various interconnect levels (e.g., the first interconnect level 60A and the second interconnect level 60B) may be similar. In the example illustrated in FIG. 1B, the second interconnect level 60B comprises conductive diffusion barrier liners 69B, conductive vias 65B and conductive lines 67B embedded in an insulating film IMD 63B having a planar top surface. The materials and processing techniques described above in the context of the first interconnect level 60A may be used to form the second interconnect level 60B and subsequent interconnect levels.

The above process for forming the semi-global interconnect 60 is but one example, and other embodiments may use different processes, materials, and/or structures. For example, additional liner structures may be utilized, different etch processes, and the like may be utilized.

FIG. 1A, FIG. 2, and subsequent features illustrate the semi-global interconnect 60 as a single layer for illustrative purposes, and in some embodiments, the semi-global interconnect 60 may comprise a plurality of layers such as illustrated in FIG. 1B. FIG. 2 illustrates an embodiment in which the second interconnect level 60B are omitted for illustrative purposes only. The second interconnect level 60B may be included in other embodiments.

Referring further to FIG. 1A, the top wafer 50 further includes pads 62 which may comprise a conductive material such as, e.g., copper, titanium, tungsten, aluminum, or the like to which external connections are made. The pads 62 are on the active side of the semiconductor substrate 52, such as in and/or on the semi-global interconnect 60 making electrical contact with conductive features of the semi-global interconnect 60. One or more passivation films 64 may extend over portions of the semi-global interconnect 60 and pads 62. Openings extend through the passivation films 64 to the pads 62.

Optionally, solder regions (e.g., solder balls or solder bumps) may be disposed on the pads 62. The solder balls may be used to perform chip probe (CP) testing on the top wafer 50. CP testing may be performed on the top wafer 50 to ascertain whether the top wafer 50 is a known good wafer (and/or whether the individual unsingulated die is a known good die). Thus, only top wafers 50 or dies, which are known good, undergo subsequent processing and are packaged, and wafers/dies which fail the CP testing, are not packaged. After testing, the solder regions may be removed.

In FIG. 2, a bonding layer 68 is formed over the top wafer 50 and conductive pads 66, also referred to as bonding pads 66, are formed on the pads 62 for providing electrical connection of the devices 54 to subsequently attached wafers (see below, FIG. 5). The bonding layer 68 may be a dielectric material such as SiCN and/or an oxide, e.g. silicon oxide, or the like. The bonding layer 68 may be formed, for example, by spin coating, lamination, chemical vapor deposition (CVD), or the like. However, any suitable method or materials may be used.

FIG. 2 further shows that the conductive pads 66 are formed on top surfaces of the pads 62. The conductive pads 66 may exhibit fine pitches P1 in a range of about 100 nm to about 10000 nm. In some embodiments, the conductive pads 66 are formed with a damascene process in which the bonding layer 68 is patterned and etched utilizing photolithography techniques to form trenches corresponding to the desired pattern of conductive pads. In some embodiments, the conductive pads 66 are formed with a dual damascene process with vias disposed between the pads 62 and the conductive pads 66. An optional diffusion barrier and/or optional adhesion layer may be deposited and the trenches may be filled with a conductive material. Suitable materials for the diffusion barrier layer includes titanium, titanium nitride, titanium oxide, tantalum, tantalum nitride, titanium oxide, or other alternatives, and suitable materials for the conductive material include copper, silver, gold, tungsten, aluminum, combinations thereof, or the like. In an embodiment, the conductive pads 66 may be formed by depositing a seed layer of copper or a copper alloy, and filling the trenches by electroplating. A chemical mechanical planarization (CMP) process or the like may be used to remove excess conductive material from a surface of the bonding layer 68 and to planarize the surface for subsequent processing.

Figure 3:
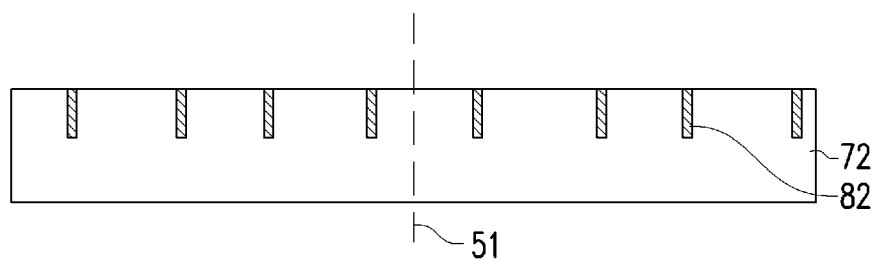
Figure 4:
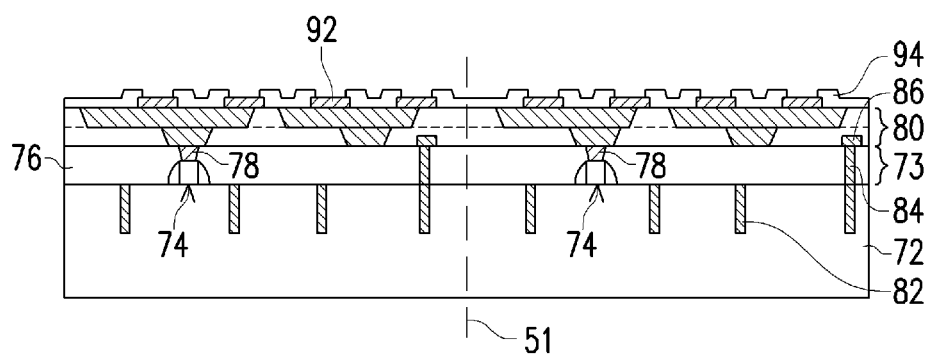
Figure 5:
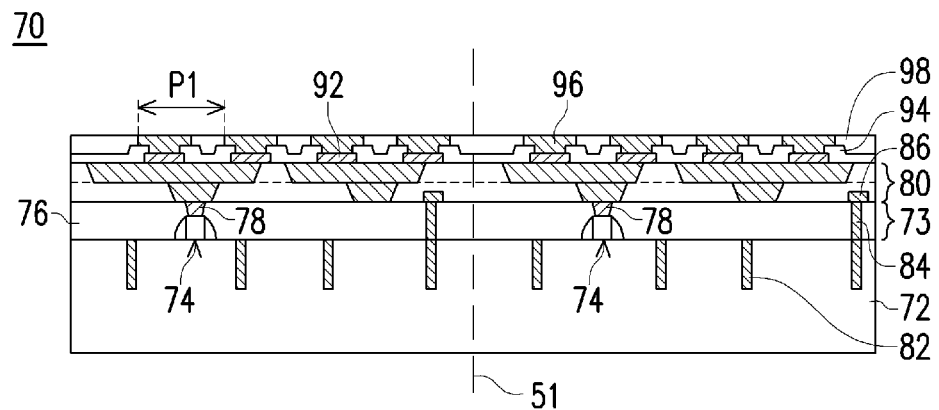

FIGS. 3-5 illustrate various intermediate steps in manufacturing a power rail wafer 70, which will subsequently be bonded to the top wafer 50, in accordance with some embodiments. Referring first to FIG. 3, there is shown through substrate vias (TSVs) 82 extending into a semiconductor substrate 72 of the power rail wafer 70. The TSVs 82 may be electrically coupled to a subsequently formed power distribution network (PDN) on the back side of the semiconductor substrate 72, e.g., the side of the semiconductor substrate 72 facing downward in FIG. 3. As an example to form the TSVs 82, recesses can be formed in the semiconductor substrate 72 by, for example, etching, milling, laser techniques, a combination thereof, and/or the like. A thin dielectric material may be formed in the recesses, such as by using an oxidation technique. A barrier layer (not illustrated) may be conformally deposited in the openings, such as by CVD, atomic layer deposition (ALD), physical vapor deposition (PVD), thermal oxidation, a combination thereof, and/or the like. The barrier layer may be formed from an oxide, a nitride, or an oxynitride, such as titanium nitride, titanium oxynitride, tantalum nitride, tantalum oxynitride, tungsten nitride, a combination thereof, and/or the like. A conductive material may be deposited over the barrier layer and in the openings. The conductive material may be formed by an electro-chemical plating process, CVD, PVD, a combination thereof, and/or the like. Examples of conductive materials are copper, tungsten, aluminum, silver, gold, a combination thereof, and/or the like. Excess of the conductive material and the barrier layer is removed from the surface of the semiconductor substrate 72 by, for example, a chemical-mechanical polish (CMP). Remaining portions of the barrier layer and the conductive material form the TSVs 82.

In the embodiment illustrated, the TSVs 82 are not yet exposed at the back side of the semiconductor substrate 72 (see below, FIG. 4). Rather, the TSVs 82 are buried in the semiconductor substrate 72. As will be discussed in greater detail below (see FIG. 7), the TSVs 82 will be exposed at the back side of the semiconductor substrate 72 after being bonded to the top wafer 50 in subsequent processing. In some embodiments, the TSVs 82 may have diameters in a range of about 50 nm to about 200 nm. The TSVs 82 may be electrically coupled to conductive lines or other conductive features (not illustrated) of the semiconductor substrate 72 or device layer 73.

FIG. 4 illustrates the power rail wafer 70 after forming a device layer 73, a semi-global interconnect 80, pads 92, and one or more passivation films 94 on the semiconductor substrate 72. In some embodiments, the device layer 73, a semi-global interconnect 80, pads 92, and one or more passivation films 94 are formed using similar methods and materials as the corresponding layers of the top wafer 50 described above with respect to FIGS. 1A and 1B. The device layer 73 comprises conductive features electrically coupled to the TSVs 82, and an ILD 76 is formed over the devices 74 and the semiconductor substrate 72. In some embodiments, the device layer 73 comprises devices 74 (e.g. active devices such as transistors). In other embodiments, the device layer 73 is omitted and the ILD 76 is formed over the semiconductor substrate 72 without covering active devices. The power rail wafer 70 not containing active devices may be useful for improving power efficiency and thermal management for devices in the top wafer 50 or the bottom wafer 150 (see below, FIG. 13). Conductive plugs 78 extend through the ILD 76 to electrically couple to the devices 74. A semi-global interconnect 80 (also referred to as an interconnect structure 80) is formed over the ILD 76. The semi-global interconnect 80 may be formed using the same methods and materials as the semi-global interconnect 60 such as e.g. damascene or dual damascene processes, as described above with respect to FIG. 1B. The pads 92 are physically and electrically coupled to the semi-global interconnect 80, and one or more passivation films 94 are over the active side of the power rail wafer 70 with openings extending to the pads 92.

The TSVs 82 may be directly connected to the devices 74, connected to the devices 74 through the semi-global interconnect 80, or a combination thereof. As discussed in greater detail below, the PDN will be subsequently formed along the backside of the semiconductor substrate 72, and the TSVs 82 may be connected to voltages at $V_{SS}$ and $V_{DD}$ via the subsequently-formed PDN. Power may also be routed through the semi-global interconnect 80 vertically by short paths through dedicated conductive vias and lines.

In some embodiments, contacts 84 may be formed through the ILD 76 to electrically couple TSVs 82 to conductive features 86 (e.g. metal lines or vias of a first metallization pattern) of the semi-global interconnect 80. The contacts 84 may be formed through the ILD 76 using substantially similar methods and materials as the conductive plugs 78 formed in the ILD 76. However, any suitable process and materials may be used.

The contacts 84 and TSVs 82 are illustrated as two separate elements for illustrative purposes, and in some embodiments, the contacts 84 and TSVs 82 may be a single continuous element. For example, in some embodiments the TSVs 82 may be formed after forming one or more dielectric layers over the substrate, such as the ILD 76 and/or one or more layers of the interconnect structure 80. After forming the one or more dielectric layers, an opening may be formed through the one or more dielectric layers and into the substrate 72 and filled with conductive material. The dimensions of TSVs 82 connecting to the contacts 84 may be larger than the dimensions of TSVs 82 directly connecting to device 74, which may be useful for higher power delivery and lower power consumption.

FIG. 5 illustrates a bonding layer 98 formed over the power rail wafer 70 and conductive pads 96 formed on top surfaces of the pads 92. The conductive pads 96 and the bonding layer 98 may be used to bond the active side of the power rail wafer 70 to the active side of the top wafer 50 (see below, FIG. 6). The bonding layer 98 and the conductive pads 96 may be formed using substantially similar methods and materials as the bonding layer 68 and the conductive pads 66 as described above in reference to FIG. 2. However, any suitable method or materials may be used. The conductive pads 96 may exhibit fine pitches the same as pitch P1 (see above, FIG. 2) in a range of about 100 nm to about 10000 nm.

Figure 6:
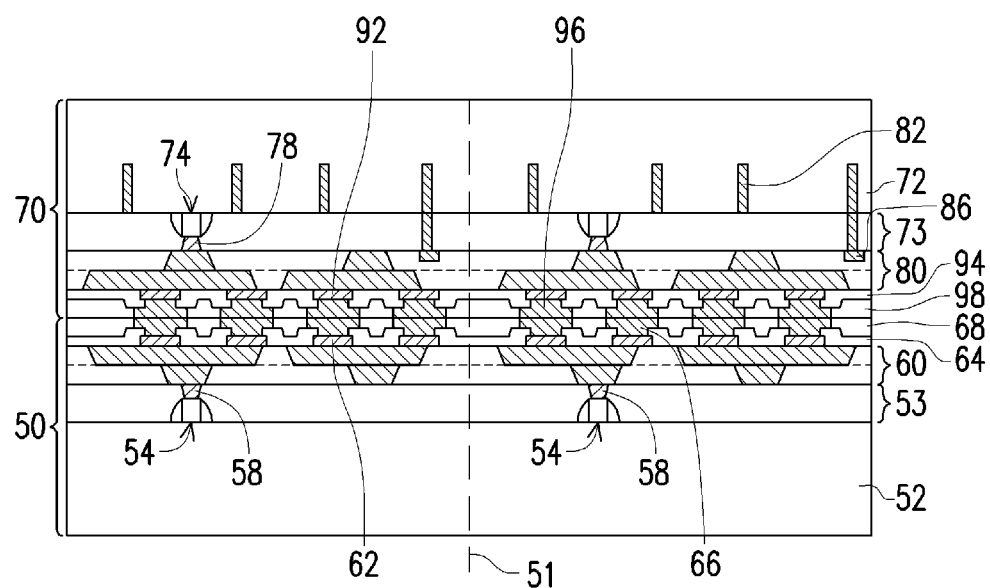

FIG. 6 illustrates a face-to-face (F2F) bonding of the active side of the top wafer 50 (see FIG. 2) with the active side of the power rail wafer 70 (see FIG. 5) using a suitable bonding method, forming a wafer-on-wafer (WoW) structure. In some embodiments, the top wafer 50 is attached to the power rail wafer 70 with bumpless bonds comprising metal-metal bonds, e.g. Cu—Cu bonds, between the conductive pads 66 and 96 and dielectric bonds between the bonding layers 68 and 98, forming a system-on-integrated-chips (SoIC) bond interface.

As an example of bumpless bonding between the top wafer 50 and the power rail wafer 70, the bumpless bonding process starts with aligning and bonding the top wafer 50 with the power rail wafer 70. Bonding may include applying a surface treatment to one or more of the bonding layers 68 or 98. The surface treatment may include a plasma treatment. The plasma treatment may be performed in a vacuum environment. After the plasma treatment, the surface treatment may further include a cleaning process (e.g., a rinse with deionized water, or the like) that may be applied to one or more of the bonding layers 68 or 98. The bumpless bonding process may then proceed to aligning the conductive pads 66 of the top wafer 50 with the conductive pads 96 of the power rail wafer 70. When the top wafer 50 and the power rail wafer 70 are aligned, the conductive pads 66 of the top wafer 50 may overlap with the corresponding conductive pads 96 of the power rail wafer 70. Next, the bumpless bonding includes a pre-bonding step, during which the top wafer 50 is put in contact with the power rail wafer 70. The pre-bonding may be performed at room temperature (e.g., between about 21° C. and about 25° C.). The bumpless bonding process may continue with performing an anneal, for example, at a temperature between about 150° C. and about 400° C. for a duration between about 0.5 hours and about 3 hours, so that the metal in the conductive pads 66 (e.g., copper) and the metal of the conductive pads 96 (e.g., copper) inter-diffuses to each other, and hence the direct metal-to-metal bond is formed and the bonding layers 68 and 98 bond to each other.

Figure 7:
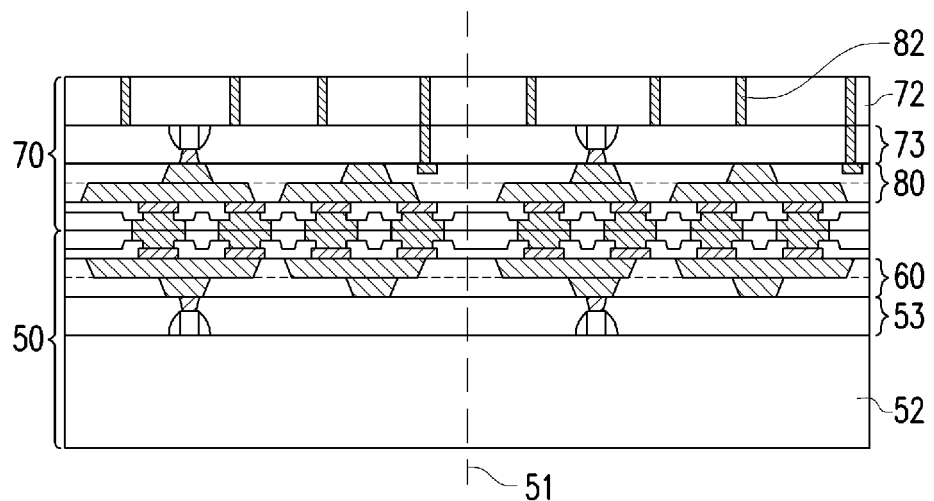

FIG. 7 illustrates a planarization of the back side of the semiconductor substrate 72 of the power rail wafer 70 to expose top surfaces of the TSVs 82. The planarization process may be, for example, a grinding and/or a chemical-mechanical polish (CMP) to remove a portion of the semiconductor substrate 72 over the top surfaces of the TSVs 82. However, any suitable process may be used.

Figure 8:
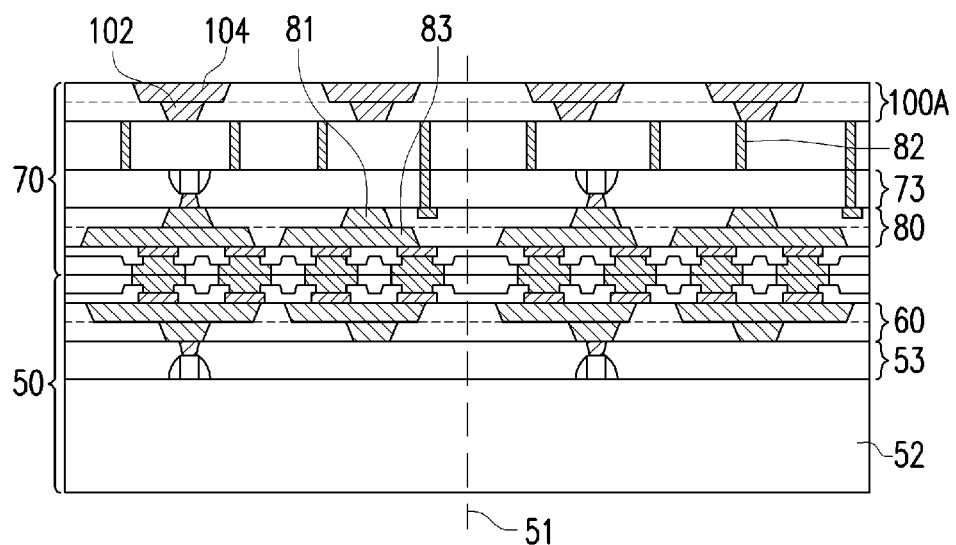

FIG. 8 illustrates the formation of a semi-global interconnect 100A, also referred to as an interconnect structure 100A, on the back side of the semiconductor substrate 72. The semi-global interconnect 100A may be used for providing signal routing. The semi-global interconnect 100A may physically and electrically couple the TSVs 82 with subsequently formed pads 132 (see below, FIG. 12). The semi-global interconnect 100A may be formed on the semiconductor substrate 72 by similar methods and materials as the semi-global interconnect 60 described above with respect to FIG. 1B.

The metallization patterns include conductive vias 102 and conductive lines 104 formed in one or more dielectric layers, which may be formed using damascene or dual damascene processes (see above, FIG. 1B). In some embodiments, the damascene or dual damascene conductive vias 102 and conductive lines 104 of the semi-global interconnect 100A are oriented in an opposite direction as the conductive lines 83 and conductive vias 81 of the semi-global interconnect 80, such that the conductive lines 104 are over the conductive vias 102 and the conductive vias 81 are over the conductive lines 83 from the perspective illustrated in FIG. 8. This may further be indicated by the tapering of the lines (e.g., conductive lines 83/104) and/or conductive vias 81/102. FIG. 8 illustrates the semi-global interconnect 100A as a single layer for illustrative purposes, and in some embodiments, the semi-global interconnect 100A may comprise a plurality of layers. Power may also be routed through the semi-global interconnect 100A vertically by short paths through dedicated conductive vias and lines.

Figure 9:
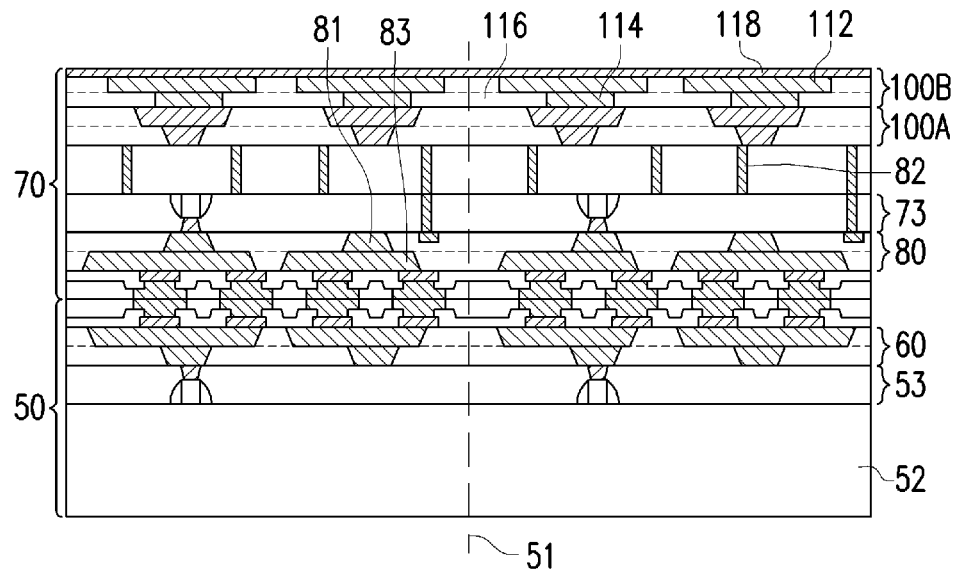

FIG. 9 illustrates a power distribution network (PDN) layer 100B formed on the semi-global interconnect 100A. The PDN layer 100B may provide power distribution and delivery from a subsequently attached bottom wafer 150 (see below, FIG. 17) to the device layers 53 and 73 of the top wafer 50 and the power rail wafer 70, respectively. Integrating the PDN layer 100B on the back side of the power rail wafer 70 may be useful for achieving better system power efficiency and thermal dissipation by separating the power delivery through the PDN layer 100B from the top wafer 50 and the bottom wafer 150. Moving part of the signal routing and power distribution network from the front side semi-global interconnect layer 80 to the semi-global interconnect 100A and the power routing in the PDN layer 100B may greatly improve the power delivery and signal routing flexibility in advanced node wafers with increasingly reduced device sizes. Separating the signal routing from the power routing in the PDN layer 100B may also allow for greater flexibility in forming connections for power routing. For example, by separating the signal routing lines of the semi-global interconnect 100A from the routing lines of the PDN layer 100B different design features such as dielectric layer thickness between adjacent lines, sizing (e.g., thickness, width, length) of the conductive lines, etc. may be varied individually to provide better performance for each of the signal routing through the semi-global interconnect 100A from the power delivery through the PDN layer 100B, thereby improving device performance. Data signals (for example, data transmitted through word lines or bit lines to or from memory cells such as SRAM cells) may also be routed through the PDN layer 100B vertically by short paths through dedicated conductive vias and lines. In some embodiments, the features of the PDN layer 100B are integrated within the semi-global interconnect 100A.

In some embodiments, the PDN layer 100B includes metallization patterns (e.g., electrically conductive features) formed in one or more dielectric layers over the semi-global interconnect 100A. For example, the PDN layer 100B may include electrically conductive features, such as conductive lines 112 and vias 114 formed in a plurality of dielectric layers 116. In some embodiments, the dielectric layers 116 comprises a suitable dielectric material, such as silicon oxide, silicon nitride, silicon oxynitride, combinations thereof, multiple layers thereof, or the like, and may be formed using a suitable formation method such as chemical vapor deposition (CVD), physical vapor deposition (PVD), lamination, or the like. The electrically conductive features (e.g., 112, 114) of the PDN layer 100B may be formed of an electrically conductive material, such as copper, and may be formed of a suitable formation method such as damascene, dual damascene, plating, or the like. Note that for simplicity, FIG. 9 illustrates the dielectric layer 116 as a single layer, with the understanding that the dielectric layer 116 of the PDN layer 100B may include a plurality of dielectric layers. The PDN layer 100B may further include one or more conductive features 118 over the dielectric layers 116. The conductive features 118 may be continuous or discontinuous patterns. In some embodiments, a conductive feature 118 is a ground plane or a power distribution plane.

In some embodiments, the conductive features of the PDN layer 100B on the back side of the power rail wafer 70 may be larger than the conductive features of the semi-global interconnect 80 on the front side of the power rail wafer 70. For example, widths of the conductive vias 114 of the PDN layer 100B may be larger than widths of the conductive vias 81 of the semi-global interconnect 80 and widths, lengths and/or thicknesses of the conductive lines 112 of the PDN layer 100B may be larger than widths, lengths and/or thicknesses of the conductive lines 83 of the semi-global interconnect 80. Additionally, pitches between the conductive features of the PDN layer 100B may be larger than pitches between the conductive features of the semi-global interconnect 80. This may enable the conductive features of the PDN layer 100B to transmit power more efficiently without damage to the conductive features of the PDN layer 100B. The widths of the conductive vias 114 of the PDN layer 100B and the widths, lengths and/or thicknesses of the conductive lines 112 of the PDN layer 100B may also be larger than widths, lengths and/or thicknesses of respective conductive vias and lines of other interconnect structures such as the semi-global interconnect 60, the semi-global interconnect 100D (see below, FIG. 11), the semi-global interconnect 160 (see below, FIG. 14), or the global interconnect 190 (see below, FIG. 17).

Figure 10:
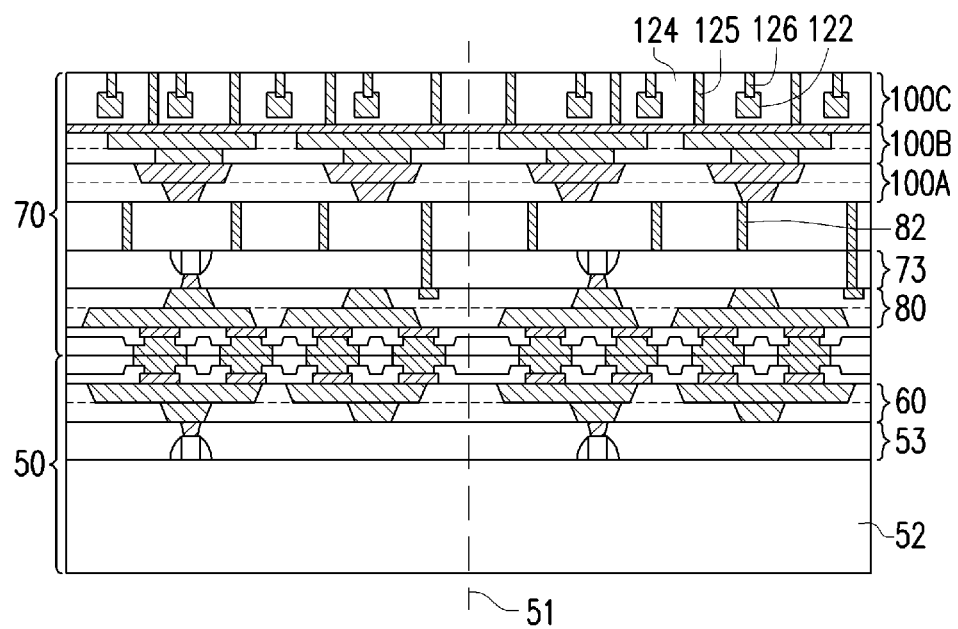

FIG. 10 illustrates an embedded power component layer 100C, also referred to as an integrated power component layer 100C or a passive device layer 100C, formed over the PDN layer 100B. In some embodiments, the embedded power component layer 100C acts to regulate voltages, currents, and power distributed through the PDN layer 100B to other circuitry. The power component devices 122 are formed in one or more dielectric layers (one being shown for illustrative purposes) and may include deep trench capacitors (DTCs), metal-insulator-metal (MiM) capacitors, decoupling capacitors, integrated passive devices (IPDs), voltage regulation (VR) circuits, and/or gallium nitride (GaN) power transistors that may be electrically coupled to the conductive features of the PDN layer 100B. Conductive vias 126 embedded in the one or more dielectric layers (illustrated as dielectric layer 124 for illustrative purposes) may electrically couple the power component devices 122 with a subsequently formed semi-global interconnect 100D (see below, FIG. 11). In some embodiments, the power component devices 122 are coupled to the PDN layer 100B through the semi-global interconnect 100D (see FIG. 11) and through vias (TVs) 125. In some embodiments, the power component devices 122 are electrically coupled to the PDN layer 100B by conductive vias (not illustrated) through the dielectric layer 124. In some embodiments, the power component devices 122 are integrated within the semi-global interconnect 100A.

Through vias (TVs) 125 through the dielectric layer 124 may electrically couple conductive features of the PDN layer 100B with the subsequently formed semi-global interconnect 100D (see FIG. 11) to provide pathways for power and signal flow. In some embodiments, the embedded power component layer 100C is not included and the PDN layer 100B may be directly connected with subsequently formed pads 132 (see below, FIG. 12).

Figure 11:
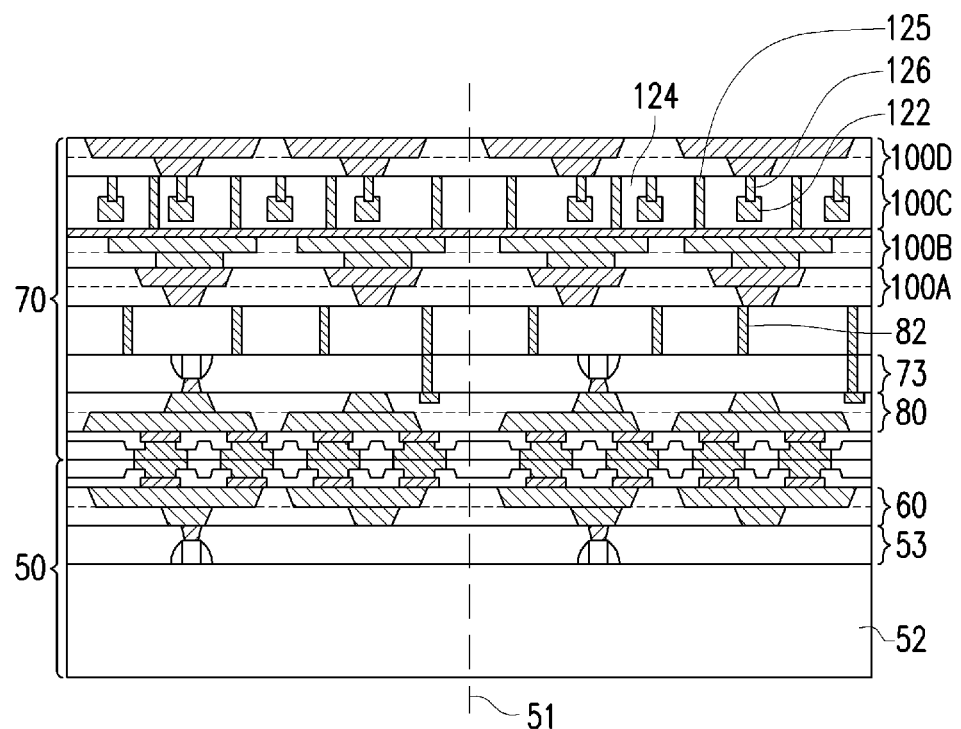

FIG. 11 illustrates the formation of a semi-global interconnect 100D, also referred to as an interconnect structure 100D, over the embedded power component layer 100C. The semi-global interconnect 100D may be used for connecting power component devices 122 with the PDN layer 100B through TVs 125 for power and signal routing. The semi-global interconnect 100D may be formed by the same methods and materials as the semi-global interconnect 100A. FIG. 11 illustrates the semi-global interconnect 100D as a single layer for illustrative purposes, and in some embodiments, the semi-global interconnect 100D may comprise a plurality of layers. In some embodiments in which the embedded power component layer 100C is not included, the semi-global interconnect 100D may not be included.

Figure 12:
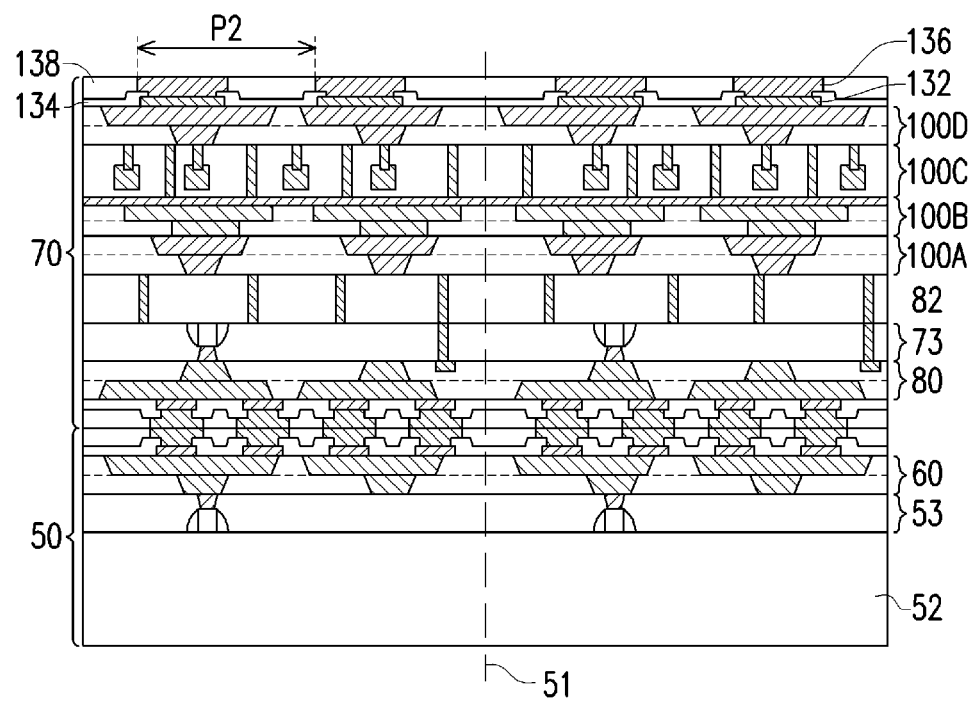

FIG. 12 illustrates pads 132 electrically coupled to the semi-global interconnect 100D, one or more passivation films 134 on the back side of the semi-global interconnect 100D with openings extending to the pads 132, a bonding layer 138 formed over the one or more passivation films 134 and conductive pads 136 formed on top surfaces of the pads 132. The conductive pads 136 and the bonding layer 138 may be used to bond the back side of the power rail wafer 70 to the active side of a bottom wafer 150 (see below, FIG. 15). The pads 132, the passivation films 134, the bonding layer 138, and the conductive pads 136 may be formed using substantially similar methods and materials as the pads 62, the passivation films 64, bonding layer 68, and the conductive pads 66, respectively as described above in reference to FIGS. 1A, 1B, and 2. However, any suitable method or materials may be used. The conductive pads 136 may exhibit pitches P2 in a range of about 100 nm to about 10000 nm. In some embodiments, the pitches P2 of the conductive pads 136 are larger than the pitches P1 (see FIG. 5) of the conductive pads 66 and 96. This may be useful for achieving better system power efficiency and thermal dissipation. A ratio of the pitches P2 of the conductive pads 136 to the pitches P1 of the conductive pads 66 and 96 may be in a range of about 1 to about 100.

Figure 13:
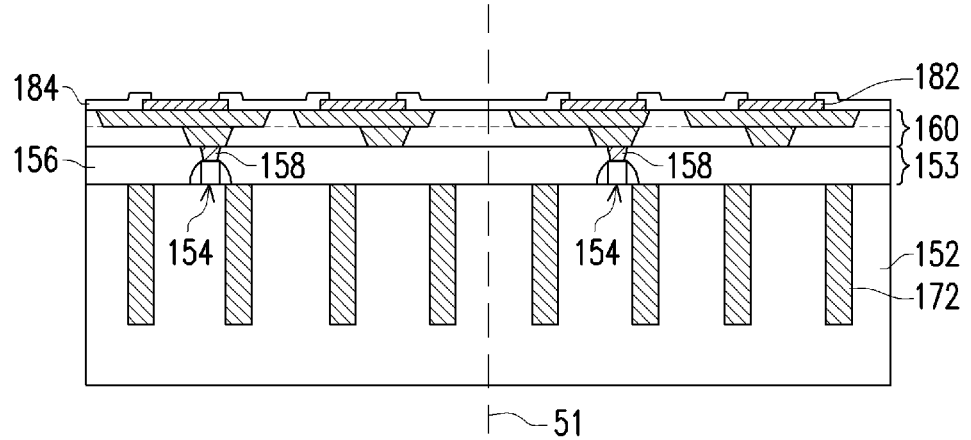
Figure 14:
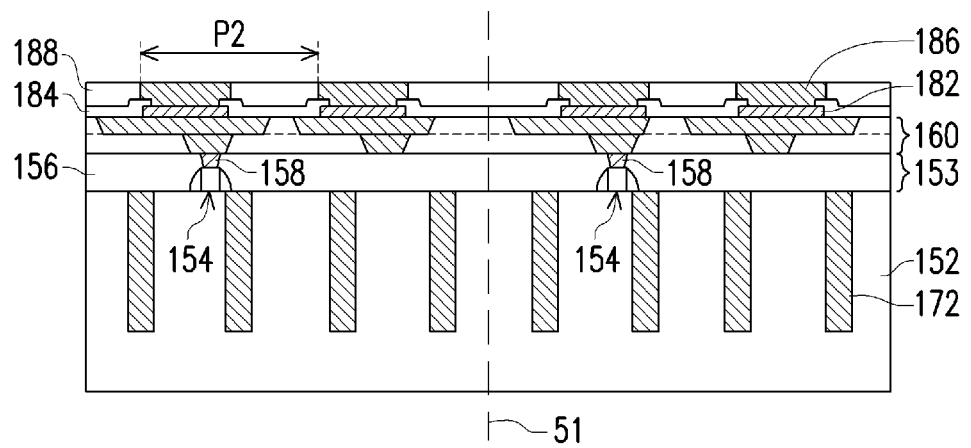

FIGS. 13-14 illustrate various intermediate steps in manufacturing a bottom wafer 150, which will subsequently be bonded to the WoW structure comprising the top wafer 50 and the power rail wafer 70, in accordance with some embodiments. Referring first to FIG. 13, the bottom wafer 150 includes through substrate vias (TSVs) 172 embedded in a semiconductor substrate 152. The TSVs 172 may be electrically coupled to conductive lines or other conductive features (not illustrated) of the semiconductor substrate 152 or the device layer 153. In some embodiments, the bottom wafer 150 has similar structures and materials as the top wafer 50 described above with respect to FIGS. 1A and 1B. The bottom wafer 150 further includes a device layer 153 comprising devices 154 (e.g. transistors) electrically coupled to the TSVs 172 and an ILD 156 over the devices 154 and the semiconductor substrate 152, conductive plugs 158 extending through the ILD 156 to electrically and physically couple the devices 154, a semi-global interconnect 160, (also referred to as an interconnect structure 160) over the ILD 156, pads 182 physically and electrically coupled to the semi-global interconnect 160, and one or more passivation films 184 over the active side of the bottom wafer 150 with openings extending to the pads 182.

The TSVs 172 may be electrically coupled to a subsequently formed interconnect structure on the back side of the semiconductor substrate 152 (see below, FIG. 17). The TSVs 172 may be formed using substantially similar methods and materials as the TSVs 82 as described above with respect to FIG. 3. The TSVs 172 are electrically coupled to the semi-global interconnect 160 through conductive features such as lines and vias (not illustrated) in the device layer 153. As will be discussed in greater detail below (see FIG. 16), the TSVs 172 will be exposed at the back side of the semiconductor substrate 152 in subsequent processing. In some embodiments, the TSVs 172 may have widths in a range of about 1000 nm to about 10000 nm.

FIG. 14 illustrates a bonding layer 188 formed on the active side of the bottom wafer 150 and conductive pads 186 formed on top surfaces of the pads 182. The conductive pads 186 and the bonding layer 188 may be used to bond the active side of the bottom wafer 150 to the back side of the power rail wafer 70 (see below, FIG. 15). The bonding layer 188 and the conductive pads 186 may be formed using substantially similar methods and materials as the bonding layer 68 and the conductive pads 66 as described above in reference to FIG. 2. However, any suitable method or materials may be used. The conductive pads 186 may exhibit pitches the same as pitch P2 (see above, FIG. 12) in a range of about 100 nm to about 10000 nm.

Figure 15:
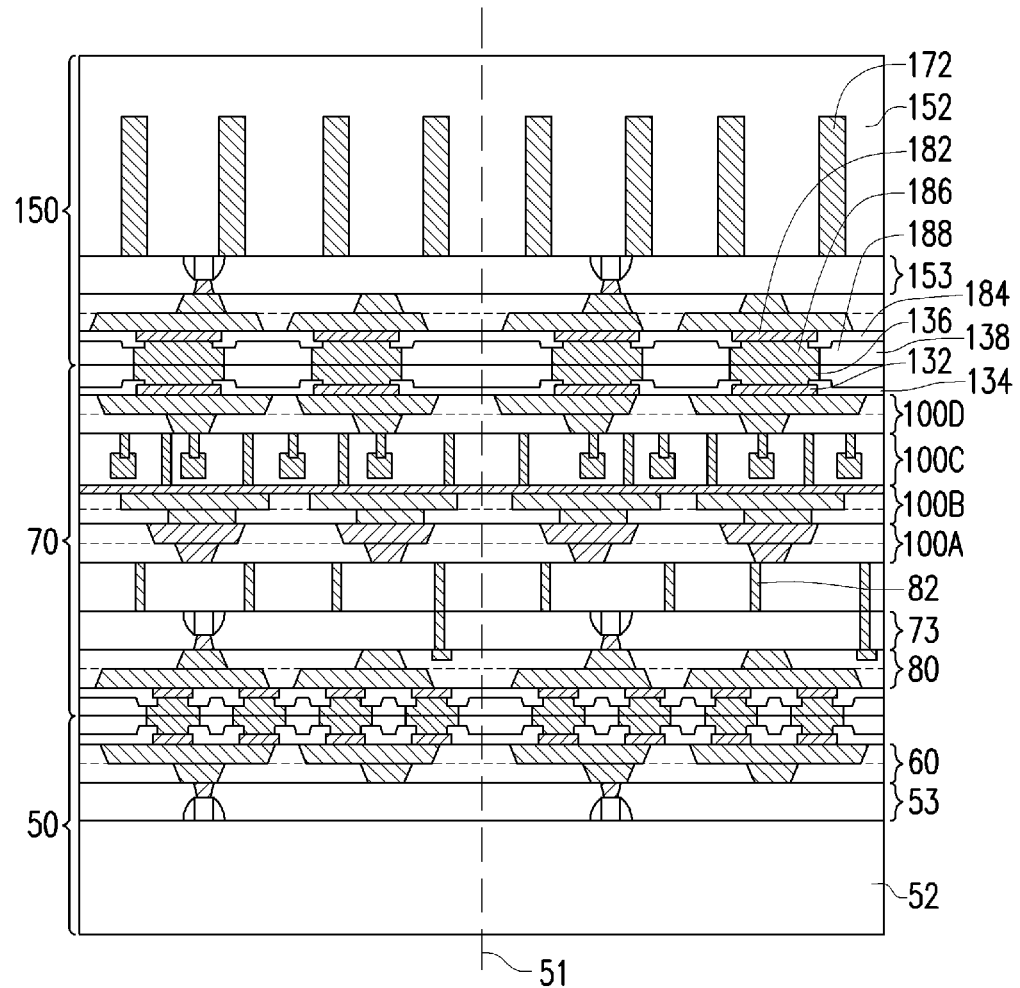

FIG. 15 illustrates a face-to-back (F2B) bonding of the active side of the bottom wafer 150 with the back side of the power rail wafer 70 using a suitable bonding method. In some embodiments, the bottom wafer 150 is attached to the power rail wafer 70 with bumpless bonds comprising metal-metal bonds, e.g. Cu—Cu bonds, between the conductive pads 136 and 186 and dielectric bonds between the bonding layers 138 and 188. The bumpless bonding may be performed using substantially the same methods and materials as described above in respect to FIG. 6.

Figure 16:
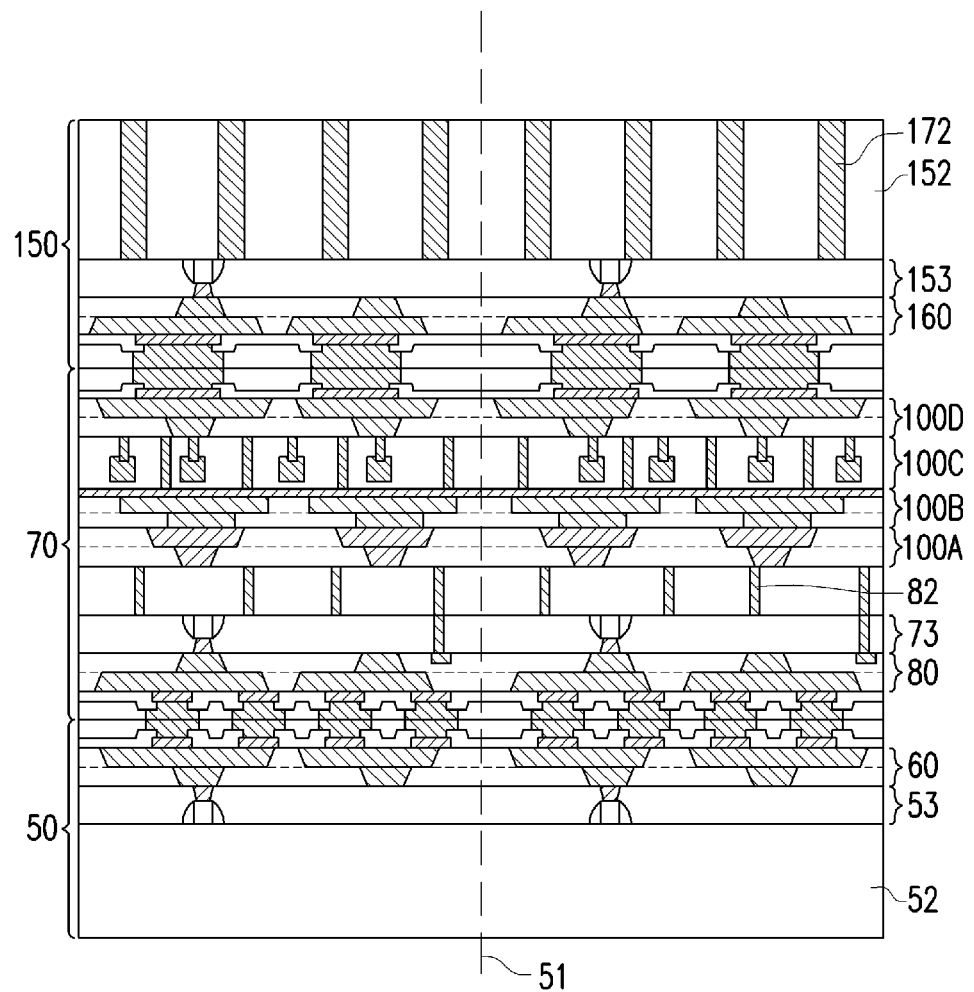

FIG. 16 illustrates a planarization of the back side of the semiconductor substrate 152 to expose top surfaces of the TSVs 172. The planarization process may be, for example, a grinding and/or a chemical-mechanical polish (CMP) to remove a portion of the semiconductor substrate 152 over the top surfaces of the TSVs 172. However, any suitable process may be used.

Figure 17:
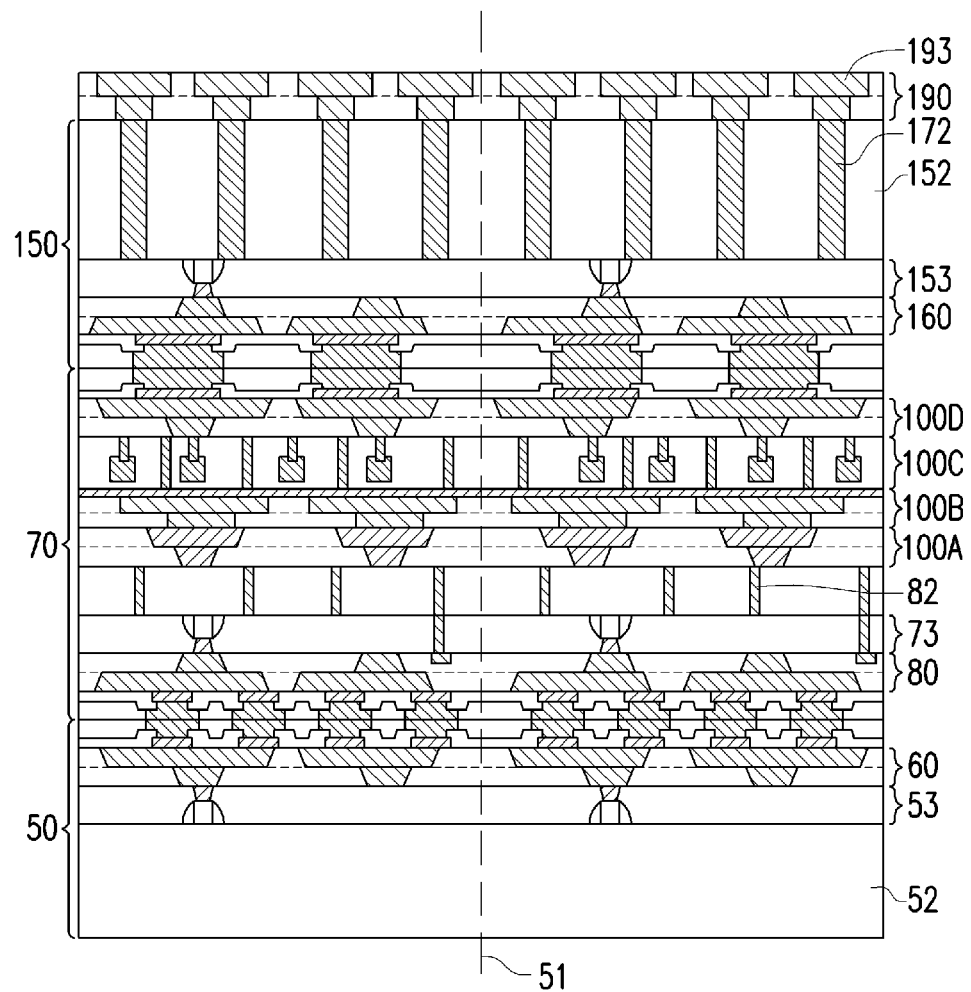

FIG. 17 illustrates the formation of a global interconnect 190, also referred to as an interconnect structure 190, on the back side of the semiconductor substrate 152. The global interconnect 190 may electrically couple the TSVs 172 with external connectors for input/output (I/O) and power connections (see below, FIG. 18). The global interconnect 190 may be formed by, for example, metallization patterns in dielectric layers on the semiconductor substrate 152. The metallization patterns include metal lines and vias formed in one or more low-k dielectric layers. The global interconnect 190 may include contact pads 193, such as aluminum pads, to which external connections may subsequently be made.

Figure 18:
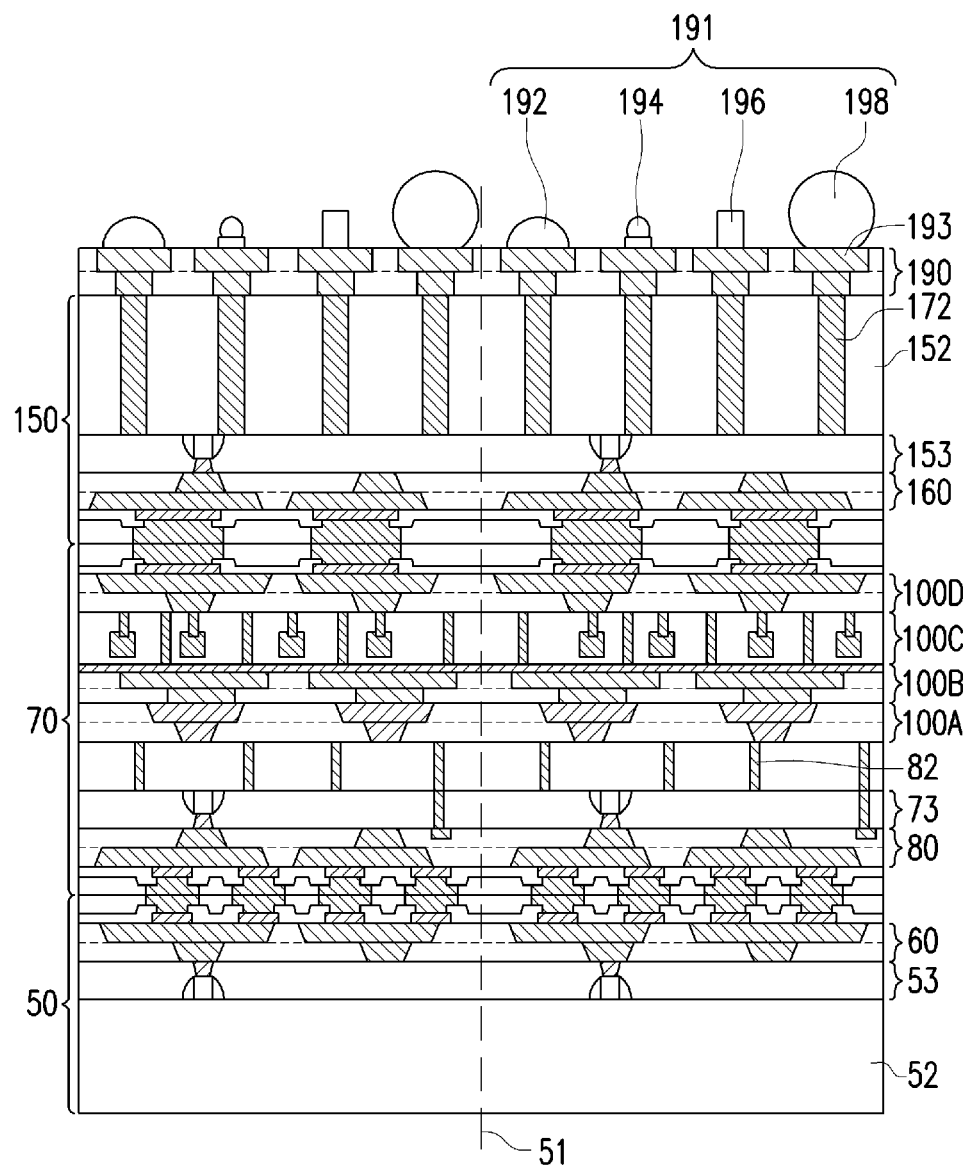

FIG. 18 illustrates the formation of external connectors 191 on contact pads 193 of the global interconnect 190. The external connectors 191 may be used for data I/O and power connections to the bottom wafer 150 and to the power rail wafer 70 and the top wafer 50. The external connectors 191 may include controlled collapse chip connection (C4) bumps 192, micro bumps 194, vias 196, ball grid array (BGA)

connectors 198, the like, or a combination thereof. FIG. 18 shows the external connectors 191 as including C4 bumps 192, micro bumps 194, pillars 196, and BGA connectors 198 for illustrative purposes. In some embodiments, the external connectors 191 may include one type of connector or two or more types of connectors. In some embodiments where the external connectors 191 are formed of solder materials, a reflow process may be performed in order to shape the solder material into the desired bump shapes.

Figure 19A:
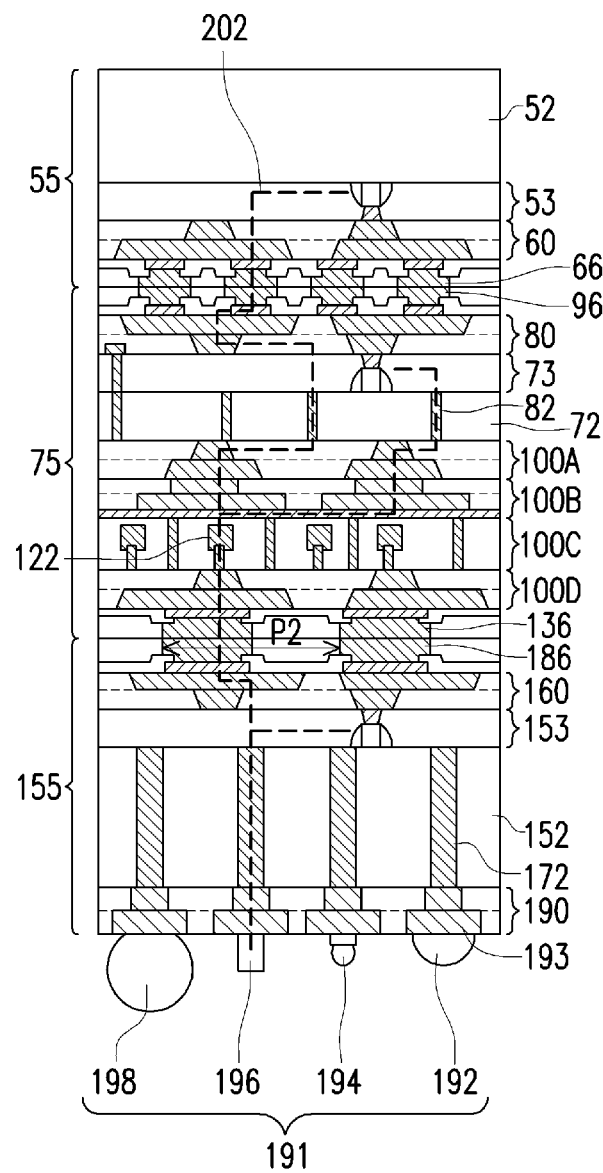

In FIG. 19A, a singulation process is performed by sawing along scribe lines 51 to form an integrated circuit package 200. The sawing singulates the integrated circuit package 200, also referred to as a device stack 200, from the WoW structure illustrated in FIG. 18. The resulting singulated device stack 200 comprises a bottom chip 155, a power rail chip 75, and a top chip 55. After the singulation, sidewalls of the substrates 52, 72, and 152 may be laterally aligned. By integrating the PDN layer 100B on the back side of the power rail chip 75 in the middle of the device stack 200, better system power efficiency and thermal dissipation may be achieved.

In some embodiments, power 202 is delivered through the external connectors 191 on the back side of the bottom chip 155 through the TSVs 172 to the device layer 153 of the bottom chip 155. The power 202 is routed vertically through the semi-global interconnect 160 by short paths through dedicated conductive vias and lines to the conductive pads 186 with pitches P2 and to the conductive pads 136 of the power rail chip 75 that are face-to-back (F2B) bonded to the conductive pads 186. In the power rail chip 75, the power 202 may be routed through the semi-global interconnect 100D to the embedded power component layer 100C, through which the power 202 may pass through power component devices 122 such as decoupling capacitors that may regulate the voltage to the PDN layer 100B, conductive features of which may be coupled to the power component devices. The power 202 may then be distributed by and further delivered from the PDN layer 100B through TSVs 82 to the device layer 73 of the power rail chip 75. The power 202 may be further distributed through the semi-global interconnect 80 to the conductive pads 96 with pitches P1 smaller than the pitches P2 and to the conductive pads 66 of the top chip 55 that are face-to-face (F2F) bonded to the conductive pads 96. The power 202 may then be routed vertically through the semi-global interconnect 60 by short paths through dedicated conductive vias and lines to the device layer 53 of the top chip 55.

Figure 19B:
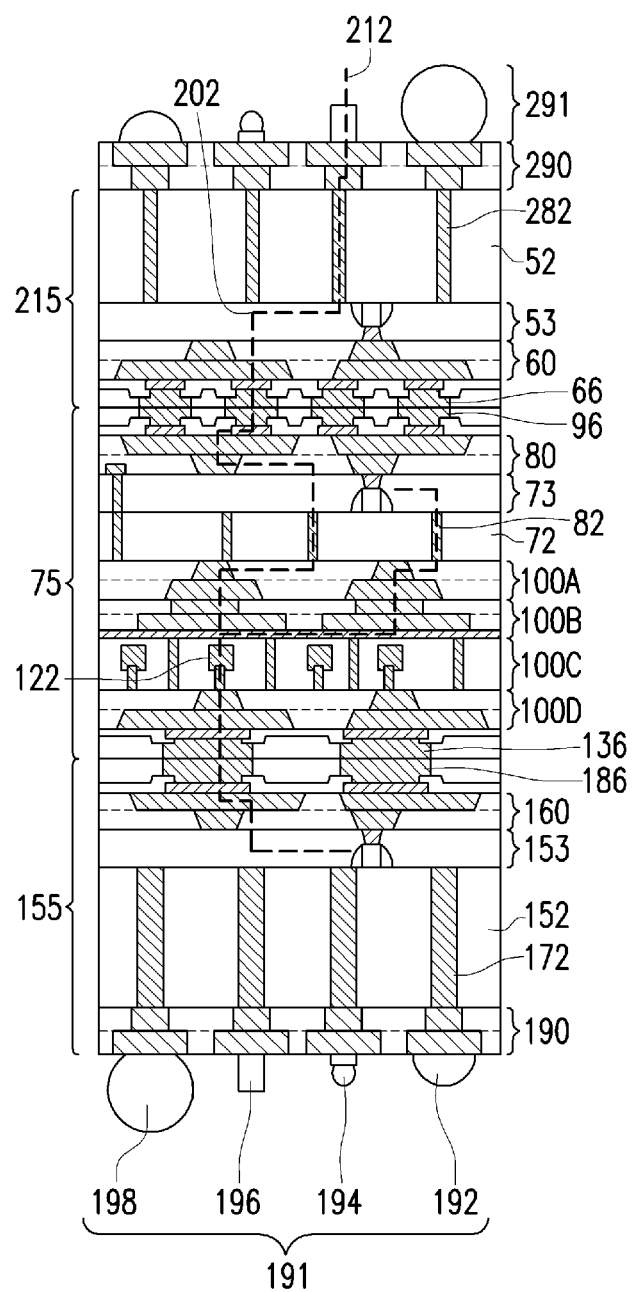

FIG. 19B illustrates an integrated circuit package 210 in which power 212 may be delivered through a top chip 215, in accordance with some embodiments. The integrated circuit package 210 may be formed with substantially similar methods and materials as the integrated circuit package 200, with the addition of TSVs 282 through the substrate 52 of the top chip 215 to the device layer 53, an interconnect structure 290 formed on the back side of the top chip 215 and electrically coupled to the TSVs 282, and external connectors 291 electrically coupled to the interconnect structure 290. The TSVs 282 may be formed through the substrate 52 using substantially similar methods and materials as the TSVs 82 (see above, FIG. 3), the global interconnect 290 may be formed 52 using substantially similar methods and materials as the global interconnect 190 (see above, FIG. 17), and the external connectors 291 may be formed using substantially similar methods and materials as the external connectors 191 (see above, FIG. 18).

Power 212 may be delivered through the external connectors 291 on the back side of the top chip 215 to the device layer 53 of the top chip 215. The power 212 may then be delivered along similar paths as the power 202 (see above, FIG. 19A) but in the opposite direction to the device layer 73 of the power rail chip 75 and through TSVs 82 to the PDN layer 100B and to the device layer 153 of the bottom chip 155. In some embodiments, the TSVs 172, the global interconnect 190, and the external connectors 191 may be omitted from the bottom chip 155.

FIGS. 20 through 24 illustrate a process for forming another integrated circuit package 300 with three tiers of integrated circuit structures at the wafer-to-wafer (W2W) scale, in accordance with some embodiments. The integrated circuit package 300 may differ from the integrated circuit package 200 (see above, FIG. 19A) by having its bottom wafer 350 and power rail chip 270 coupled by micro bump bonds rather than bumpless bonds.

Figure 20:
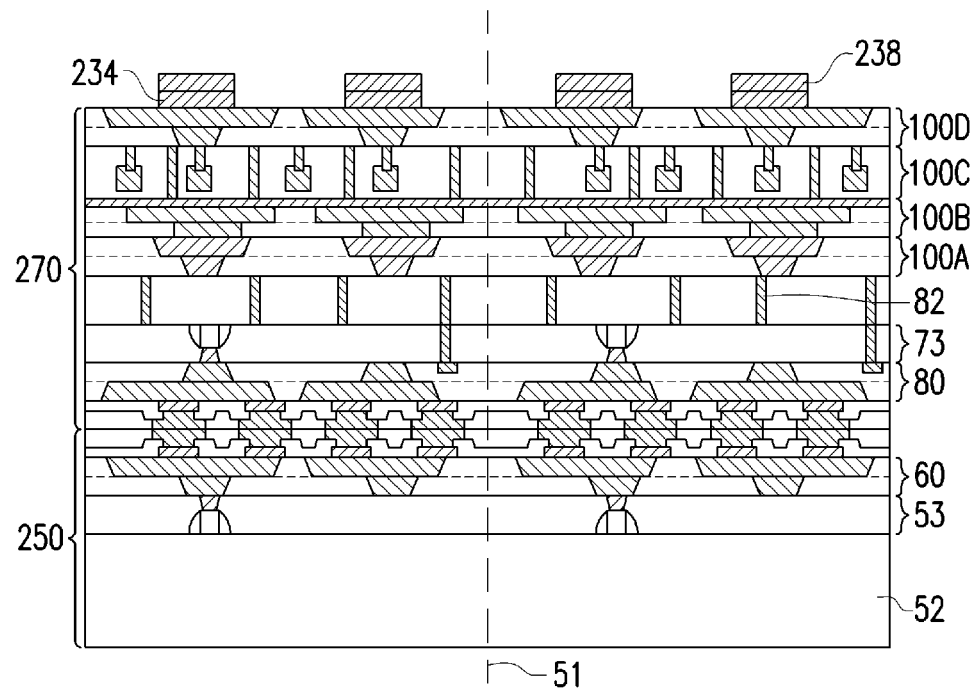
FIGS. 20 through 24 illustrate cross-sectional views of intermediate steps during a process for forming another package component in accordance with some embodiments.

FIG. 20 follows from FIG. 10 with a top wafer 250 substantially similar to the top wafer 50 and a power rail wafer 270 substantially similar to the power rail wafer 70. In FIG. 20, conductive connectors 234 are formed on a top surface of the semi-global interconnect 100D and electrically coupled to conductive features of the semi-global interconnect 100D. The conductive connectors 234 may be micro bumps comprising a conductive material such as copper and may comprise solder regions. However, any suitable conductive material may be used. Solder regions 238 may be formed on the conductive connectors 234.

Figure 21:
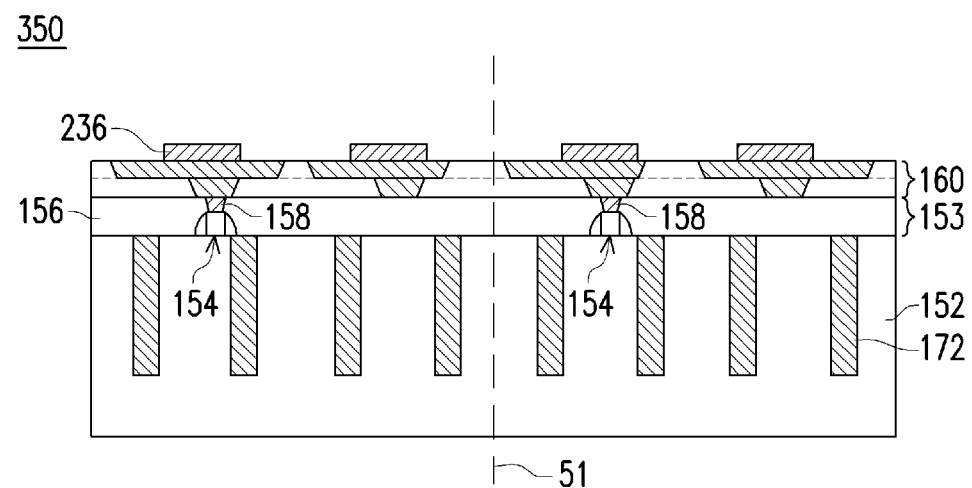

FIG. 21 illustrates a bottom wafer 350 substantially similar to the bottom wafer 150 illustrated in FIG. 13, except that conductive connectors 236 are formed on a top surface of the semi-global interconnect 160 and electrically coupled to conductive features of the semi-global interconnect 160. The conductive connectors 236 may be substantially similar to the conductive connectors 234 described above with respect to FIG. 20.

Figure 22:
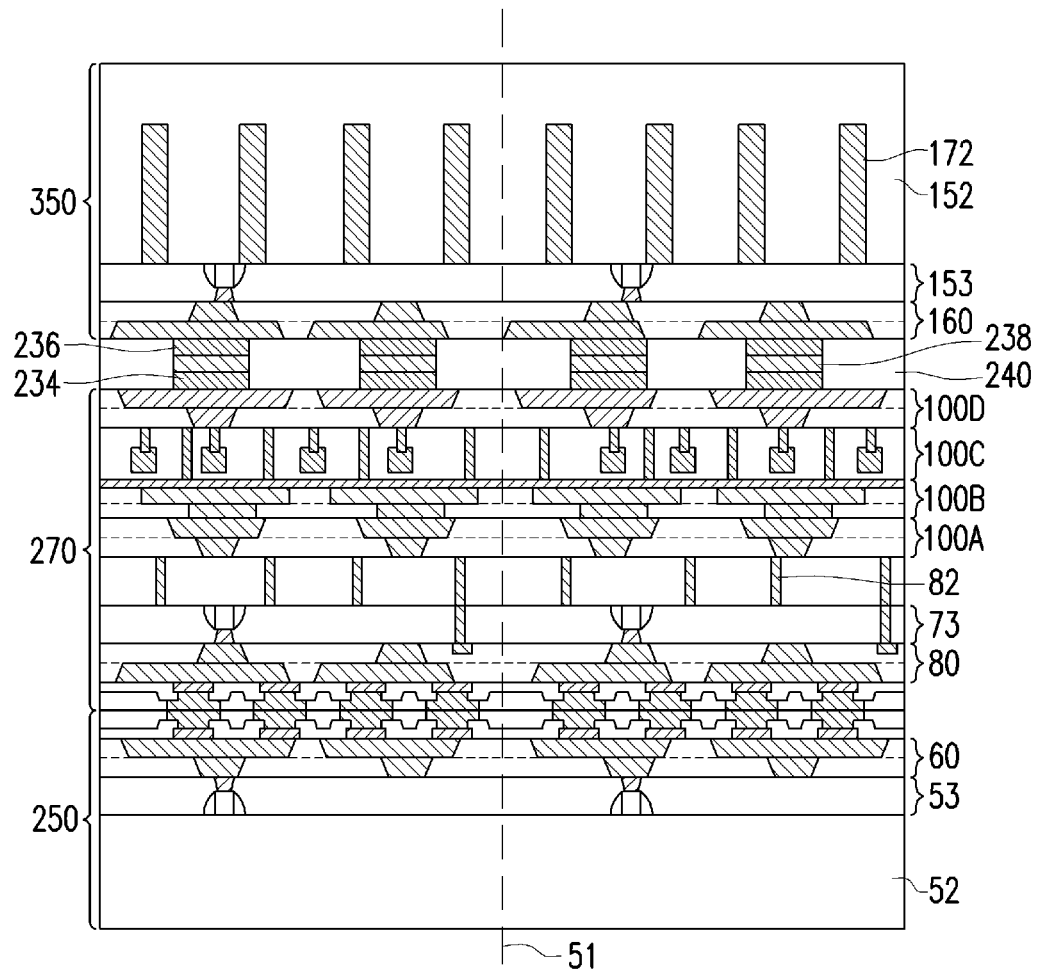

In FIG. 22, the bottom wafer 350 is bonded to the power rail wafer 270 through the conductive connectors 234 and 236 using a flip chip bonding process. A reflow process may be applied to adhere the solder regions 238 on the conductive connectors 234 to the conductive connectors 236. An underfill 240 may be deposited around the conductive connectors 236 and 238. The underfill 240 may be formed by a capillary flow process after the bottom wafer 350 is attached, or may be formed by a suitable deposition method before the bottom wafer 350 is attached. The underfill 240 may be disposed between the bottom wafer 350 and the power rail wafer 270.

Figure 23:
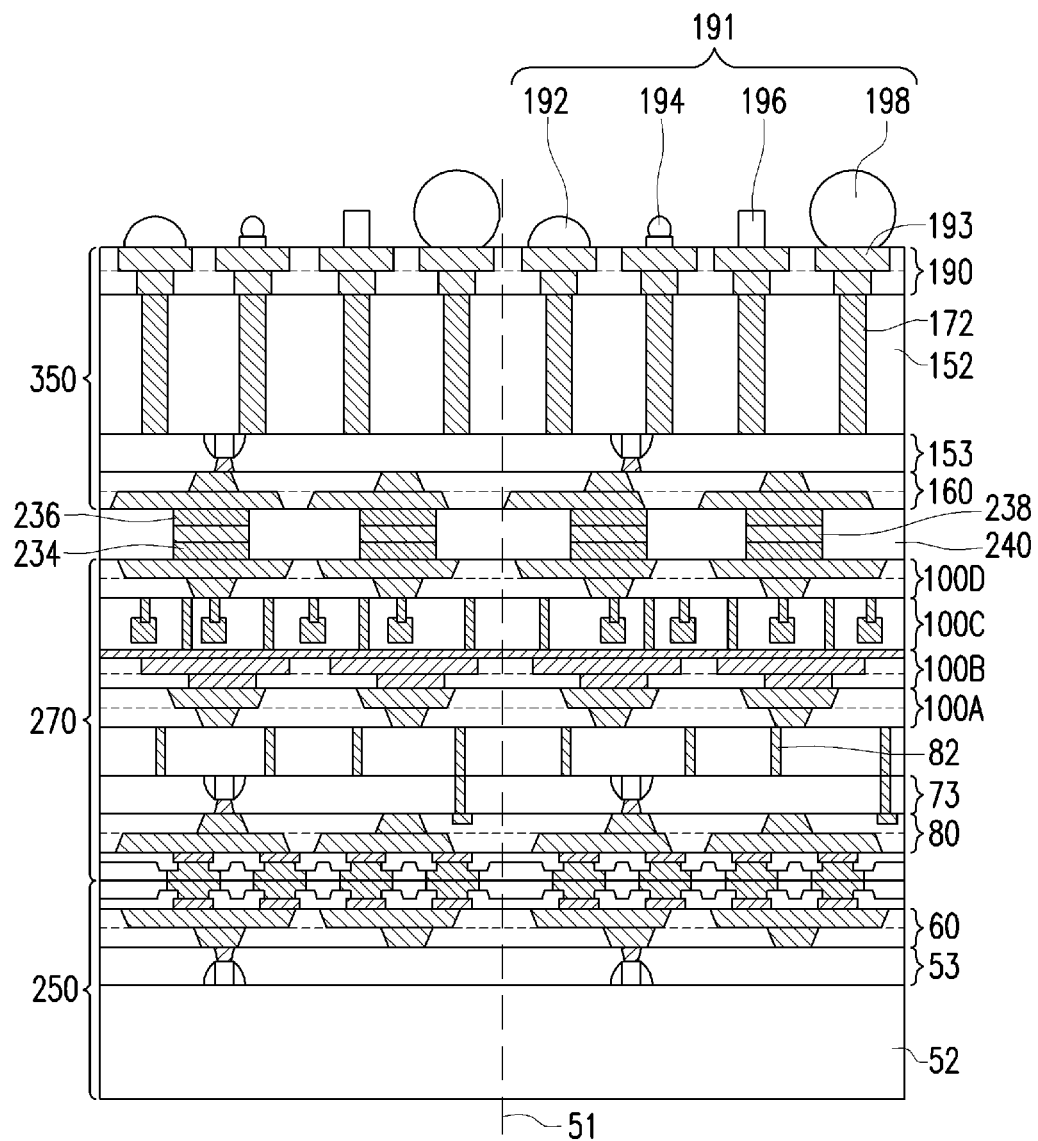

In FIG. 23, a planarization of the back side of the semiconductor substrate 152 is performed to expose top surfaces of the TSVs 172, a global interconnect 190 is formed on the back side of the semiconductor substrate 152, and external connectors 191 are formed on contact pads 193 of the global interconnect 190. These processes may be substantially similar as the processes illustrated above in FIGS. 16 through 18.

Figure 24:
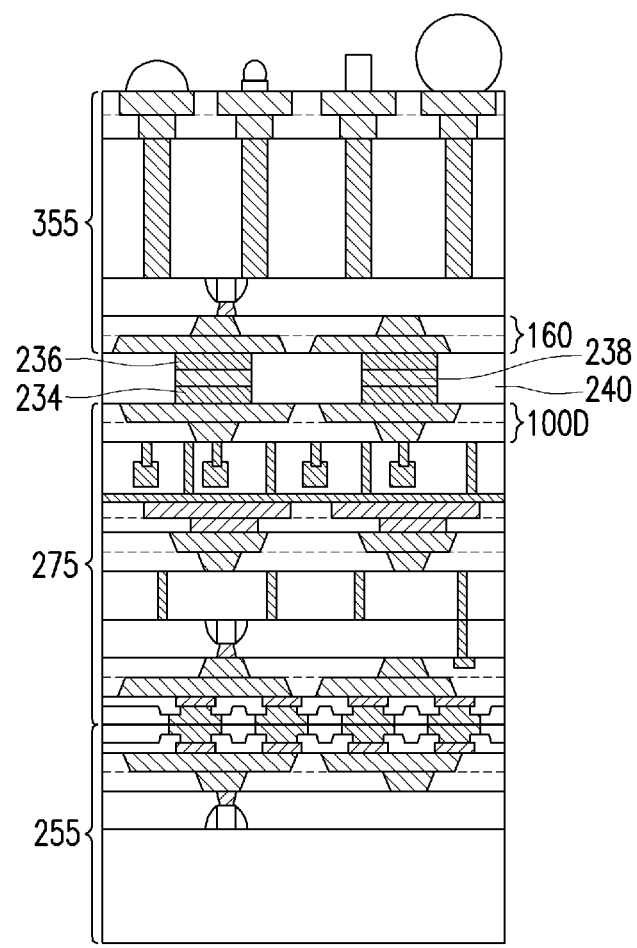

In FIG. 24, a singulation process is performed by sawing along scribe lines 51 to form an integrated circuit package 300. The sawing singulates the integrated circuit package 300, also referred to as a device stack 300, from the WoW structure illustrated in FIG. 23. The resulting singulated device stack 300 comprises a top chip 255, a power rail chip 275, and a bottom chip 355. The singulated device stack 300 may be substantially similar to the singulated device stack 200 (see above, FIG. 19A) but with the bottom chip 355 and power rail chip 275 coupled by micro bump bonds between conductive connectors 234 and 236 rather than bumpless bonds. In some embodiments, the top chip 255 and the power rail chip 275 may also be bonded by a flip chip bonding process with micro bump bonds rather than a bumpless bonding process.

FIGS. 25 through 34 illustrate a process for forming a package component with three tiers of integrated circuit structures at the chip-to-wafer (C2 W) scale, in accordance with some embodiments.

Figure 25:
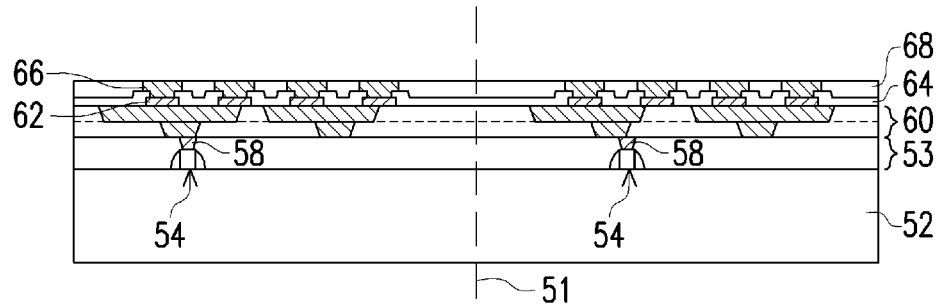
FIGS. 25 through 35 illustrate cross-sectional views of intermediate steps during a process for forming yet another package component in accordance with some embodiments.

FIG. 25 illustrates a top wafer 450, in accordance with some embodiments. The top wafer 450 may be formed using substantially similar materials and methods as the top wafer 50 as described above with respect to FIGS. 1-2.

Figure 26:
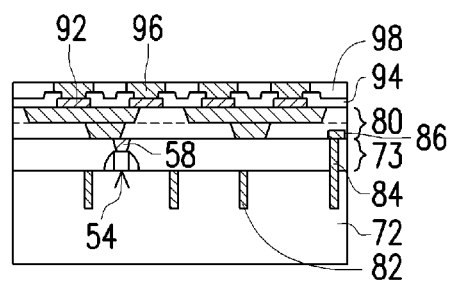

FIG. 26 illustrates a power rail die 470, in accordance with some embodiments. The power rail die 470 may be singulated along a scribe line 51 from a power rail wafer formed using substantially similar materials and methods as the power rail wafer 70 as described above with respect to FIGS. 3-4. The PDN and other structures of the power rail die may be subsequently formed as discussed in greater detail below with reference to FIGS. 27-30.

Figure 27:
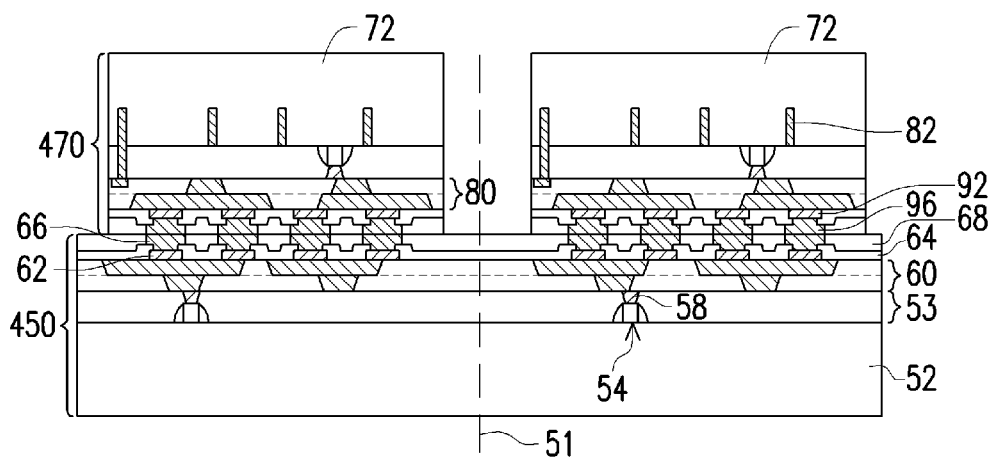

FIG. 27 illustrates a face-to-face (F2F) bonding of the active side of the top wafer 450 with active sides of power rail dies 470 using a suitable bonding method, forming a chip-on-wafer (CoW) structure. The F2F bonding may be performed using substantially similar methods as described above with respect to FIG. 6.

Figure 28:
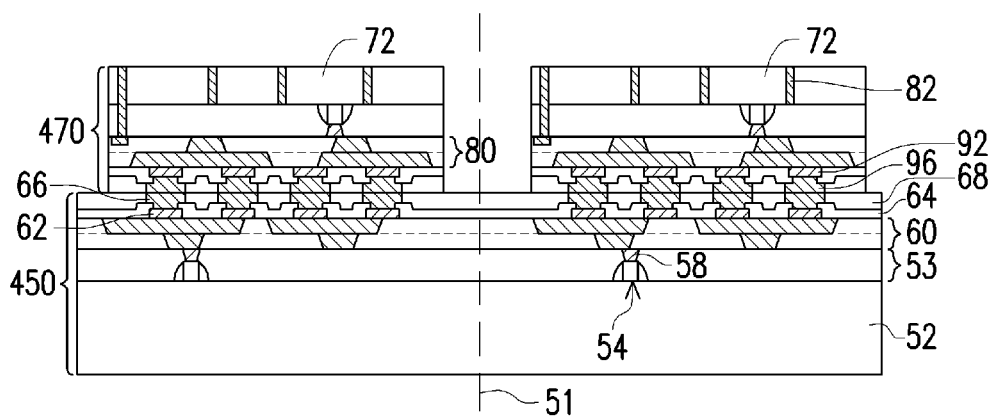

FIG. 28 illustrates a planarization of the back sides of the semiconductor substrates 72 of the power rail dies 470 to expose top surfaces of the TSVs 82. The planarization may be performed using substantially similar methods as described above with respect to FIG. 7.

Figure 29:
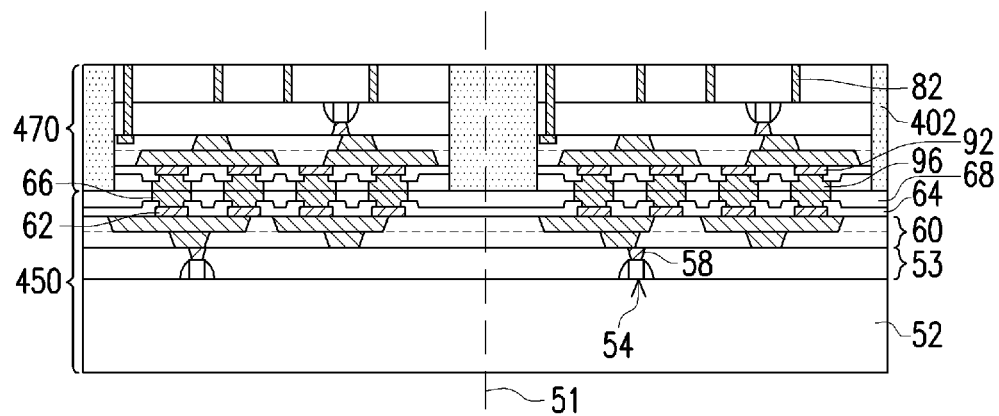

FIG. 29 illustrates the formation of a dielectric material 402 on the top wafer 450 and around the power rail dies 470. In some embodiments, the dielectric material 402 may be a molding compound, epoxy, or the like. In some embodiments, the dielectric material 402 is formed of a polymer, such as polybenzoxazole (PBO), polyimide, benzocyclobutene (BCB), or the like. In some embodiments, the dielectric material 402 is formed of a nitride such as silicon nitride; an oxide such as silicon oxide, phosphosilicate glass (PSG), borosilicate glass (BSG), boron-doped phosphosilicate glass (BPSG), or the like. The dielectric material 402 may be formed by any acceptable deposition process, such as compression molding, transfer molding, spin coating, CVD, laminating, the like, or a combination thereof. In some embodiments, after forming the dielectric material 402 to fill gaps between the power rail dies 470, excess portions of the dielectric material 402 over the power rail dies 470 may be removed by a suitable process such as a planarization or grinding. In some embodiments, the dielectric material 402 may be formed prior to the planarization performed with reference to FIG. 28, and a single planarization may be performed to planarize the dielectric material 402 and expose the TSVs 82.

Figure 30:
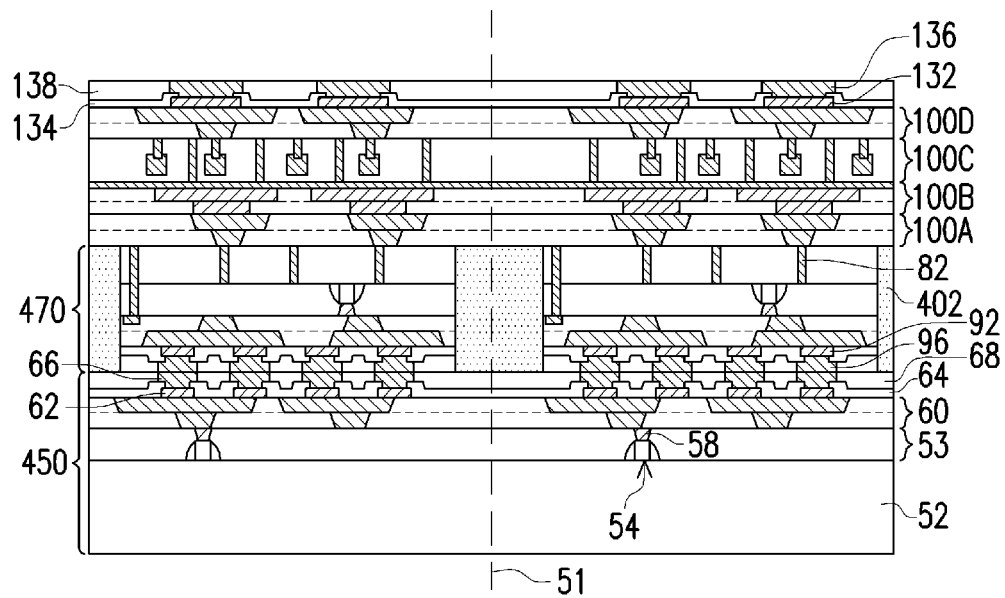

FIG. 30 illustrates the formation of a semi-global interconnect 100A through semi-global interconnect 100D, a passivation film 134, pads 132, a bonding layer 138, and pads 132 over the power rail dies 470 and the dielectric material 402. The semi-global interconnect 100A through semi-global interconnect 100D, passivation film 134, pads 132, bonding layer 138, and pads 132 may be formed using substantially similar materials and methods as described above in respect to FIGS. 8-12.

Figure 31:
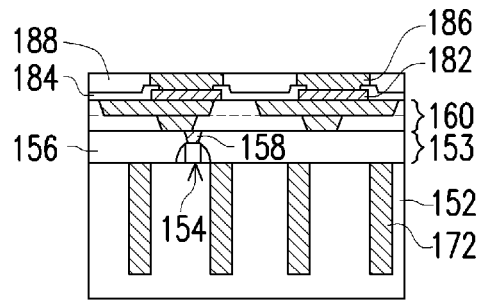

FIG. 31 illustrates a bottom die 550, in accordance with some embodiments. The bottom die 550 may be singulated along a scribe line 51 from a bottom wafer formed using substantially similar materials and methods as the bottom wafer 70 as described above with respect to FIGS. 13-14.

Figure 32:
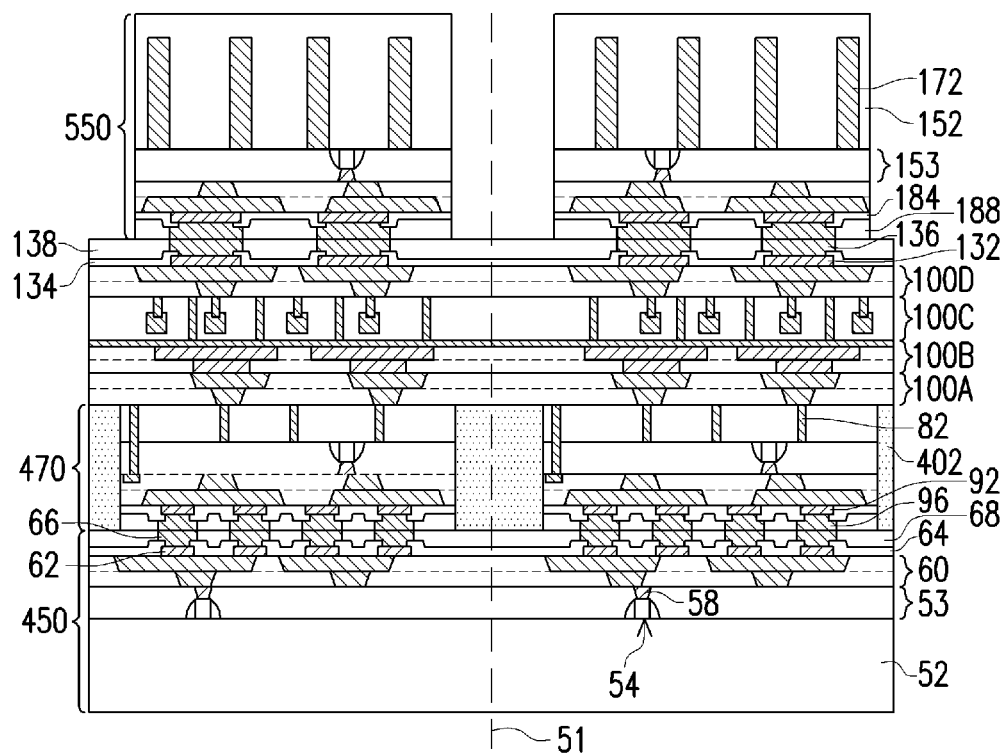

FIG. 32 illustrates a face-to-back (F2B) bonding of the active sides of bottom dies 550 with the bonding layer 138 and the pads 136 along the back side of the power rail die 470 using a suitable bonding method. The F2B bonding may be performed using substantially similar methods as described above with respect to FIG. 15.

Figure 33:
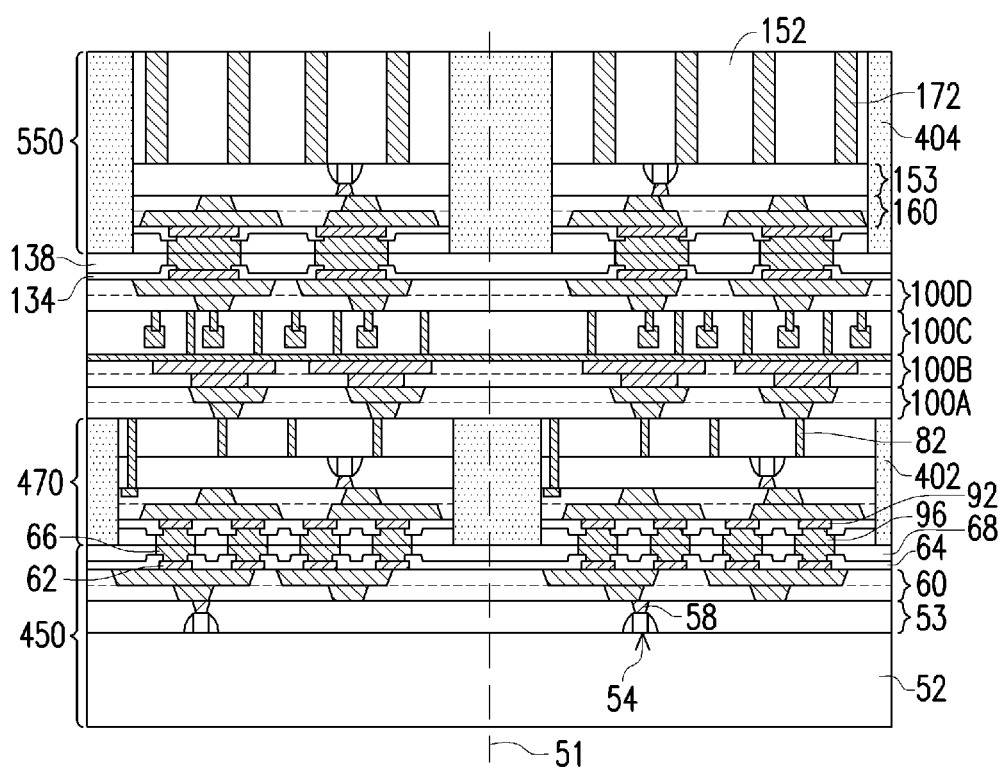

FIG. 33 illustrates a planarization of the back sides of the semiconductor substrates 152 of the bottom dies 550 to expose top surfaces of the TSVs 172 and a formation of a dielectric material 404 on the power rail chip 470 and around the bottom dies 550. The planarization may be performed using substantially similar methods as described above with respect to FIG. 7. The dielectric material 404 may be formed using substantially similar methods as described above with respect to FIG. 29.

Figure 34:
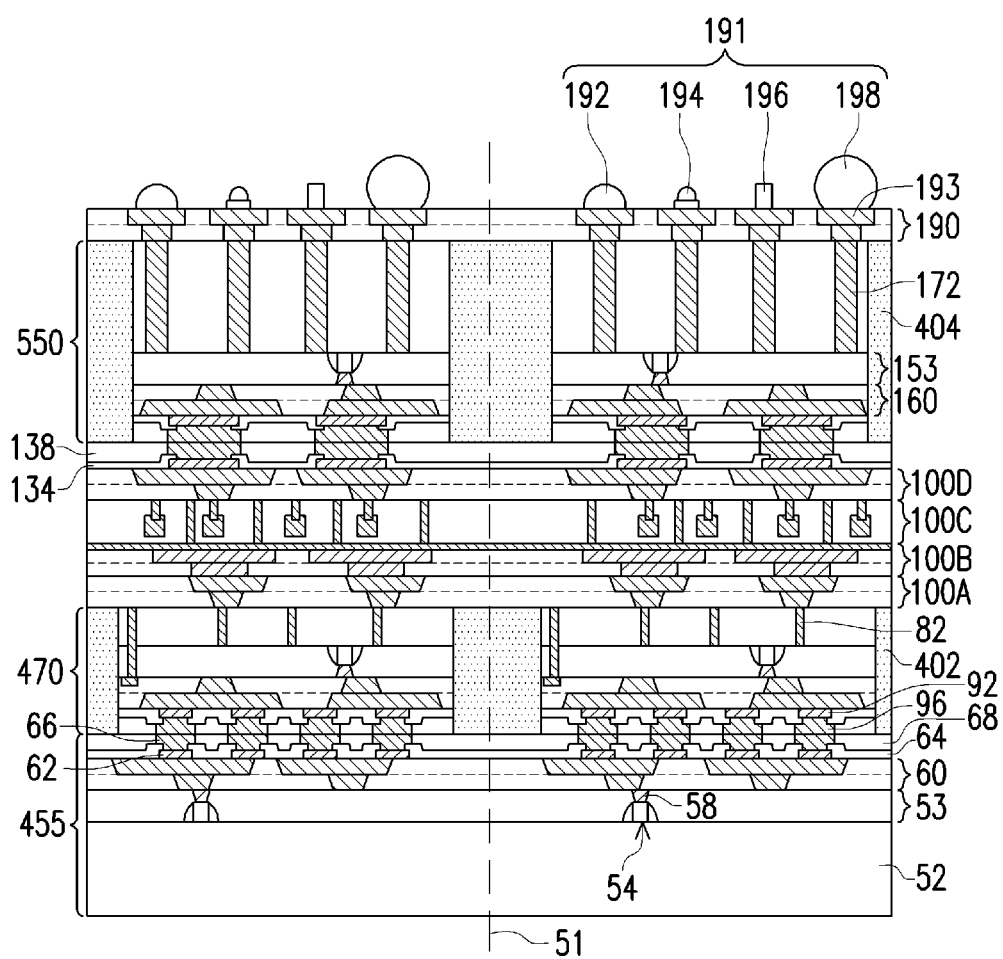

FIG. 34 illustrates the formation of a global interconnect 190 and external connectors 191 on the back side of the bottom dies 550 and the dielectric material 404, in accordance with some embodiments. The global interconnect 190 and external connectors 191 may be formed using substantially similar methods as described above with respect to FIGS. 17-18.

Figure 35:
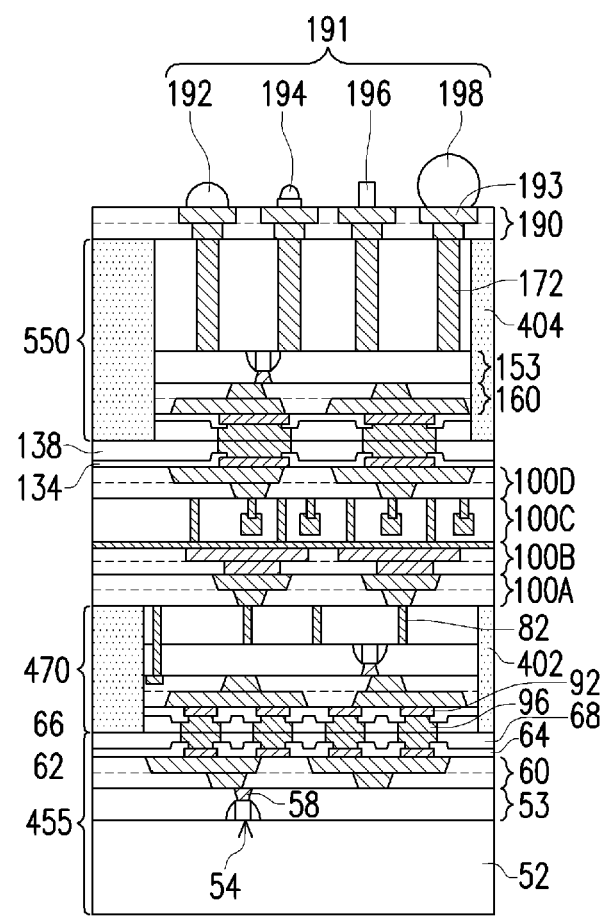

In FIG. 35, a singulation process is performed by sawing along scribe lines 51 to form an integrated circuit package 400. The sawing singulates the integrated circuit package 400, also referred to as a device stack 400, from the CoW structure illustrated in FIG. 34. The singulation process may singulate through the dielectric material 404 between adjacent ones of the bottom dies 550 and through the dielectric material 402 between adjacent ones of the power rail dies 470. As such, the dielectric materials 402 and 404 may provide environmental protection to the sidewalls of the bottom dies 550 and the power rail dies 470 after singulation. The resulting singulated device stack 400 comprises a bottom die 550, a power rail die 470, and a top die 455. By integrating the PDN layer 100B on the back side of the power rail die 470 in the middle of the device stack 400, better system power efficiency and thermal dissipation may be achieved. In some embodiments, the bottom dies 550 may be bonded to the power rail dies 470 with a WoW process using substantially similar methods as described above with respect to FIGS. 17-18 (not shown here).

FIGS. 36 through 43 illustrate a process for forming another integrated circuit package 500 with three tiers of integrated circuit structures at the chip-to-wafer (C2 W) scale, in accordance with some embodiments. The integrated circuit package 500 may differ from the integrated circuit package 400 (see above, FIG. 35) by having its bottom die 510 and power rail die 470 coupled by micro bump bonds rather than hybrid bonds.

Figure 36:
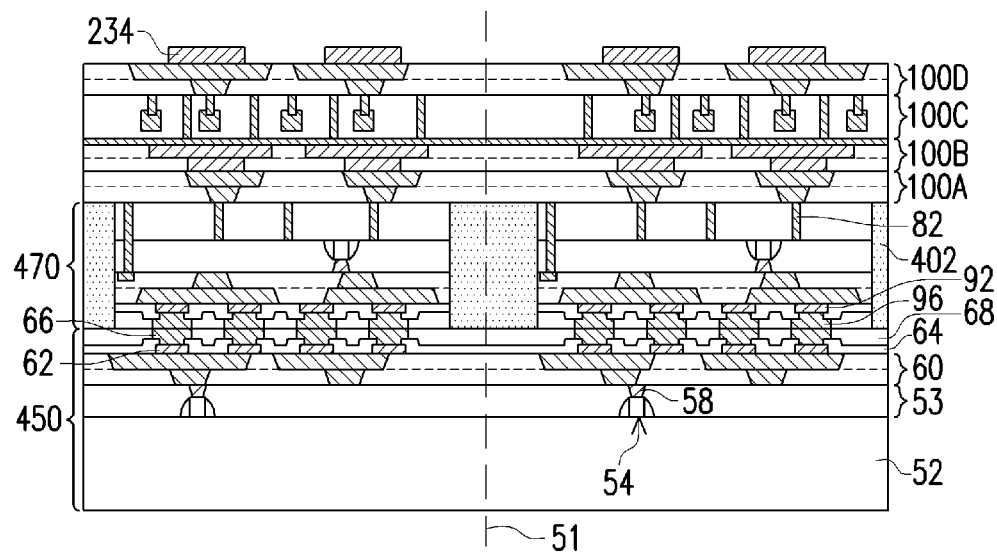
FIGS. 36 through 43 illustrate cross-sectional views of intermediate steps during a process for forming yet another package component in accordance with some embodiments.

FIG. 36 illustrates a CoW structure substantially similar to the CoW structure illustrated in FIG. 30, except that conductive connectors 234 are formed on a top surface of a semi-global interconnect 100D formed on a back side of a power rail die 470 and are electrically coupled to conductive features of the semi-global interconnect 100D. The conductive connectors 234 may comprise a conductive material such as copper and may comprise solder regions. However, any suitable conductive material may be used.

Figure 37:
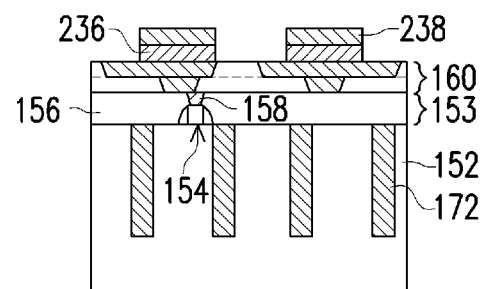

FIG. 37 illustrates a bottom die 510, in accordance with some embodiments. The bottom die 510 may be substantially similar to the bottom die 550 described above with respect to FIG. 31, except that conductive connectors 236 are formed on a top surface of the semi-global interconnect 160 and electrically coupled to conductive features of the semi-global interconnect 160. The conductive connectors 236 may be substantially similar to the conductive connectors 234 described above with respect to FIG. 36. Solder regions 238 may be formed on the conductive connectors 234 or the conductive connectors 236.

Figure 38:
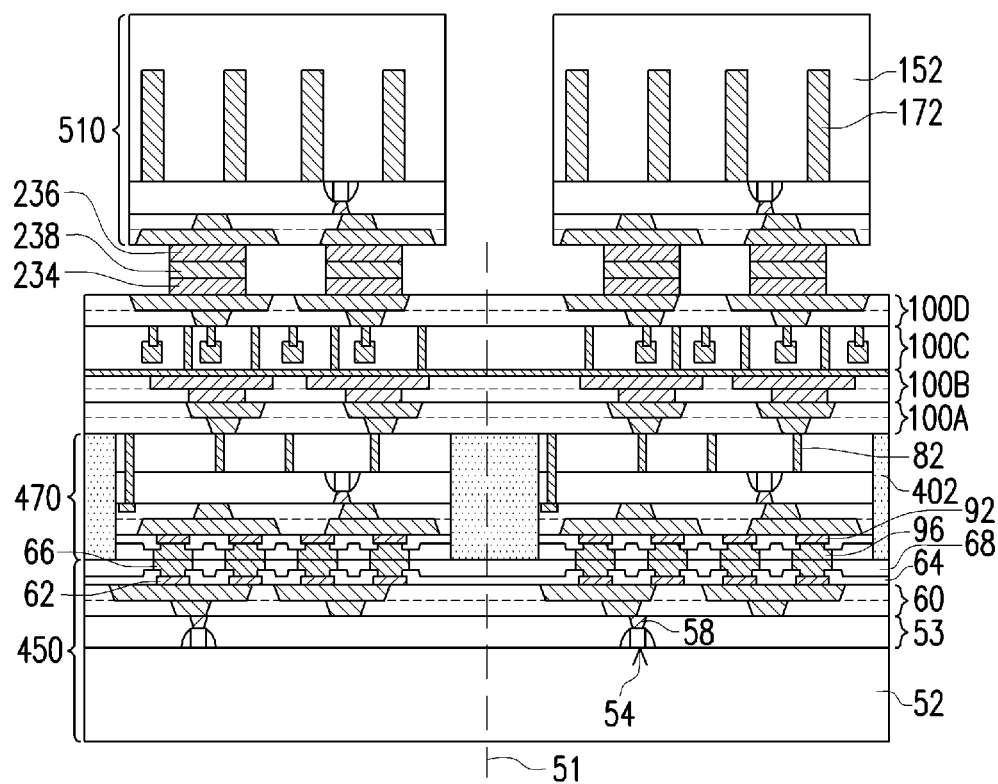

In FIG. 38, bottom dies 510 are bonded to the semi-global interconnect 100D through the conductive connectors 234 and 236 using a flip chip bonding process. A reflow process may be applied to reflow the solder regions 238 to adhere the conductive connectors 234 to the conductive connectors 236.

Figure 39:
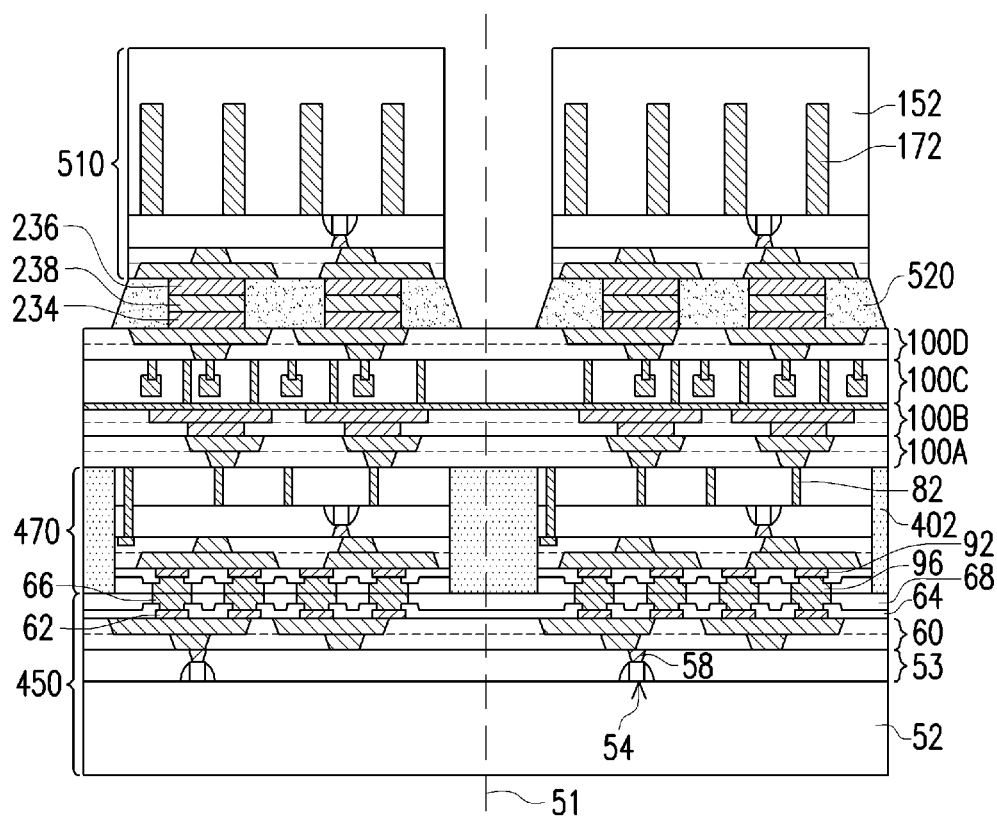

In FIG. 39, an underfill 520 may be deposited around the conductive connectors 234 and 236. The underfill 520 may be formed by a capillary flow process after the bottom dies 510 are attached, or may be formed by a suitable deposition method before the bottom dies 510 are attached. The underfill 520 may be disposed between the bottom dies 510 and the semi-global interconnect 100D.

Figure 40:
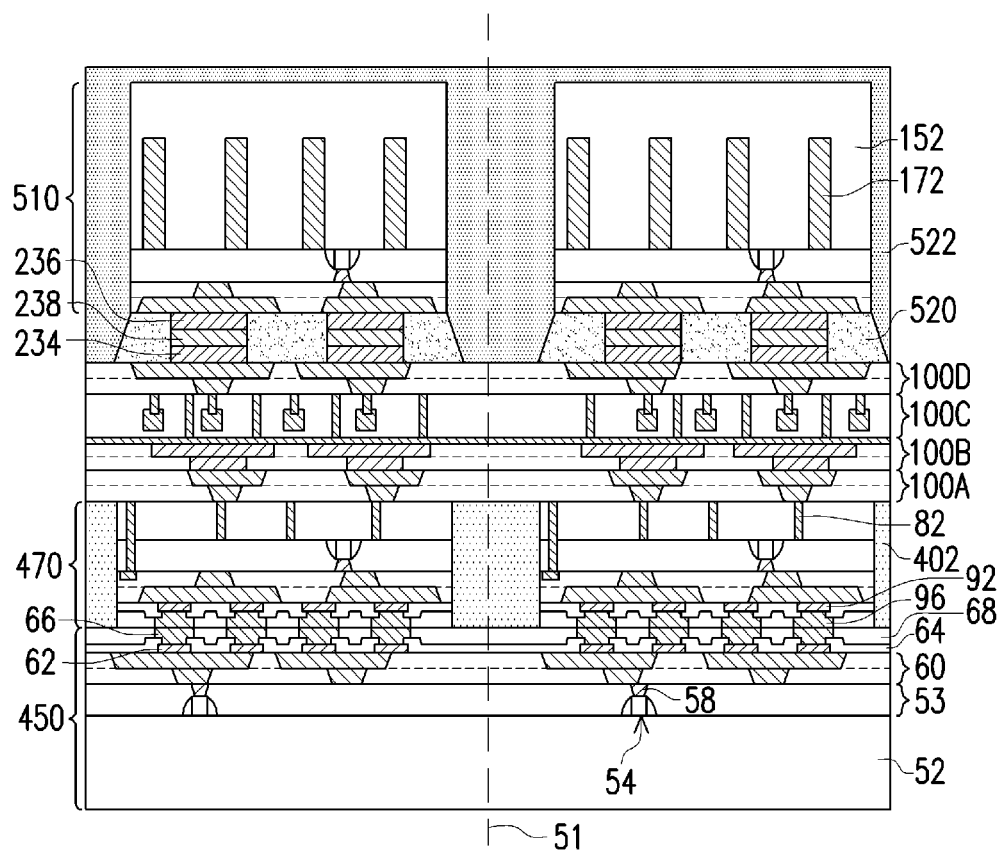

In FIG. 40, an encapsulant 522 is formed on and around the various components. After formation, the encapsulant 522 encapsulates the bottom dies 510. The encapsulant 522 may be a molding compound, epoxy, or the like. The encapsulant 522 may be applied by compression molding, transfer molding, or the like, and may be formed over the structure such that the bottom dies 510 are buried or covered. The encapsulant 522 is further formed in gap regions between the bottom dies 510. The encapsulant 522 may be applied in liquid or semi-liquid form and then subsequently cured.

Figure 41:
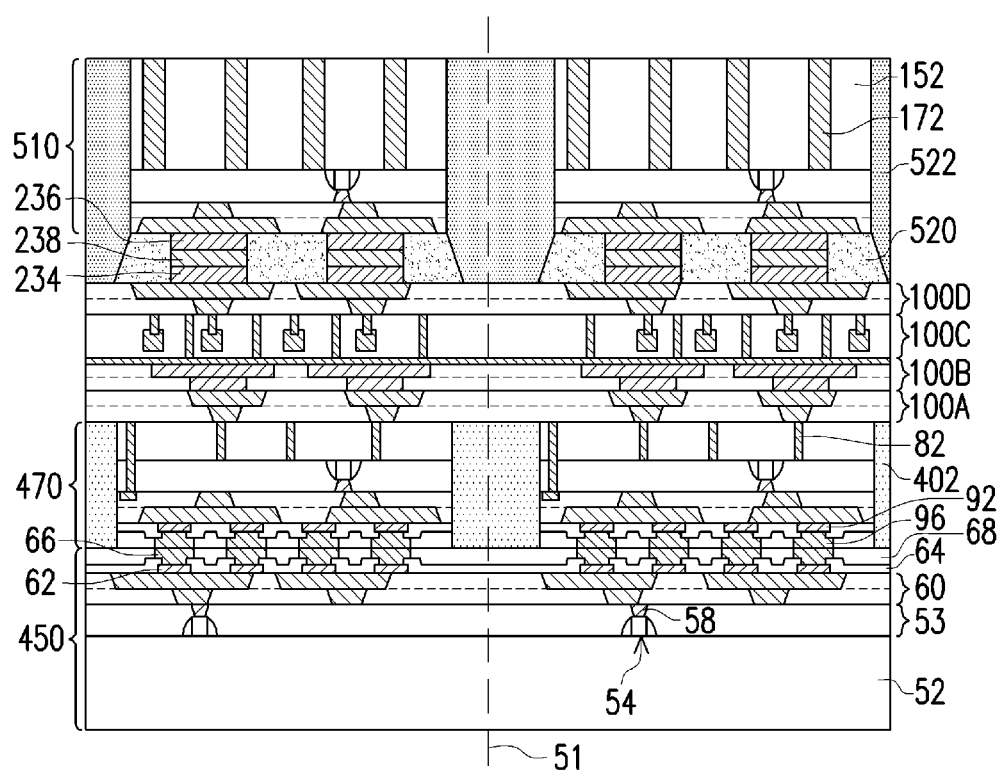

In FIG. 41, a planarization process is performed on the encapsulant 522 to remove a top portion of the encapsulant 522 and the semiconductor substrates 152 of the bottom dies 510 to expose the TSVs 172. Top surfaces of the semiconductor substrates 152, TSVs 172, and encapsulant 522 are substantially coplanar after the planarization process within process variations. The planarization process may be, for example, a chemical-mechanical polish (CMP), a grinding process, or the like. In some embodiments, the planarization may be omitted, for example, if the TSVs 172 are already exposed.

Figure 42:
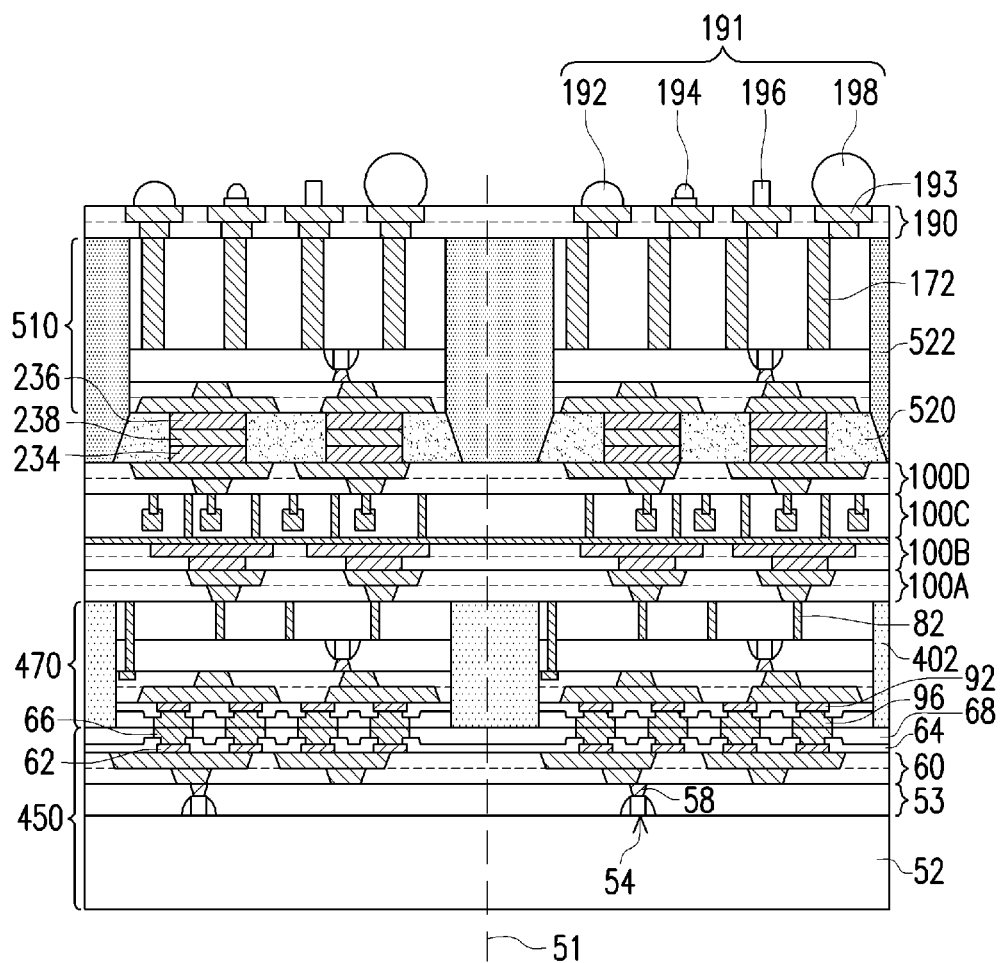

FIG. 42 illustrates the formation of a global interconnect 190 and external connectors 191 on the back side of the bottom dies 510 and the encapsulant 522. The global interconnect 190 and external connectors 191 may be formed using substantially similar methods as described above with respect to FIGS. 17-18.

Figure 43:
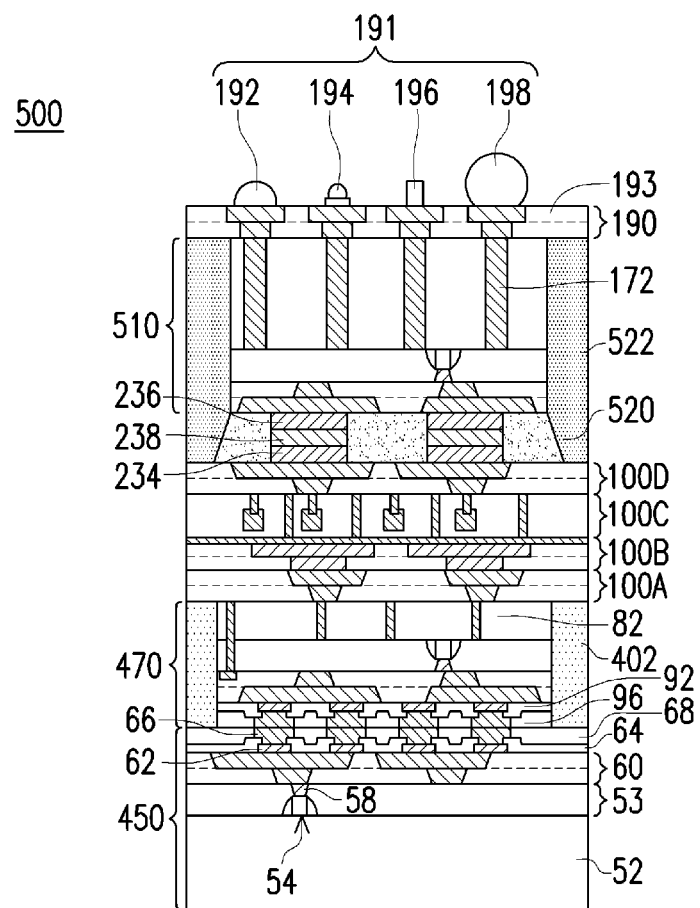

In FIG. 43, a singulation process is performed by sawing along scribe lines 51 to form an integrated circuit package 500. The sawing singulates the integrated circuit package 500, also referred to as a device stack 500, from the CoW structure illustrated in FIG. 42. The resulting singulated device stack 500 comprises a bottom die 510, a power rail die 470, and a top die 455. The singulation process may singulate through the encapsulant 522 between adjacent ones of the bottom dies 510 and through the dielectric material 402 between adjacent ones of the power rail dies 470. As such, the encapsulant 522 and the dielectric material 402 may provide environmental protection to the sidewalls of the bottom dies 510 and the power rail dies 470 after singulation. By integrating the PDN layer 100B on the back side of the power rail die 470 in the middle of the device stack 500, better system power efficiency and thermal dissipation may be achieved.

Figure 44:
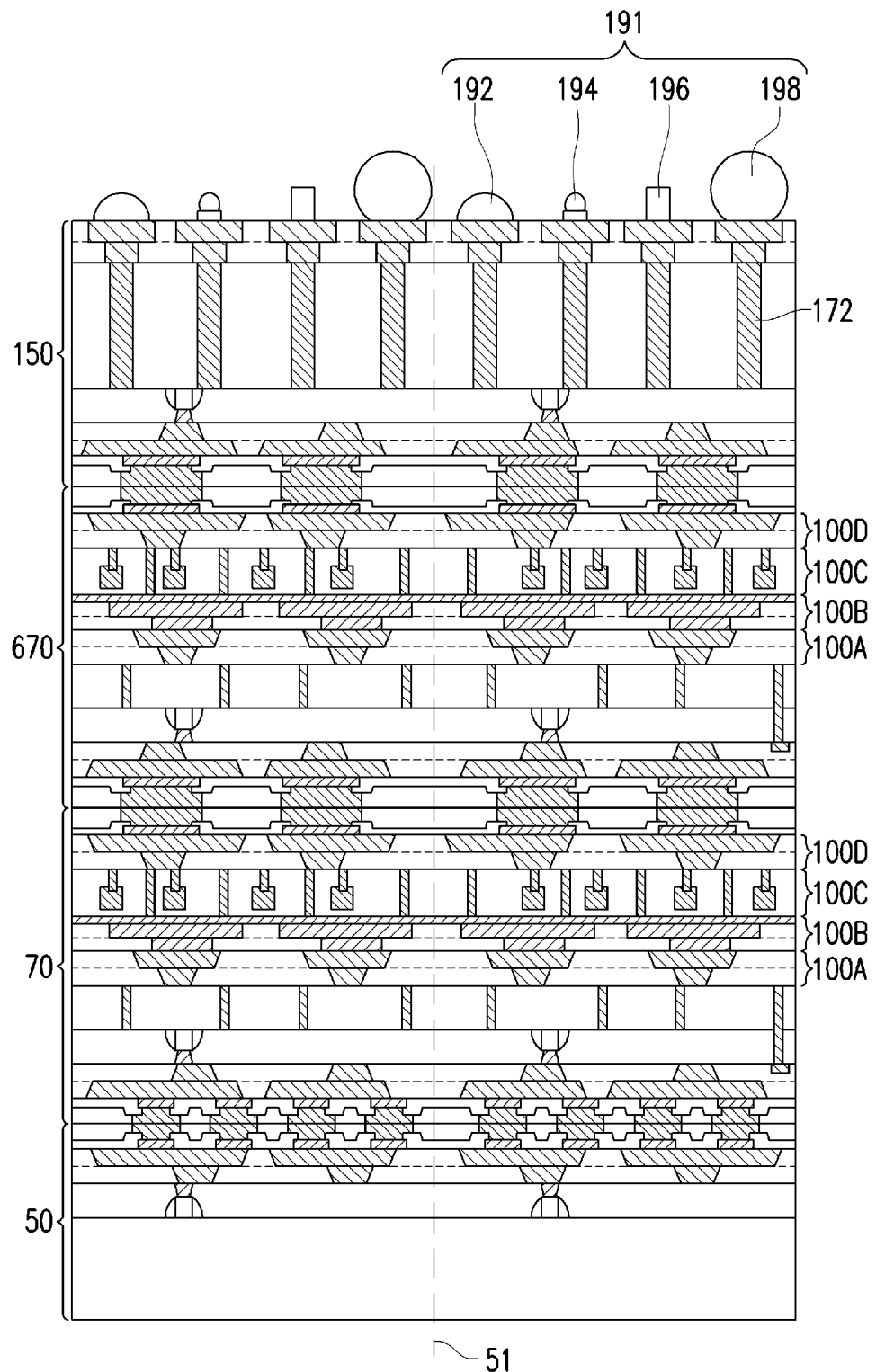
FIGS. 44 and 45 illustrate cross-sectional views of intermediate steps during a process for forming yet another package component in accordance with some embodiments.

FIG. 44 illustrates a wafer-on-wafer (WoW) structure similar to the WoW structure illustrated above in FIG. 18 but with four tiers instead of three tiers. The WoW structure of FIG. 44 comprises a top wafer 50, a power rail wafer 70, and a bottom wafer 150, which may be substantially similar to the top wafer 50, the power rail wafer 70, and the bottom wafer 150 of FIG. 18, respectively. An additional wafer 670 is bonded between the power rail wafer 70 and the bottom wafer 150. In the illustrated embodiment, the additional wafer 670 is a power rail wafer substantially similar to the power rail wafer 70. In some embodiments, the additional wafer 670 is substantially similar to the bottom wafer 150.

Figure 45:
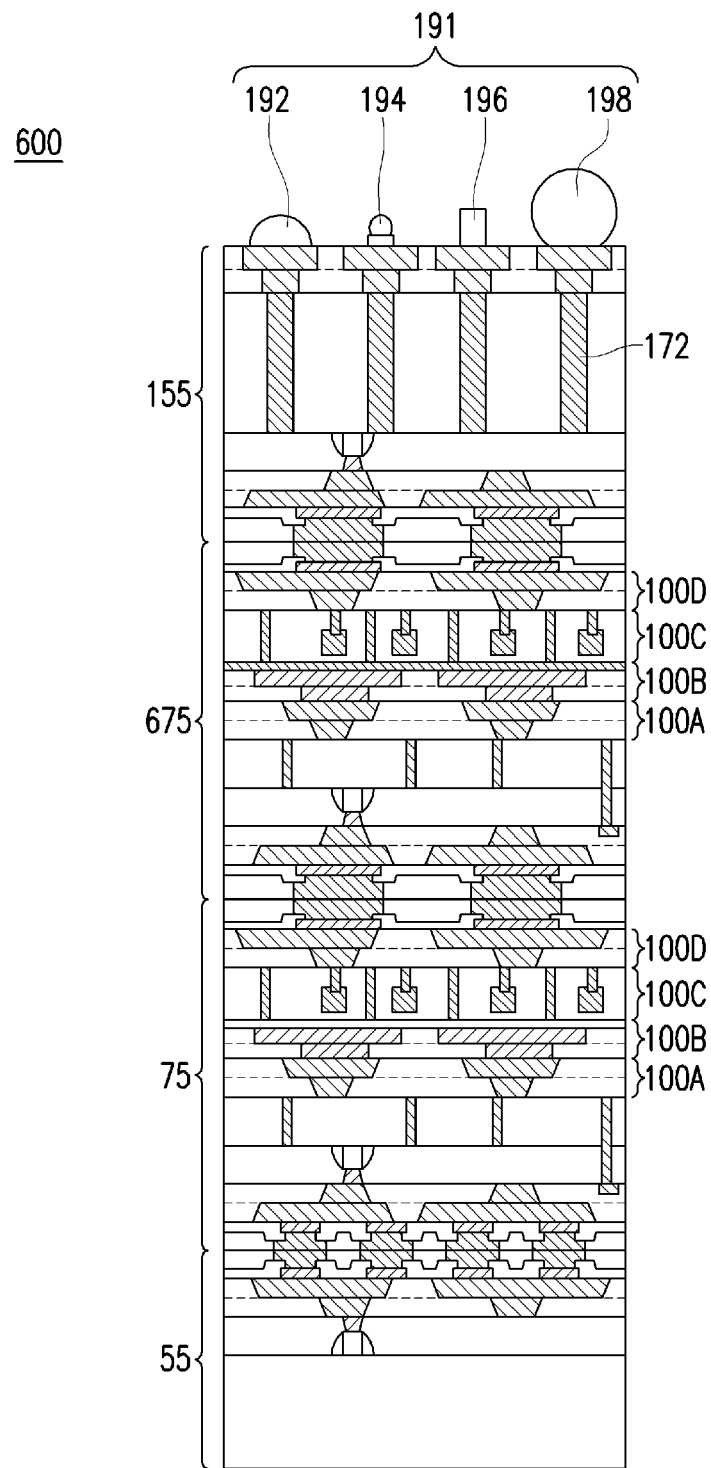

FIG. 45 illustrates an integrated circuit package 600 singulated from the WoW structure illustrated in FIG. 44. The integrated circuit package 600 comprises a top die 55, a power rail die 75, an additional die 675, and a bottom die 155 resulting from the singulation of a top wafer 50, a power rail wafer 70, an additional wafer 670, and a bottom wafer 150, respectively, of FIG. 44. In the illustrated embodiment, the integrated circuit package 600 has four tiers and the additional die 675 is a power rail die including a PDN layer 100B or the equivalent components. In some embodiments, the additional die 675 may be a power rail die without a PDN layer 100B or a die substantially similar to the bottom die 155 with TSVs 172.

In some embodiments, the integrated circuit package 600 may have more than four tiers with additional dies (not shown) that may be substantially similar to power rail dies 675 with or without PDN layers 100B or to bottom dies 155 with TSVs 172. In some embodiments, the integrated circuit package 600 may be formed by a W2W process as illustrated in FIGS. 1-18 above or by a C2W process such as illustrated in FIGS. 25-35 above. In some embodiments, some or all of the respective chips may be bonded to each other with a flip chip bonding process as illustrated in FIGS. 20-24. In some embodiments, the top die 55 may include TSVs so that power may enter through external connectors on the top die 55 as illustrated in FIG. 19B above.

The structures described above may be used in various applications. For example, FIGS. 46-65 illustrate various applications of an integrated circuit package 200, wherein the integrated circuit package 200 as shown in FIGS. 48 through 63 may be any of the packages as shown in FIGS. 19A, 19B, 24, 35, 43, 45, or the combinations and/or modifications, of these embodiments.

Referring first to FIGS. 46 through 62, there are shown cross-sectional views of intermediate steps during a process for forming a package component 1000, in accordance with some embodiments. A first package region 1000A and a second package region 1000B are illustrated, and one or more of the integrated circuit packages 200 are packaged to form an integrated circuit package in each of the package regions 1000A and 1000B. The integrated circuit packages may also be referred to as integrated fan-out (InFO) packages.

Figure 46:
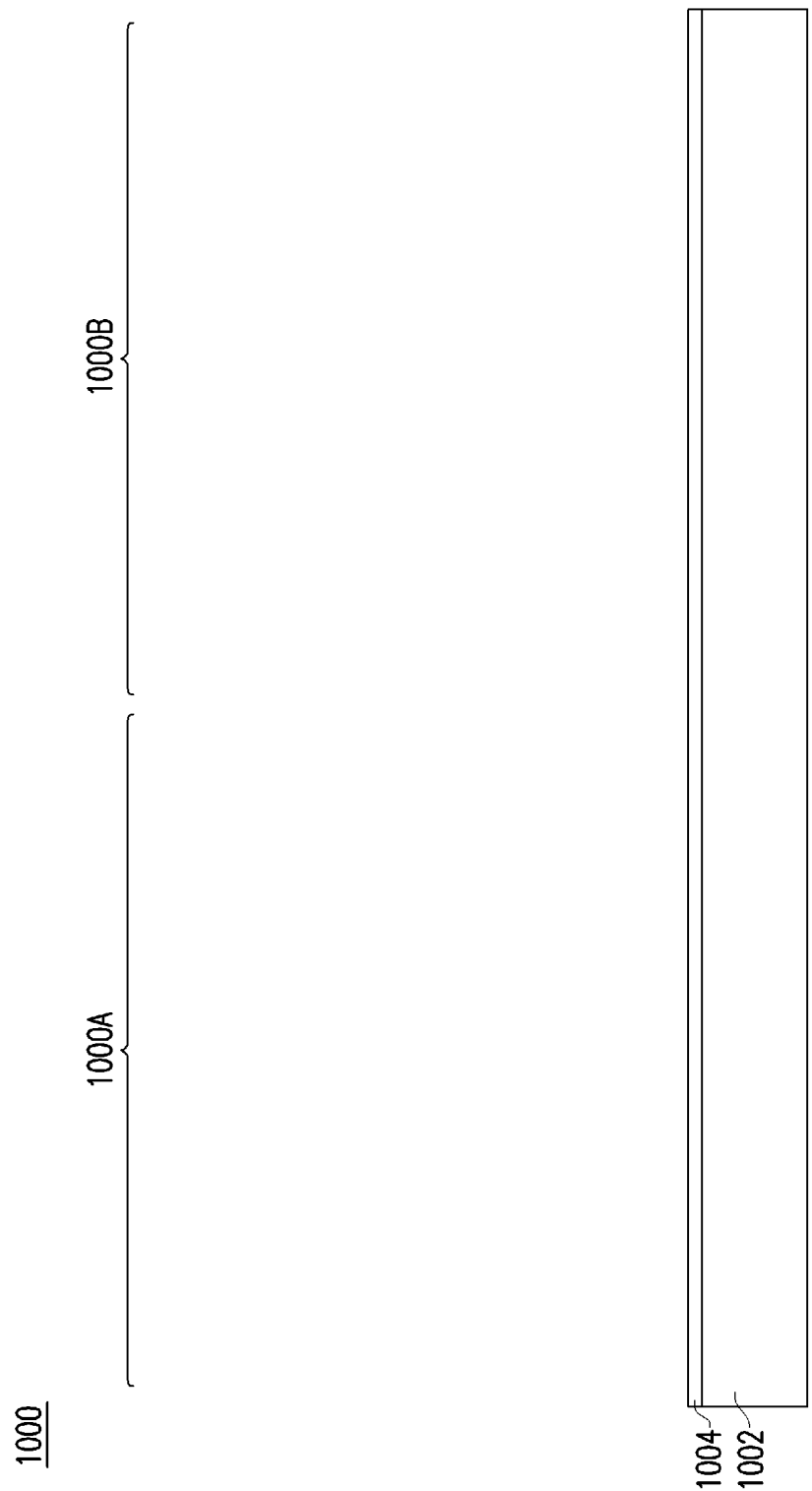
FIGS. 46 through 59 illustrate cross-sectional views of intermediate steps during a process for forming yet another package component in accordance with some embodiments.

In FIG. 46, a carrier substrate 1002 is provided, and a release layer 1004 is formed on the carrier substrate 1002. The carrier substrate 1002 may be a glass carrier substrate, a ceramic carrier substrate, or the like. The carrier substrate 1002 may be a wafer, such that multiple packages can be formed on the carrier substrate 1002 simultaneously.

The release layer 1004 may be formed of a polymer-based material, which may be removed along with the carrier substrate 1002 from the overlying structures that will be formed in subsequent steps. In some embodiments, the release layer 1004 is an epoxy-based thermal-release material, which loses its adhesive property when heated, such as a light-to-heat-conversion (LTHC) release coating. In other embodiments, the release layer 1004 may be an ultra-violet (UV) glue, which loses its adhesive property when exposed to UV lights. The release layer 1004 may be dispensed as a liquid and cured, may be a laminate film laminated onto the carrier substrate 1002, or may be the like. The top surface of the release layer 1004 may be leveled and may have a high degree of planarity.

Figure 47:
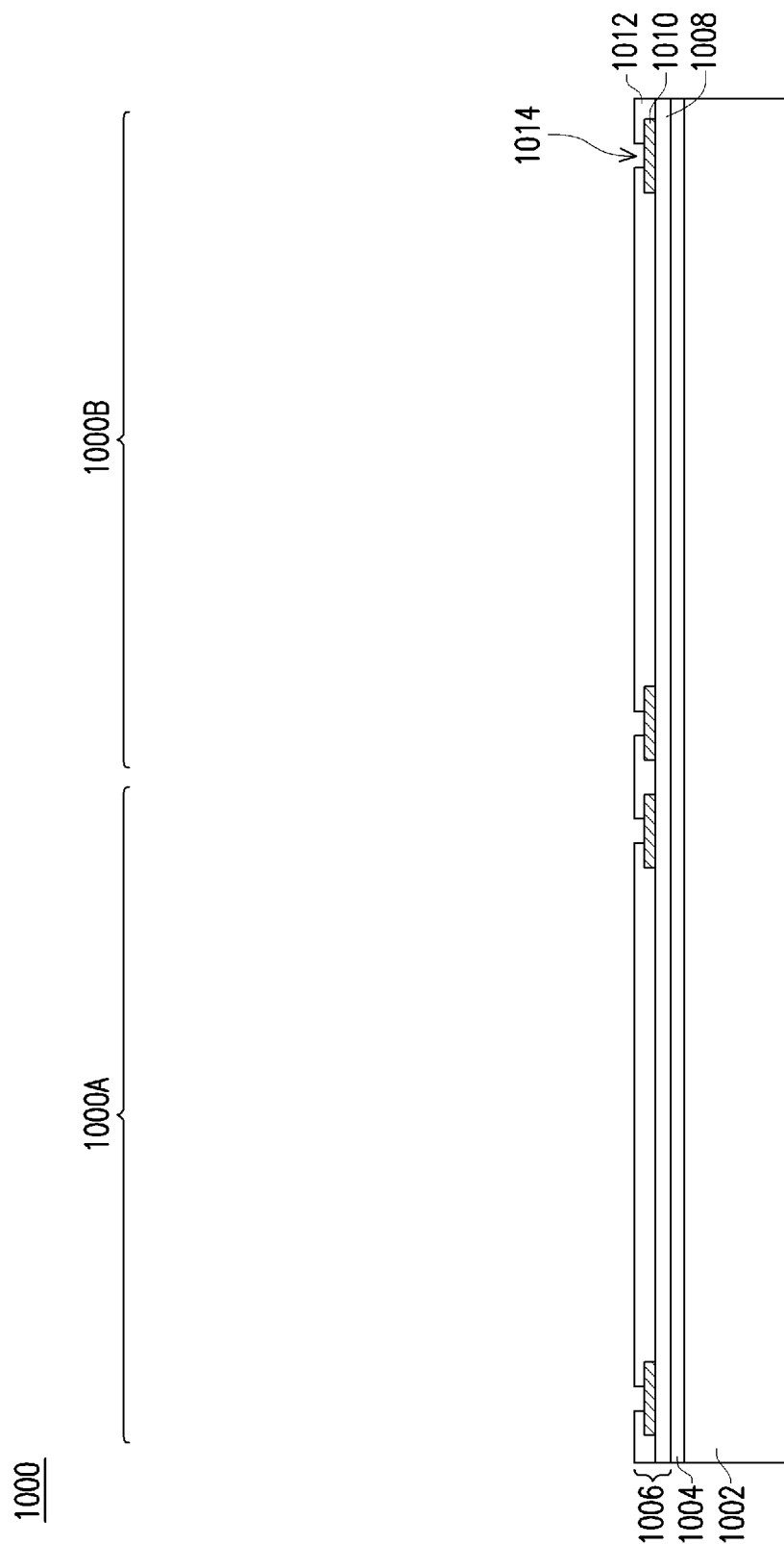

In FIG. 47, a back-side redistribution structure 1006 may be formed on the release layer 1004. In the embodiment shown, the back-side redistribution structure 1006 includes a dielectric layer 1008, a metallization pattern 1010 (sometimes referred to as redistribution layers or redistribution lines), and a dielectric layer 1012. The back-side redistribution structure 1006 is optional. In some embodiments, a dielectric layer without metallization patterns is formed on the release layer 1004 in lieu of the back-side redistribution structure 1006.

The dielectric layer 1008 may be formed on the release layer 1004. The bottom surface of the dielectric layer 1008 may be in contact with the top surface of the release layer 1004. In some embodiments, the dielectric layer 1008 is formed of a polymer, such as polybenzoxazole (PBO), polyimide, benzocyclobutene (BCB), or the like. In other embodiments, the dielectric layer 1008 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 1008 may be formed by any acceptable deposition process, such as spin coating, CVD, laminating, the like, or a combination thereof.

The metallization pattern 1010 may be formed on the dielectric layer 1008. As an example to form metallization pattern 1010, a seed layer is formed over the dielectric layer 1008. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist (not shown) is then formed and patterned on the seed layer. The photoresist may be formed by spin coating or the like and may be exposed to light for patterning. The pattern of the photoresist corresponds to the metallization pattern 1010. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 1010.

The dielectric layer 1012 may be formed on the metallization pattern 1010 and the dielectric layer 1008. In some embodiments, the dielectric layer 1012 is formed of a polymer, which may be a photo-sensitive material such as PBO, polyimide, BCB, or the like, that may be patterned using a lithography mask. In other embodiments, the dielectric layer 1012 is formed of a nitride such as silicon nitride; an oxide such as silicon oxide, PSG, BSG, BPSG; or the like. The dielectric layer 1012 may be formed by spin coating, lamination, CVD, the like, or a combination thereof. The dielectric layer 1012 is then patterned to form openings 1014 exposing portions of the metallization pattern 1010. The patterning may be performed by an acceptable process, such as by exposing the dielectric layer 1012 to light when the dielectric layer 1012 is a photo-sensitive material or by etching using, for example, an anisotropic etch. If the dielectric layer 1012 is a photo-sensitive material, the dielectric layer 1012 can be developed after the exposure.

FIG. 47 illustrates a redistribution structure 1006 having a single metallization pattern 1010 for illustrative purposes. In some embodiments, the back-side redistribution structure 1006 may include any number of dielectric layers and metallization patterns. If more dielectric layers and metallization patterns are to be formed, steps and processes discussed above may be repeated. The metallization patterns may include one or more conductive elements. The conductive elements may be formed during the formation of the metallization pattern by forming the seed layer and conductive material of the metallization pattern over a surface of the underlying dielectric layer and in the opening of the underlying dielectric layer, thereby interconnecting and electrically coupling various conductive lines.

Figure 48:
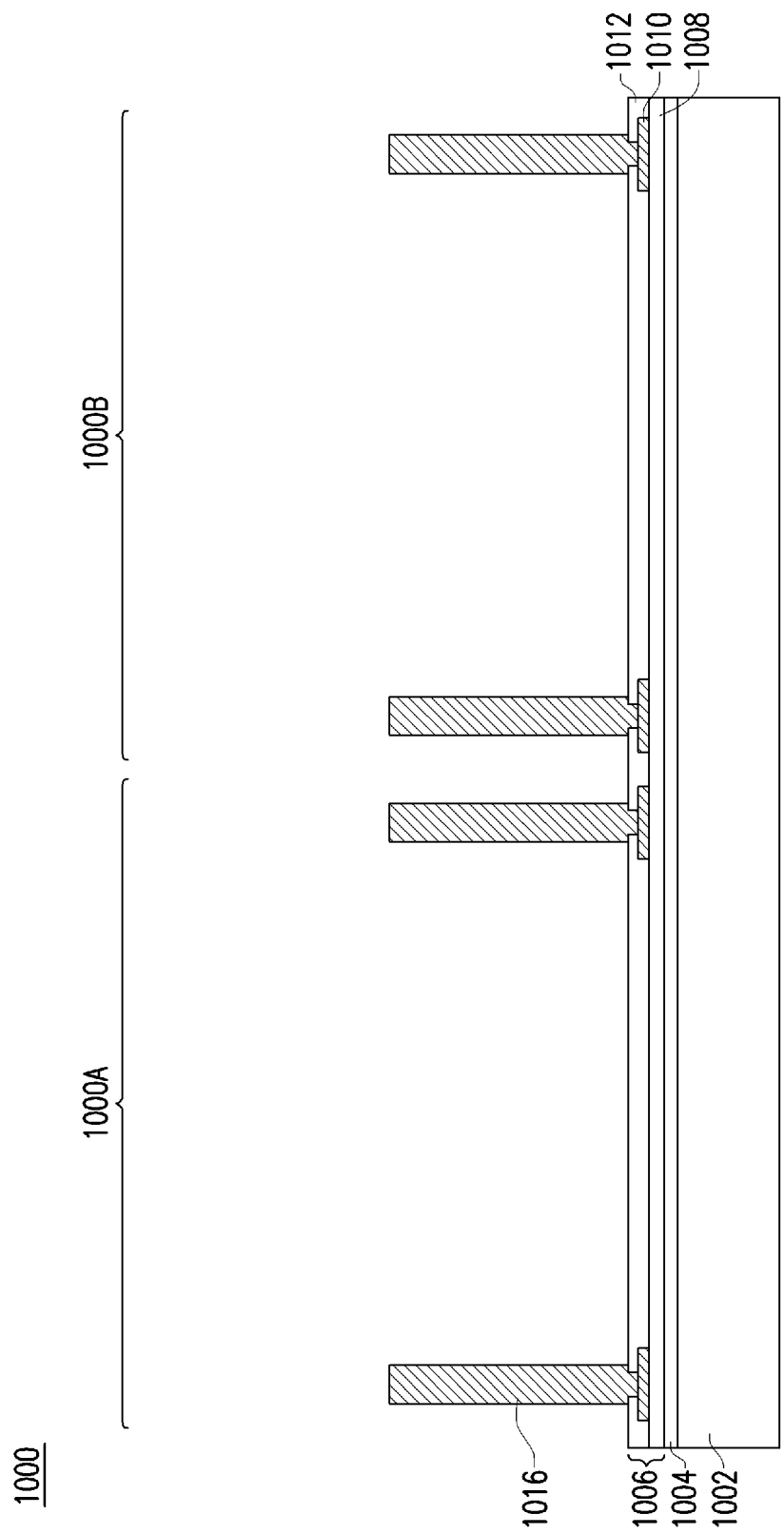

In FIG. 48, through vias 1016 are formed in the openings 1014 and extending away from the topmost dielectric layer of the back-side redistribution structure 1006 (e.g., the dielectric layer 1012). As an example to form the through vias 1016, a seed layer (not shown) is formed over the back-side redistribution structure 1006, e.g., on the dielectric layer 1012 and portions of the metallization pattern 1010 exposed by the openings 1014. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias (e.g., the through vias 1016). The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 1016.

Figure 49:
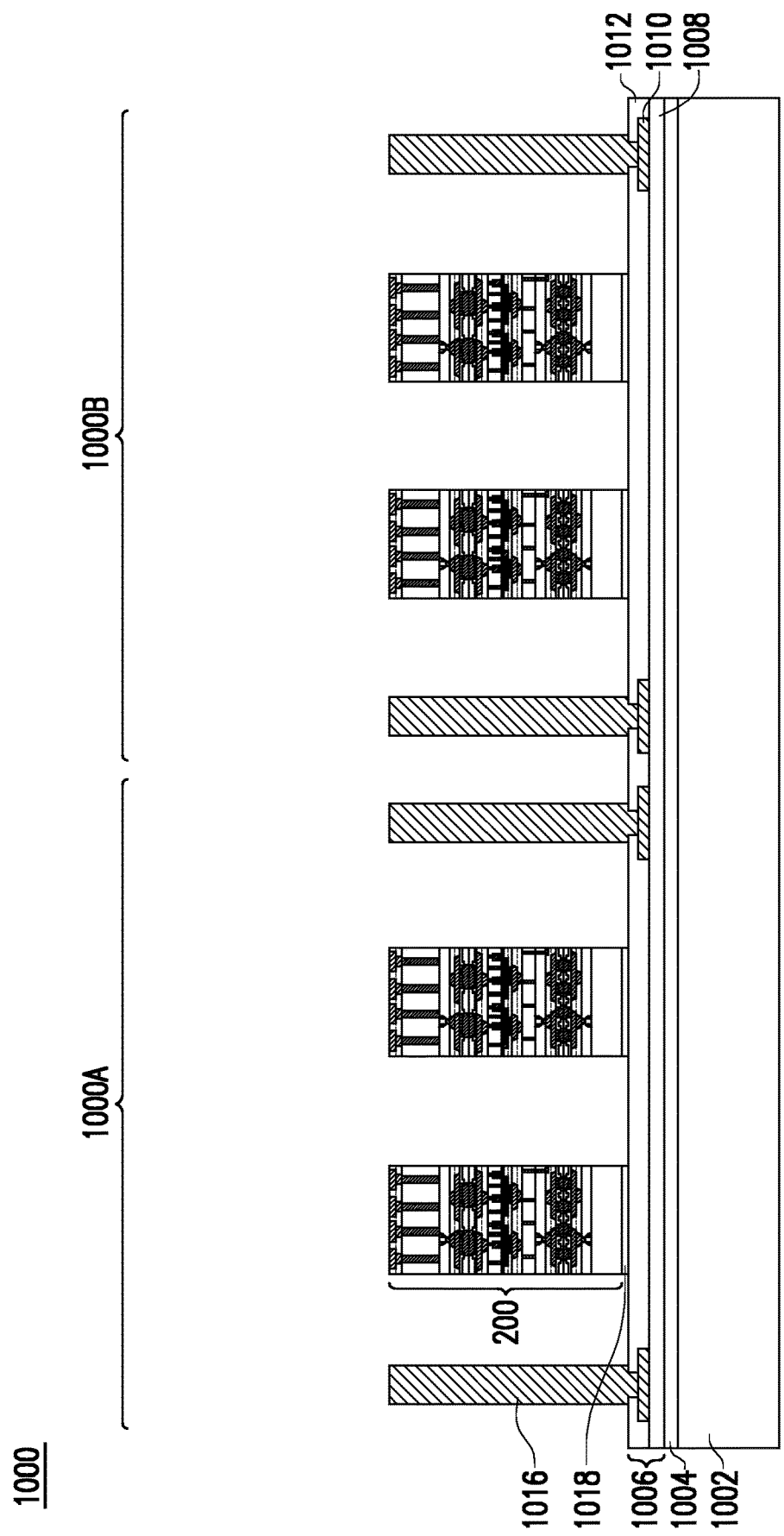

In FIG. 49, integrated circuit packages 200 are adhered to the dielectric layer 1012 by an adhesive 1018. A desired type and quantity of integrated circuit packages 200 are adhered in each of the package regions 1000A and 1000B. In the embodiment shown, multiple integrated circuit packages 200 are adhered adjacent one another. Although four integrated circuit packages 200 are illustrated, other integrated circuit packages such as integrated circuit packages 210, 300, 400, 500, 600, or a combination thereof may also be adhered to the dielectric layer 1012. In some embodiments, other suitable integrated circuit dies, device stacks, or other semiconductor packages may also be adhered to the dielectric layer 1012. Use of the back-side redistribution structure

1006 allows for an improved interconnect arrangement when the first package region 1000A and the second package region 1000B have limited space available for the through vias 1016.

The adhesive 1018 is on back-sides of the integrated circuit packages 200 and adheres the integrated circuit packages 200 to the back-side redistribution structure 1006, such as to the dielectric layer 1012. The adhesive 1018 may be any suitable adhesive, epoxy, die attach film (DAF), or the like. The adhesive 1018 may be applied to back-sides of the integrated circuit packages 200, may be applied over the surface of the carrier substrate 1002 if no back-side redistribution structure 1006 is utilized, or may be applied to an upper surface of the back-side redistribution structure 1006 if applicable. For example, the adhesive 1018 may be applied to the back-sides of the integrated circuit packages 200 before singulating to separate the integrated circuit packages 200.

Figure 50:
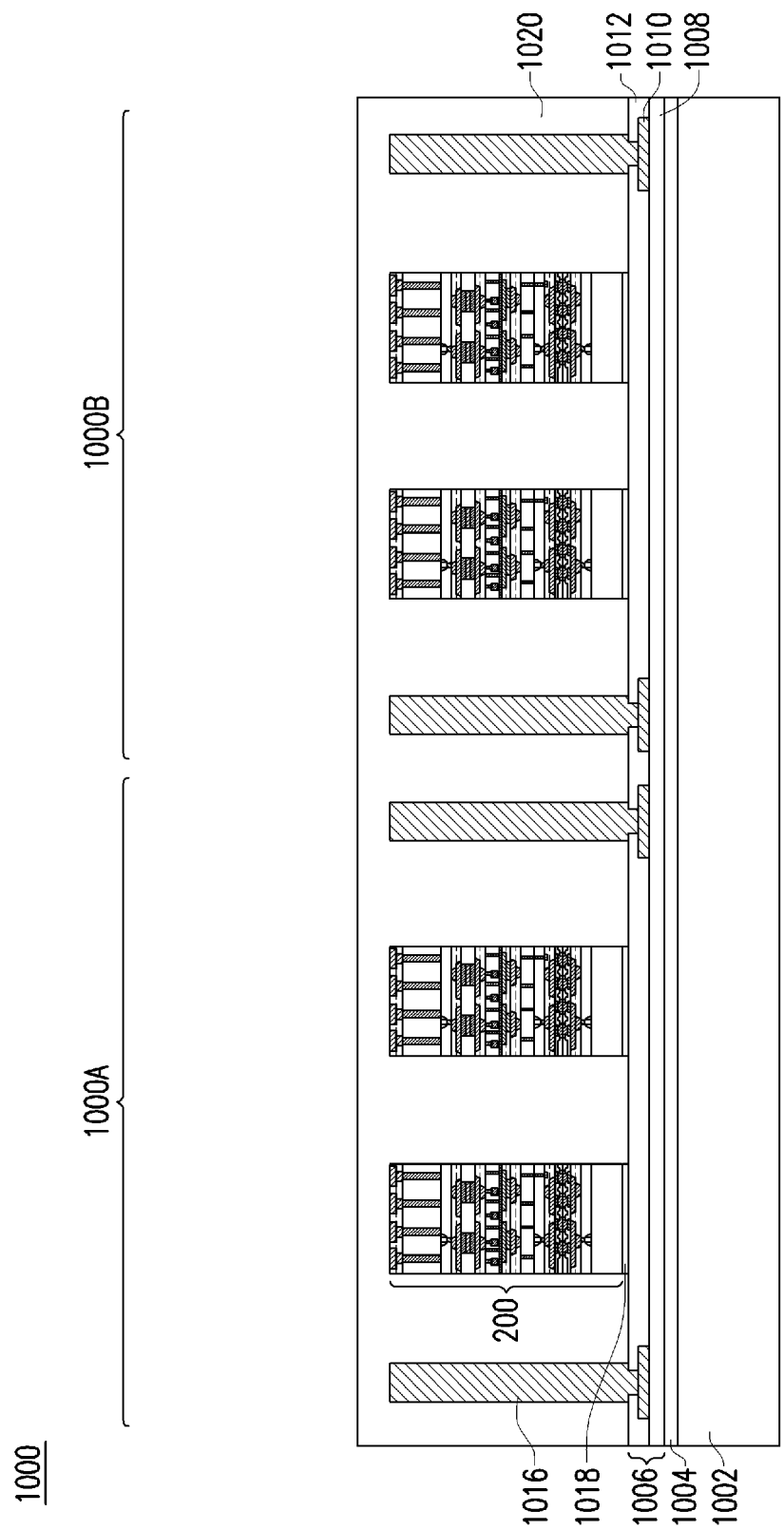

In FIG. 50, an encapsulant 1020 is formed on and around the various components. After formation, the encapsulant 1020 encapsulates the through vias 1016 and integrated circuit packages 200. The encapsulant 1020 may be a molding compound, epoxy, or the like. The encapsulant 1020 may be applied by compression molding, transfer molding, or the like, and may be formed over the carrier substrate 1002 such that the through vias 1016 and/or the integrated circuit packages 200 are buried or covered. The encapsulant 1020 is further formed in gap regions between the integrated circuit packages 200. The encapsulant 1020 may be applied in liquid or semi-liquid form and then subsequently cured.

Figure 51:
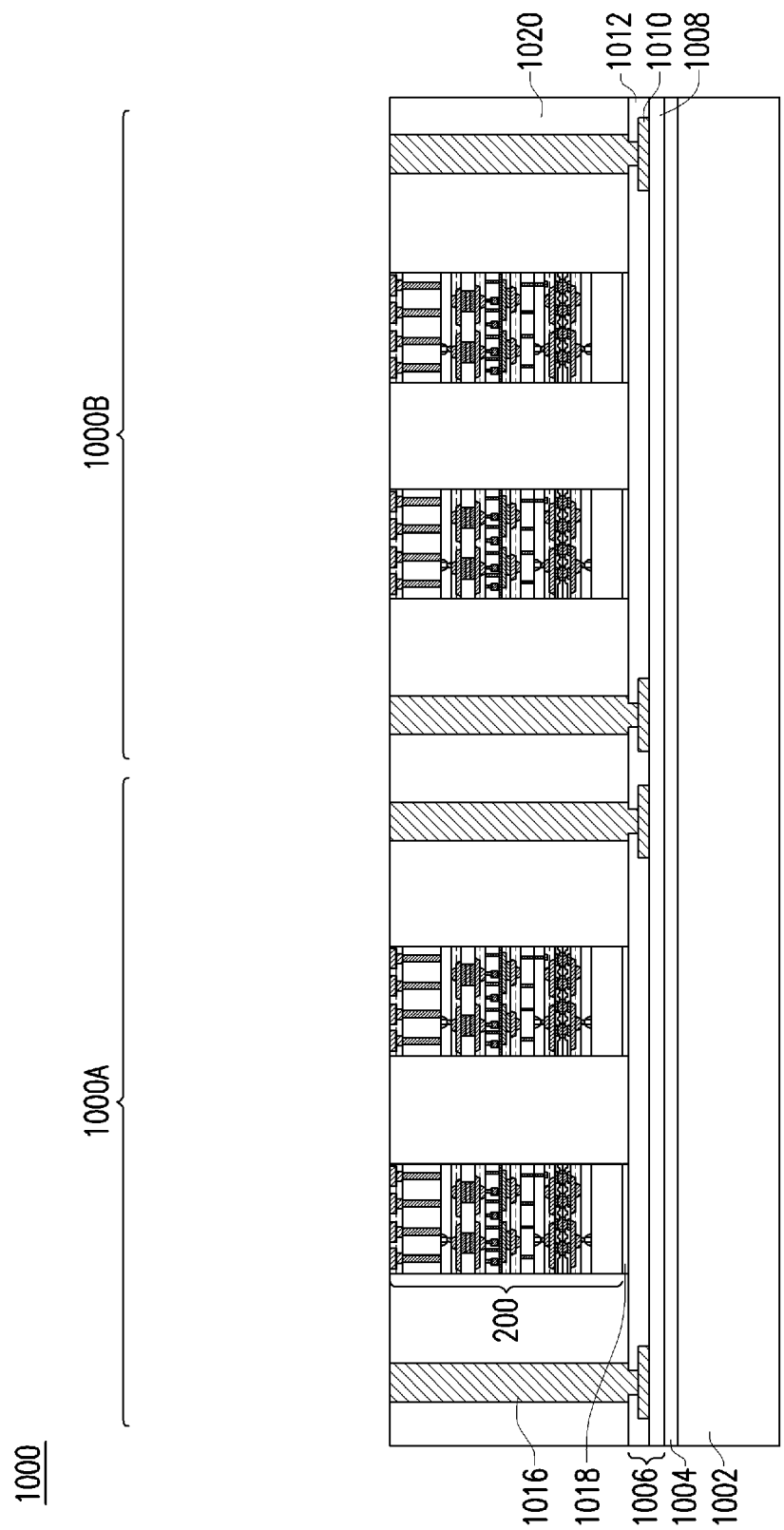

In FIG. 51, a planarization process is performed on the encapsulant 1020 to expose the through vias 1016 and the contact pads 193 of the integrated circuit packages 200. The planarization process may also remove material of the through vias 1016, interconnect structure 190, and/or contact pads 193 until the contact pads 193 and through vias 1016 are exposed. Top surfaces of the through vias 1016, interconnect structure 190, contact pads 193, and encapsulant 1020 are substantially coplanar after the planarization process within process variations. The planarization process may be, for example, a chemical-mechanical polish (CMP), a grinding process, or the like. In some embodiments, the planarization may be omitted, for example, if the through vias 1016 and/or contact pads 193 are already exposed.

In FIGS. 52 through 55, a front-side redistribution structure 1022 (see FIG. 54) is formed over the encapsulant 1020, through vias 1016, and integrated circuit packages 200. The front-side redistribution structure 1022 includes dielectric layers 1024, 1028, 1032, and 1036; and metallization patterns 1026, 1030, and 1034. The metallization patterns may also be referred to as redistribution layers or redistribution lines. The front-side redistribution structure 1022 is shown as an example having three layers of metallization patterns. More or fewer dielectric layers and metallization patterns may be formed in the front-side redistribution structure 1022. If fewer dielectric layers and metallization patterns are to be formed, steps and process discussed below may be omitted. If more dielectric layers and metallization patterns are to be formed, steps and processes discussed below may be repeated.

Figure 52:
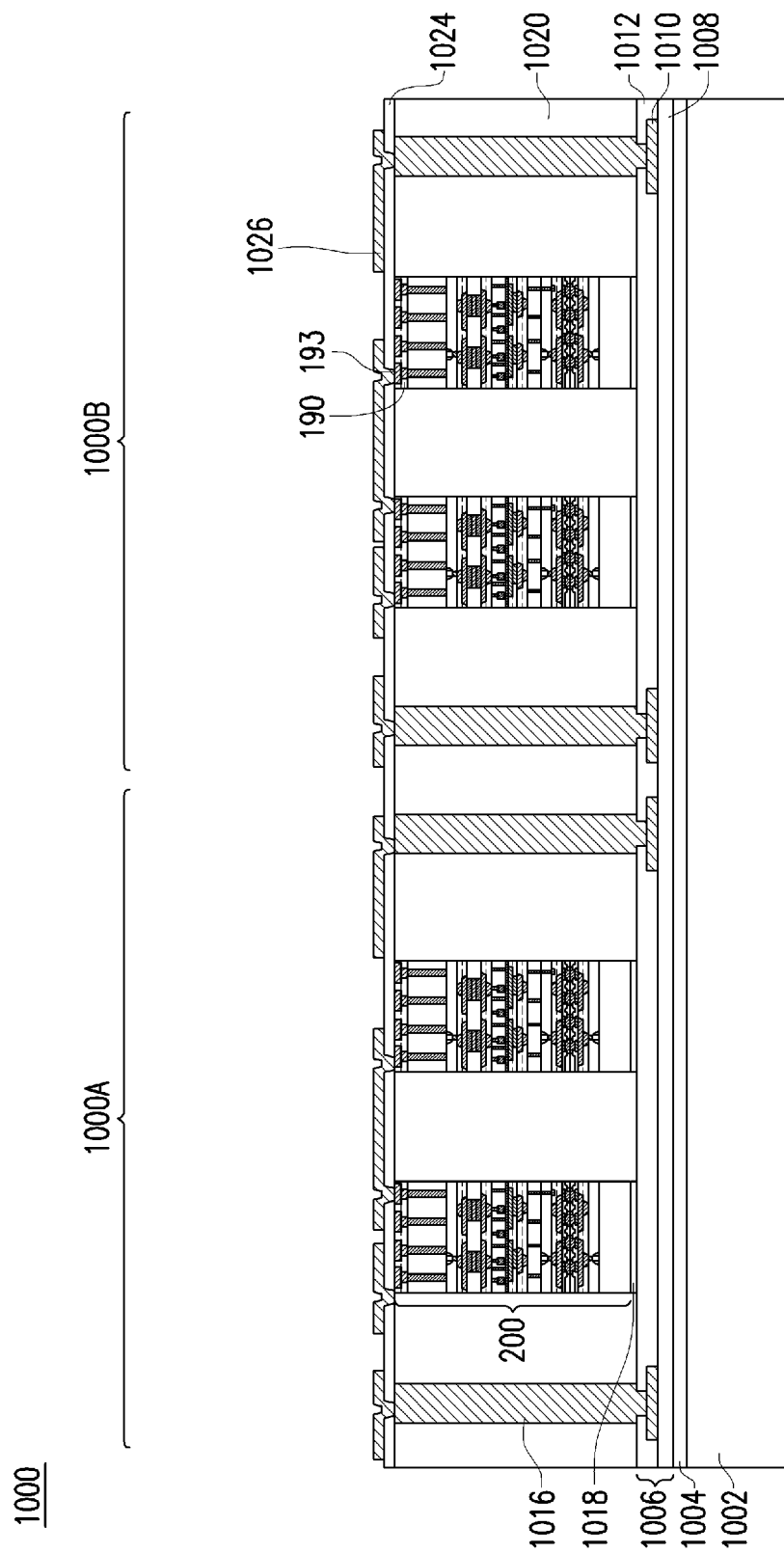

In FIG. 52, the dielectric layer 1024 is deposited on the encapsulant 1020, through vias 1016, and integrated circuit packages 200. In some embodiments, the dielectric layer 1024 is formed of a photo-sensitive material such as PBO, polyimide, BCB, or the like, which may be patterned using a lithography mask. The dielectric layer 1024 may be formed by spin coating, lamination, CVD, the like, or a combination thereof. The dielectric layer 1024 is then patterned. The patterning forms openings exposing portions of the through vias 1016 and the contact pads 193. The patterning may be by an acceptable process, such as by exposing and developing the dielectric layer 1024 to light when the dielectric layer 1024 is a photo-sensitive material or by etching using, for example, an anisotropic etch.

The metallization pattern 1026 is then formed. The metallization pattern 1026 includes conductive elements extending along the major surface of the dielectric layer 1024 and extending through the dielectric layer 1024 to physically and electrically couple to the through vias 1016 and the contact pads 193 of the integrated circuit packages 200. As an example to form the metallization pattern 1026, a seed layer is formed over the dielectric layer 1024 and in the openings extending through the dielectric layer 1024. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 1026. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 1026. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 53:
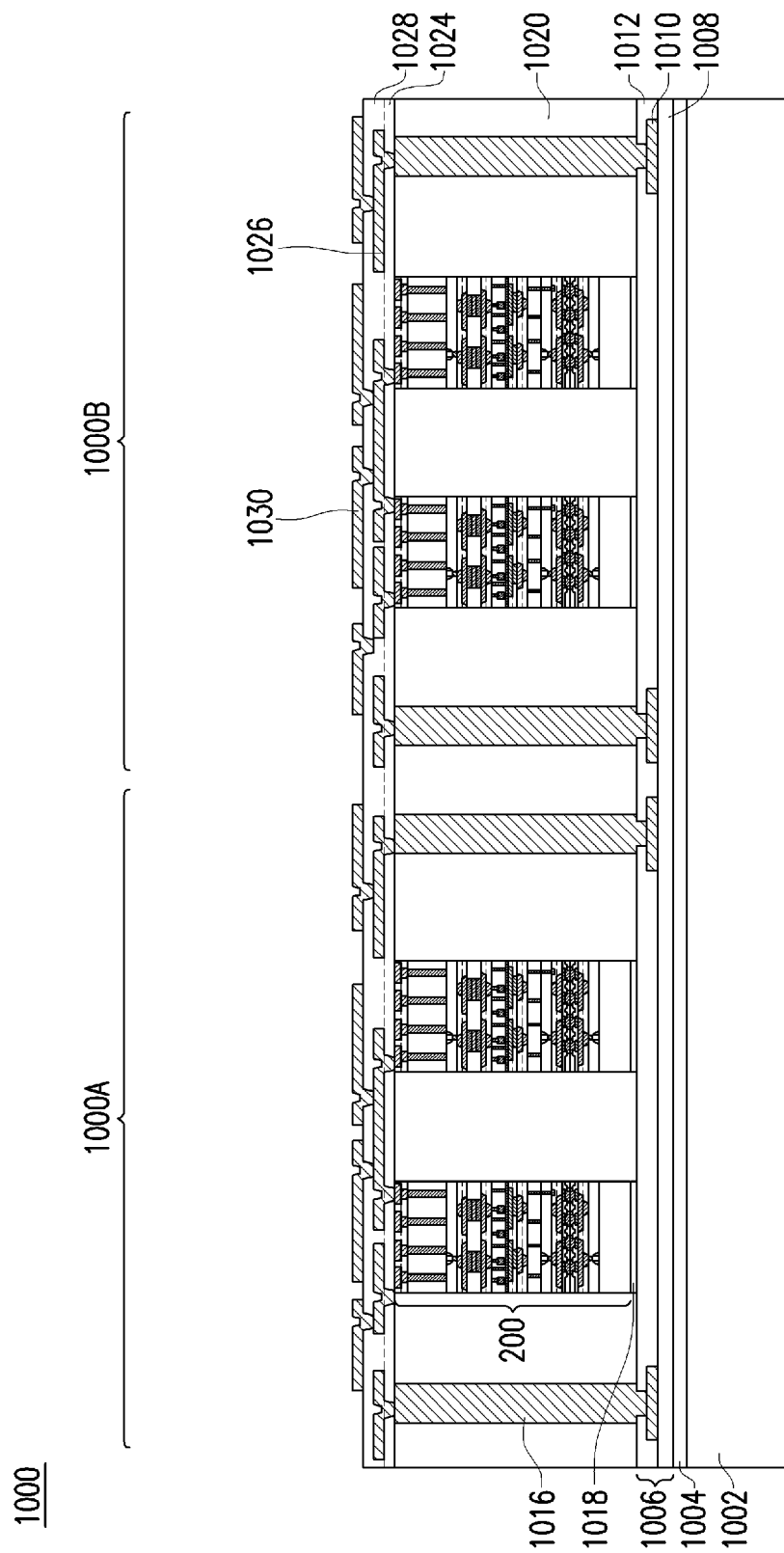

In FIG. 53, the dielectric layer 1028 is deposited on the metallization pattern 1026 and the dielectric layer 1024. The dielectric layer 1028 may be formed in a manner similar to the dielectric layer 1024, and may be formed of a similar material as the dielectric layer 1024.

The metallization pattern 1030 is then formed. The metallization pattern 1030 includes portions on and extending along the major surface of the dielectric layer 1028. The metallization pattern 1030 further includes portions extending through the dielectric layer 1028 to physically and electrically couple to the metallization pattern 1026. The metallization pattern 1030 may be formed in a similar manner and of a similar material as the metallization pattern 1026. In some embodiments, the metallization pattern 1030 has a different size than the metallization pattern 1026. For example, the conductive lines and/or vias of the metallization pattern 1030 may be wider or thicker than the conductive lines and/or vias of the metallization pattern 1026. Further, the metallization pattern 1030 may be formed to a greater pitch than the metallization pattern 1026.

Figure 54:
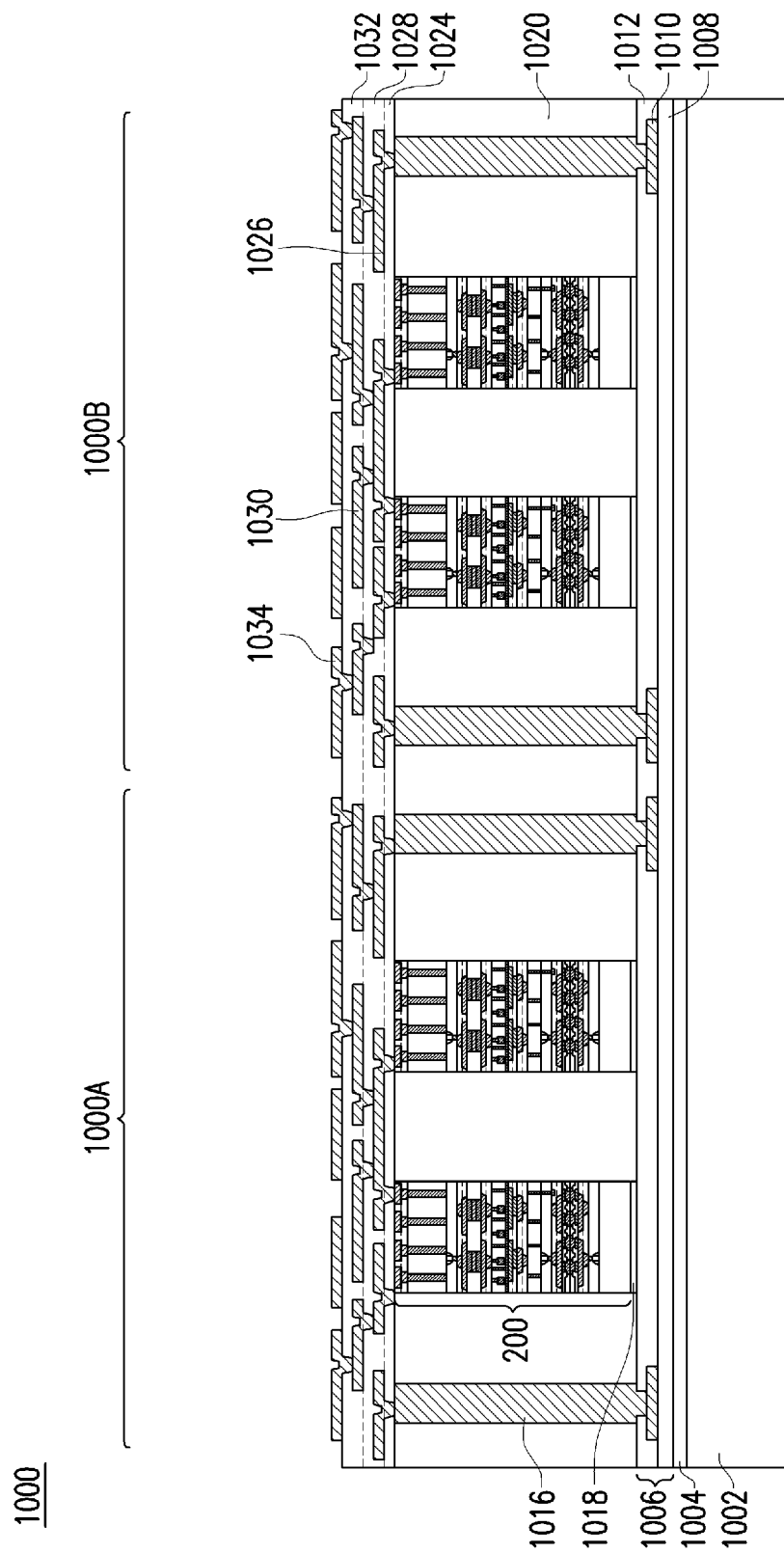

In FIG. 54, the dielectric layer 1032 is deposited on the metallization pattern 1030 and the dielectric layer 1028. The dielectric layer 1032 may be formed in a manner similar to the dielectric layer 1024, and may be formed of a similar material as the dielectric layer 1024.

The metallization pattern 1034 is then formed. The metallization pattern 1034 includes portions on and extending along the major surface of the dielectric layer 1032. The metallization pattern 1034 further includes portions extending through the dielectric layer 1032 to physically and electrically couple to the metallization pattern 1030. The metallization pattern 1034 may be formed in a similar manner and of a similar material as the metallization pattern 1026. The metallization pattern 1034 is the topmost metallization pattern of the front-side redistribution structure 1022. As such, all of the intermediate metallization patterns of the front-side redistribution structure 1022 (e.g., the metallization patterns 1026 and 1030) are disposed between the metallization pattern 1034 and the integrated circuit packages 200. In some embodiments, the metallization pattern 1034 has a different size than the metallization patterns 1026 and 1030. For example, the conductive lines and/or vias of the metallization pattern 1034 may be wider or thicker than the conductive lines and/or vias of the metallization patterns 1026 and 1030. Further, the metallization pattern 1034 may be formed to a greater pitch than the metallization pattern 1030.

Figure 55:
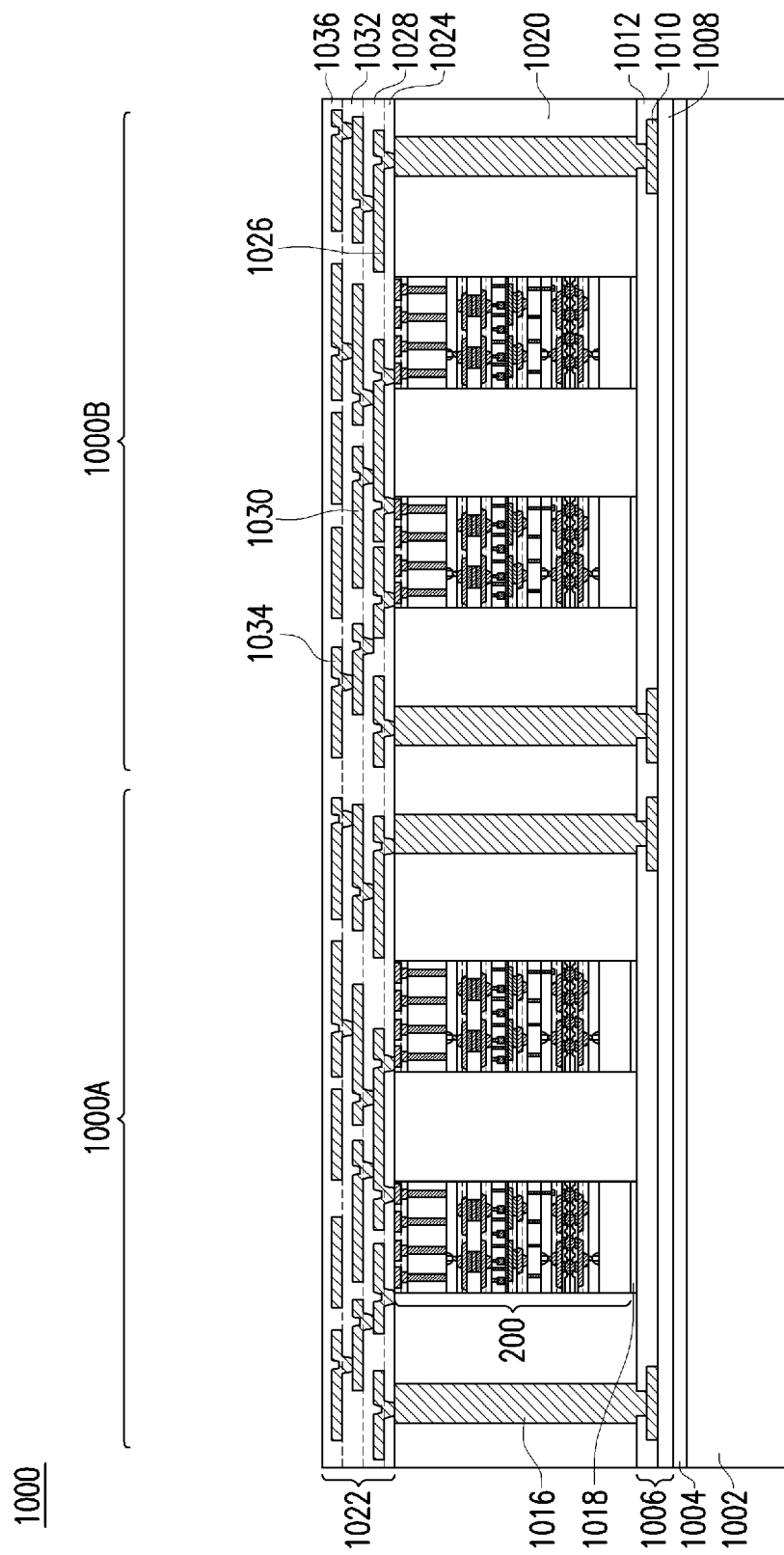

In FIG. 55, the dielectric layer 1036 is deposited on the metallization pattern 1034 and the dielectric layer 1032. The dielectric layer 1036 may be formed in a manner similar to the dielectric layer 1024, and may be formed of the same material as the dielectric layer 1024. The dielectric layer 1036 is the topmost dielectric layer of the front-side redistribution structure 1022. As such, all of the metallization patterns of the front-side redistribution structure 1022 (e.g., the metallization patterns 1026, 1030, and 1034) are disposed between the dielectric layer 1036 and the integrated circuit packages 200. Further, all of the intermediate dielectric layers of the front-side redistribution structure 1022 (e.g., the dielectric layers 1024, 1028, 1032) are disposed between the dielectric layer 1036 and the integrated circuit packages 200.

Figure 56:
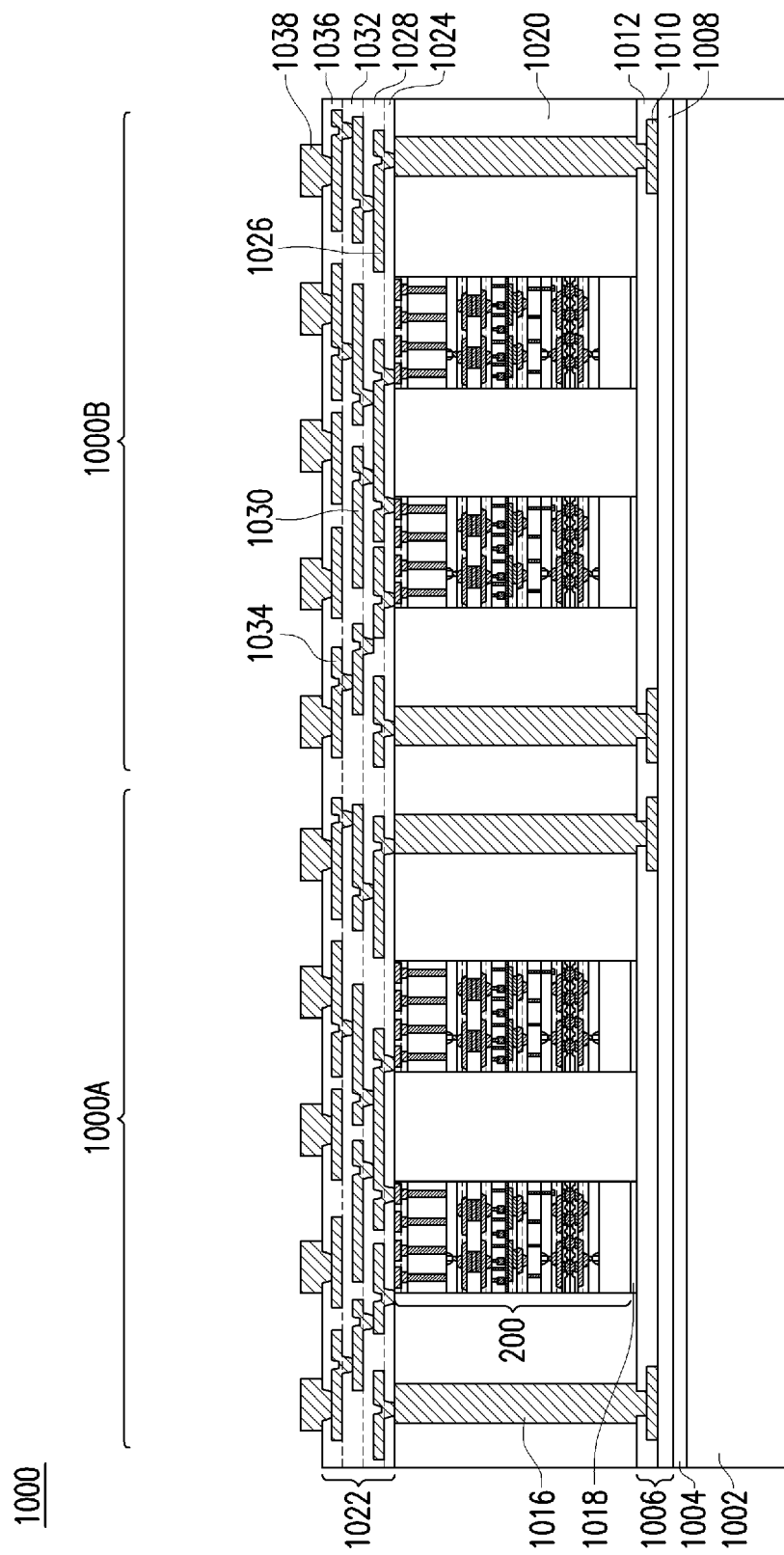

In FIG. 56, UBMs 1038 are formed for external connection to the front-side redistribution structure 1022. The UBMs 1038 have bump portions on and extending along the major surface of the dielectric layer 1036, and have via portions extending through the dielectric layer 1036 to physically and electrically couple to the metallization pattern 1034. As a result, the UBMs 1038 are electrically coupled to the through vias 1016 and the integrated circuit packages 200. The UBMs 1038 may be formed of the same material as the metallization pattern 1026. In some embodiments, the UBMs 1038 have a different size than the metallization patterns 1026, 1030, and 1034.

Figure 57:
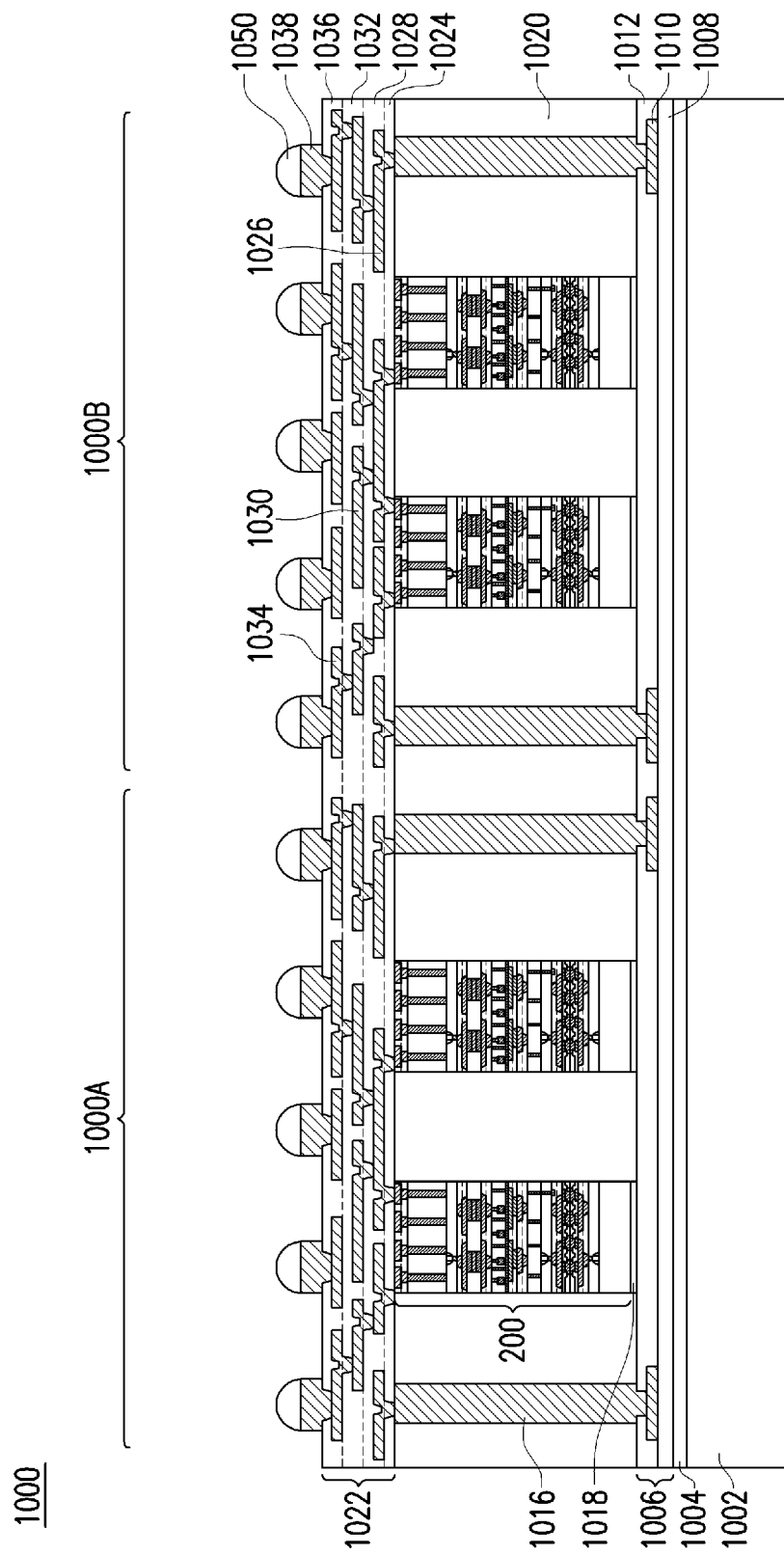

In FIG. 57, conductive connectors 1050 are formed on the UBMs 1038. The conductive connectors 1050 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 1050 may include a conductive material such as solder, copper, aluminum, gold, nickel, silver, palladium, tin, the like, or a combination thereof. In some embodiments, the conductive connectors 1050 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 1050 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 58:
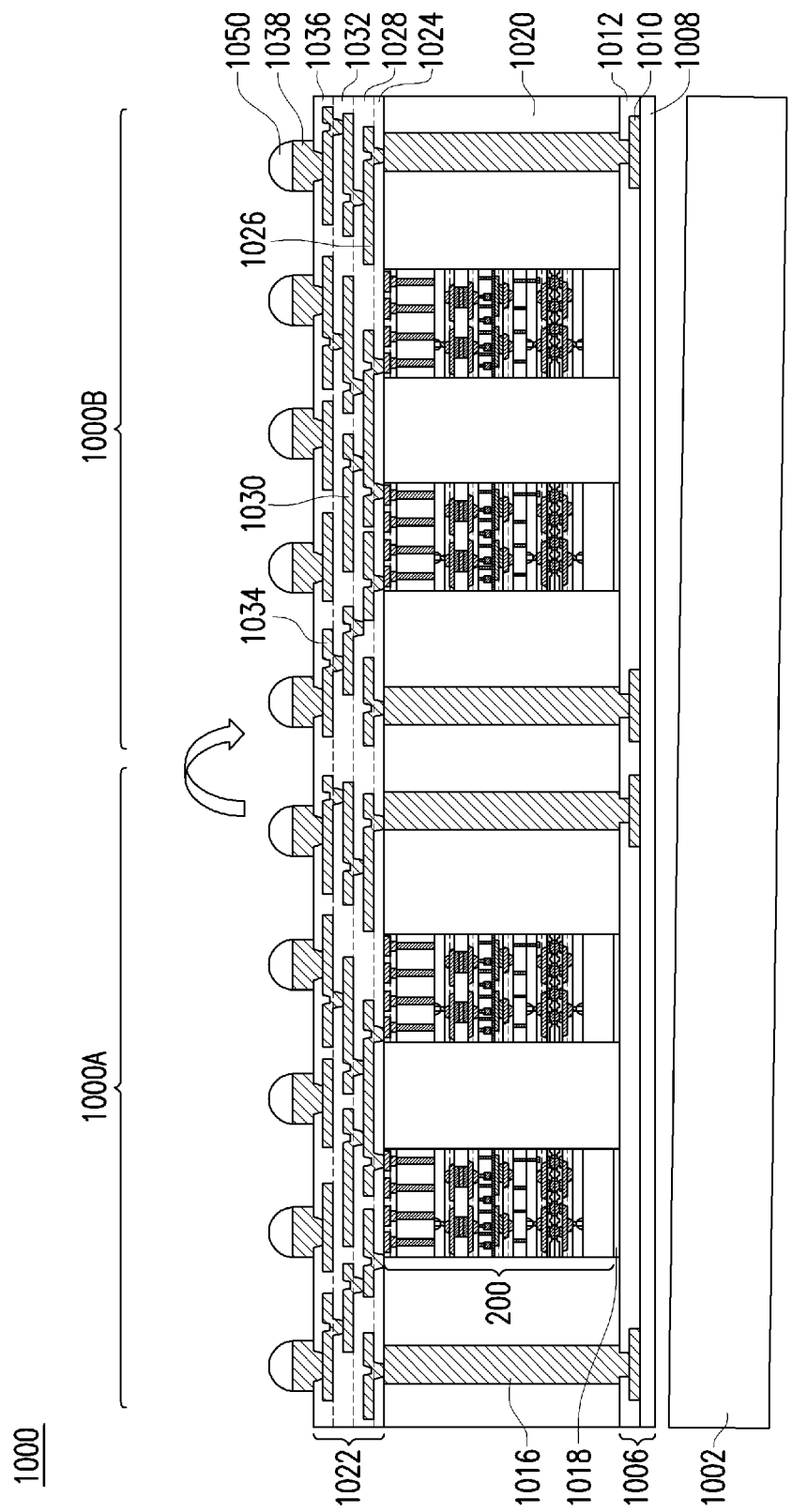

In FIG. 58, a carrier substrate de-bonding is performed to detach (or "de-bond") the carrier substrate 1002 from the back-side redistribution structure 1006, e.g., the dielectric layer 1008. In accordance with some embodiments, the de-bonding includes projecting a light such as a laser light or an UV light on the release layer 1004 so that the release layer 1004 decomposes under the heat of the light and the carrier substrate 1002 can be removed. The structure is then flipped over and placed on a tape (not shown).

Figure 59:
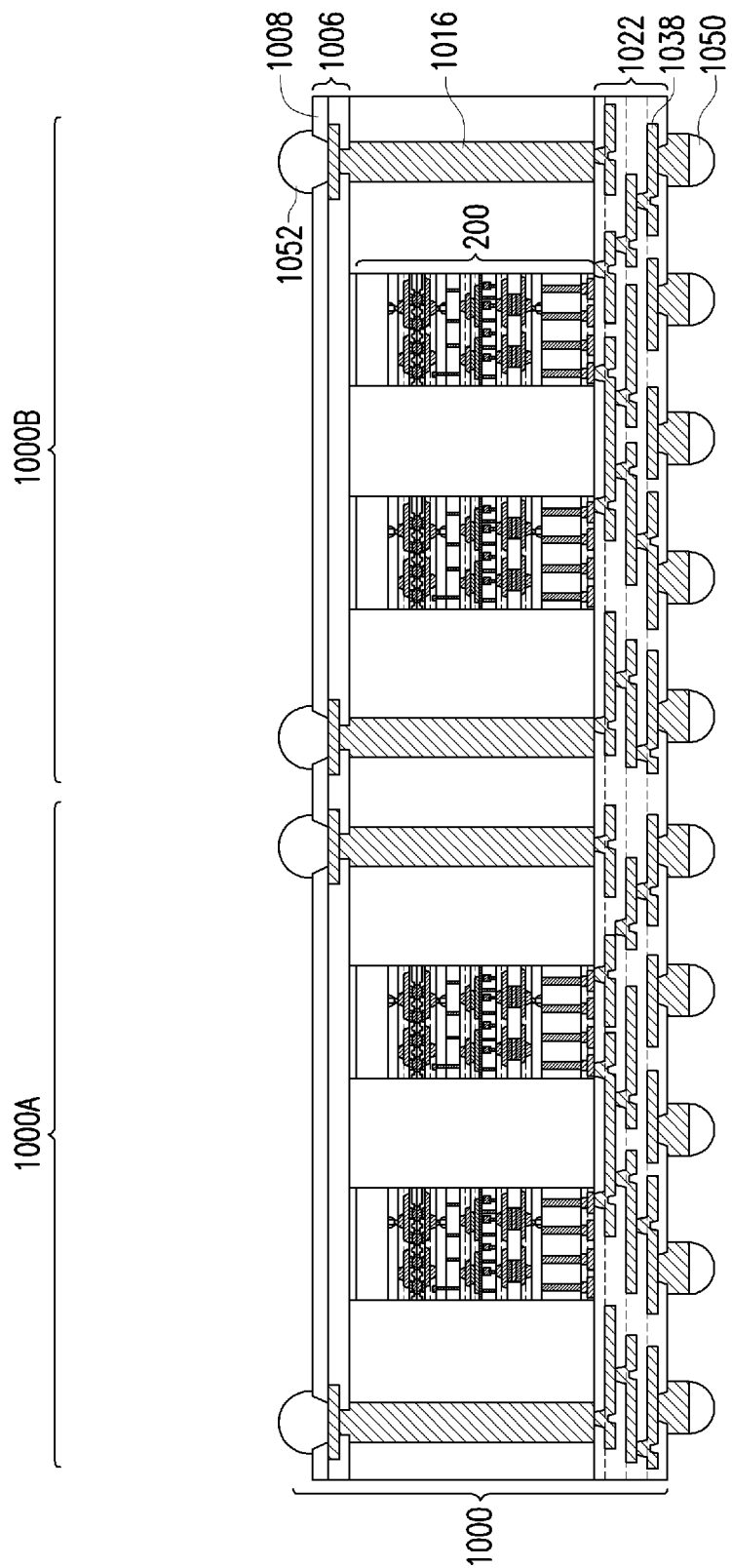

In FIG. 59, conductive connectors 1052 are formed extending through the dielectric layer 1008 to contact the metallization pattern 1010. Openings are formed through the dielectric layer 1008 to expose portions of the metallization pattern 1010. The openings may be formed, for example, using laser drilling, etching, or the like. The conductive connectors 1052 are formed in the openings. In some embodiments, the conductive connectors 1052 comprise flux and are formed in a flux dipping process. In some embodiments, the conductive connectors 1052 comprise a conductive paste such as solder paste, silver paste, or the like, and are dispensed in a printing process. In some embodiments, the conductive connectors 1052 are formed in a manner similar to the conductive connectors 1050, and may be formed of a similar material as the conductive connectors 1050.

FIGS. 60, 61A, 61B, and 62 illustrate additional processing that may be performed using the first package component 1000 of FIG. 59, in accordance with some embodiments. The device stacks may also be referred to as package-on-package (PoP) structures.

Figure 60:
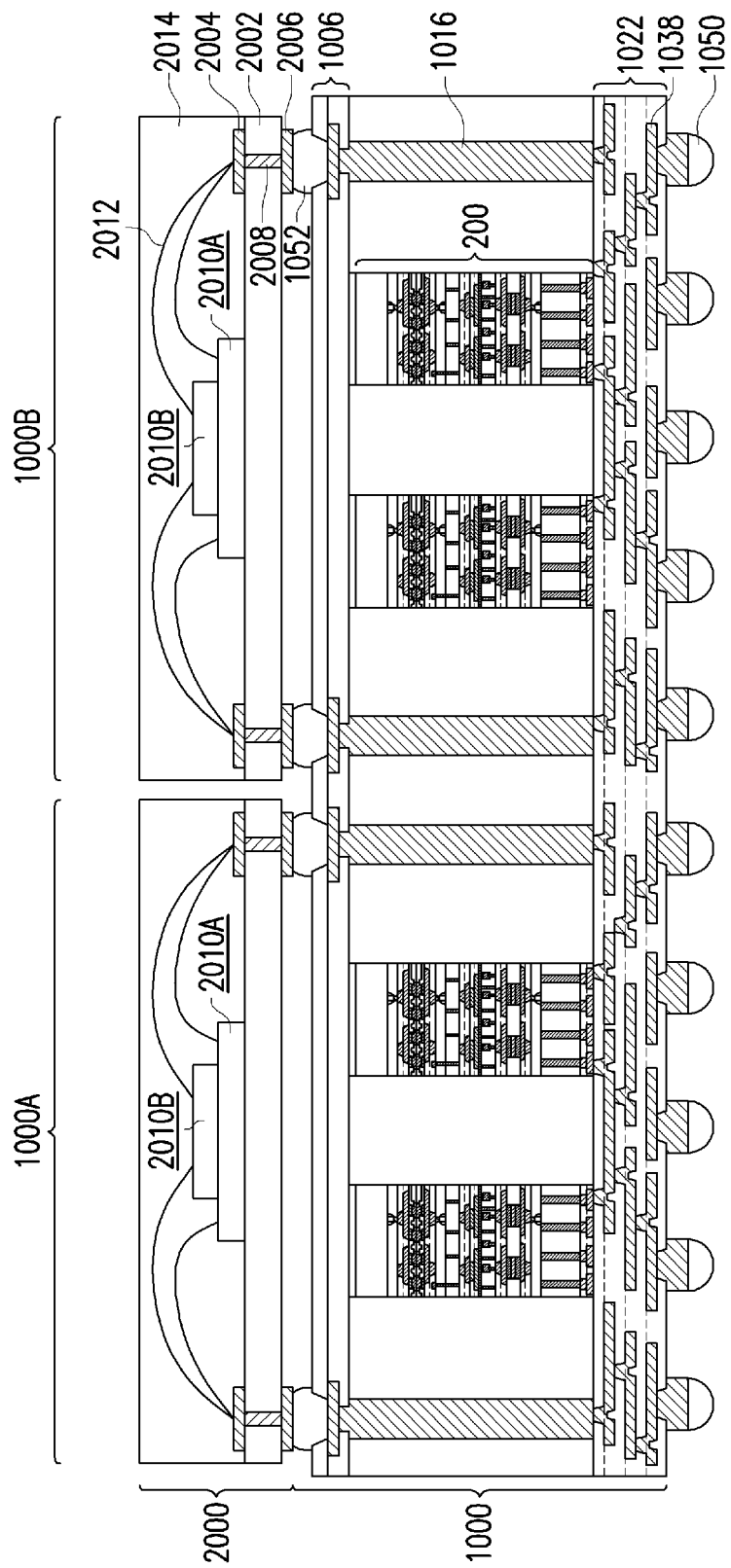
FIGS. 60, 61A, 61B, and 62 illustrate cross-sectional views of formation and implementation of device stacks in accordance with some embodiments.

In FIG. 60, second package components 2000 are coupled to the first package component 1000. One of the second package components 2000 is coupled in each of the package regions 1000A and 1000B to form an integrated circuit device stack in each region of the first package component 1000.

Each of the second package components 2000 include, for example, a substrate 2002 and one or more stacked dies 2010 (e.g., 2010A and 2010B) coupled to the substrate 2002. Although one set of stacked dies 2010 (2010A and 2010B) coupled to each of the substrates 2002 is illustrated, in other embodiments, a plurality of stacked dies 2010 (each having one or more stacked dies) may be disposed side-by-side coupled to a same surface of the substrate 2002. The substrate 2002 may be made of a semiconductor material such as organic substrate, silicon, germanium, diamond, or the like, and may include active or passive devices (not shown). The substrate 2002 may have bond pads 2004 on a first side of the substrate 2002 to couple to the stacked dies 2010, and bond pads 2006 on a second side of the substrate 2002, the second side being opposite the first side of the substrate 2002, to couple to the conductive connectors 1052. In some embodiments, the conductive material of the bond pads 2004 and 2006 is copper, tungsten, aluminum, silver, gold, the like, or a combination thereof. In some embodiments, the conductive vias 2008 extend through the substrate 2002 and couple at least one of the bond pads 2004 to at least one of the bond pads 2006. In the illustrated embodiment, the stacked dies 2010 are coupled to the substrate 2002 by wire bonds 2012, although other connections may be used, such as conductive bumps. In an embodiment, the stacked dies 2010 are stacked memory dies. The stacked dies 2010 and the wire bonds 2012 may be encapsulated by a molding material 2014 such as a molding compound, a polymer, an epoxy, silicon oxide filler material, the like, or a combination thereof.

After the second package components 2000 are formed, the second package components 2000 are mechanically and electrically bonded to the first package component 1000 by way of the conductive connectors 1052, the bond pads 2006, and a metallization pattern of the back-side redistribution structure 1006. In some embodiments, the stacked dies 2010 may be coupled to the integrated circuit packages 200 through the wire bonds 2012, the bond pads 2004 and 2006, the conductive vias 2008, the conductive connectors 1052, the back-side redistribution structure 1006, the through vias 1016, and the front-side redistribution structure 1022.

Figure 61A:
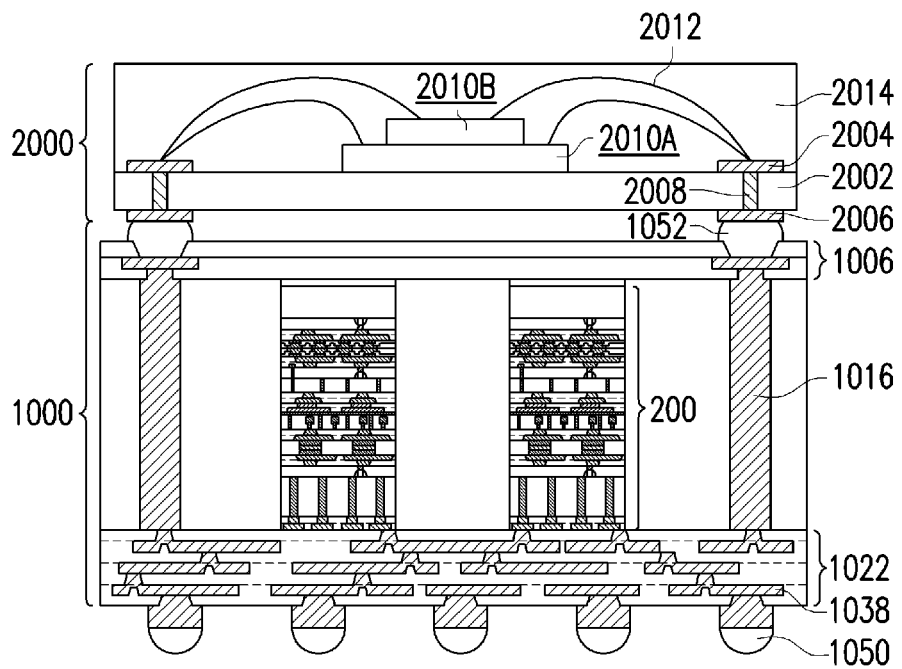

In FIG. 61A, a singulation process is performed by sawing along scribe line regions, e.g., between the first package region 1000A and the second package region 1000B. The sawing singulates the first package region 1000A from the second package region 1000B. The resulting, singulated device stack is from one of the first package region 1000A or the second package region 1000B. In some embodiments, the singulation process is performed after the second package components 2000 are coupled to the first package component 1000. In other embodiments (not shown), the singulation process is performed before the second package components 2000 are coupled to the first package component 1000, such as after the carrier substrate 1002 is de-bonded and the conductive connectors 1052 are formed.

Figure 61B:
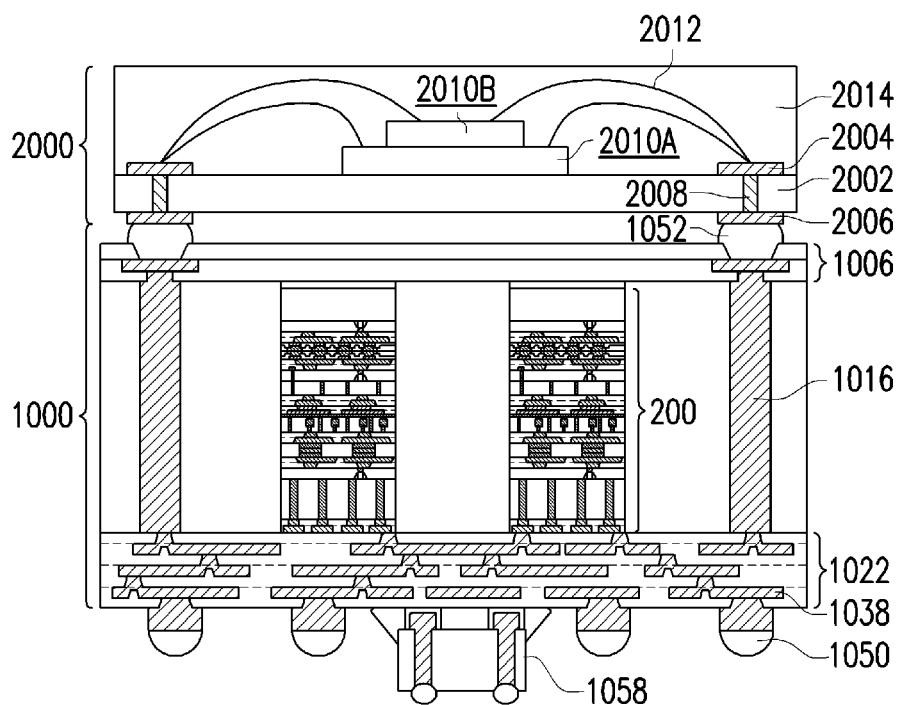

FIG. 61B illustrates an integrated passive device (IPD) or surface mount device (SMD) 1058 bonded to the front-side redistribution structure 1022, in accordance with some embodiments. The SMD 1058 may be a capacitor die, a resistor die, an inductor die, or the like.

Figure 62:
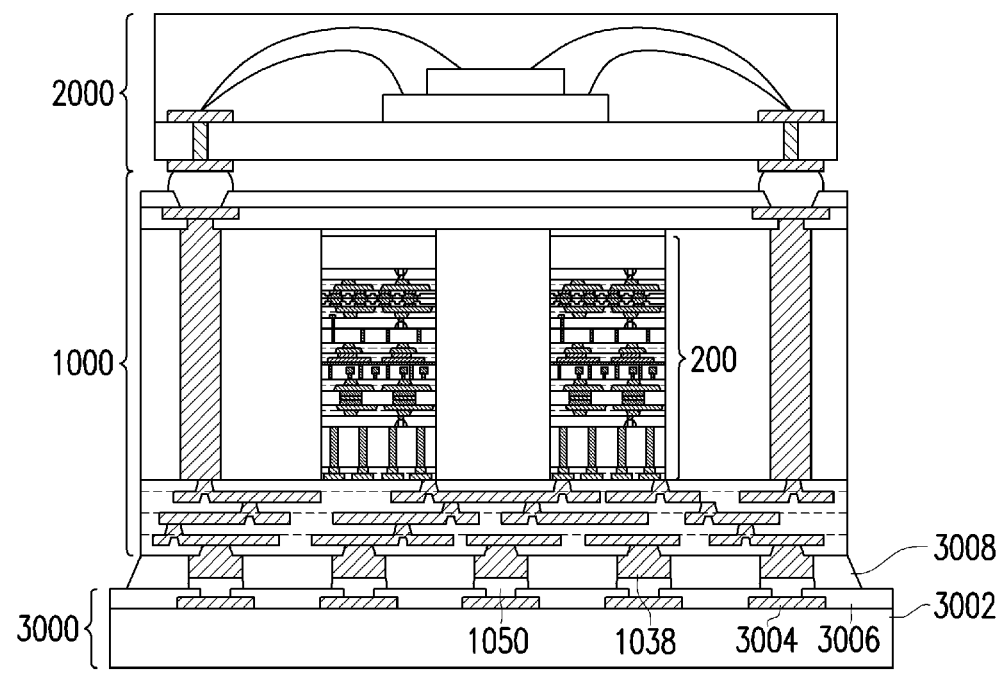

In FIG. 62, each singulated first package component 1000 is mounted to a package substrate 3000 using the conductive connectors 1050. The package substrate 3000 includes a substrate core 3002 and bond pads 3004 over the substrate core 3002. The substrate core 3002 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 3002 may be an SOI substrate. Generally, an SOI substrate includes a layer of a semiconductor material such as epitaxial silicon, germanium, silicon germanium, SOI, SGOI, or combinations thereof. The substrate core 3002 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 3002.

The substrate core 3002 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 3002 may also include metallization layers and vias (not shown), with the bond pads 3004 being physically and/or electrically coupled to the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate core 3002 is substantially free of active and passive devices.

In some embodiments, the conductive connectors 1050 are reflowed to attach the first package component 1000 to the bond pads 3004. The conductive connectors 1050 electrically and/or physically couple the package substrate 3000, including metallization layers in the substrate core 3002, to the first package component 1000. In some embodiments, a solder resist 3006 is formed on the substrate core 3002. The conductive connectors 1050 may be disposed in openings in the solder resist 3006 to be electrically and mechanically coupled to the bond pads 3004. The solder resist 3006 may be used to protect areas of the substrate 3002 from external damage.

The conductive connectors 1050 may have an epoxy flux (not shown) formed thereon before they are reflowed with at least some of the epoxy portion of the epoxy flux remaining after the first package component 1000 is attached to the package substrate 3000. This remaining epoxy portion may act as an underfill to reduce stress and protect the joints resulting from reflowing the conductive connectors 1050. In some embodiments, an underfill 3008 may be formed between the first package component 1000 and the package substrate 3000 and surrounding the conductive connectors 1050. The underfill 3008 may be formed by a capillary flow process after the first package component 1000 is attached or may be formed by a suitable deposition method before the first package component 1000 is attached.

In some embodiments, passive devices (e.g., surface mount devices (SMDs) 1058, shown above in FIG. 61A) may also be attached to the first package component 1000 (e.g., to the UBMs 1038) or to the package substrate 3000 (e.g., to the bond pads 3004). For example, the passive devices may be bonded to a same surface of the first package component 1000 or the package substrate 3000 as the conductive connectors 1050. The passive devices may be attached to the package component 1000 prior to mounting the first package component 1000 on the package substrate 3000, or may be attached to the package substrate 3000 prior to or after mounting the first package component 1000 on the package substrate 3000.

The first package component 1000 may be implemented in other device stacks. For example, a PoP structure is shown, but the first package component 1000 may also be implemented in a Flip Chip Ball Grid Array (FCBGA) package. In such embodiments, the first package component 1000 is mounted to a substrate such as the package substrate 3000, but the second package component 2000 is omitted. Instead, a lid or heat spreader may be attached to the first package component 1000. When the second package component 2000 is omitted, the back-side redistribution structure 1006 and through vias 1016 may also be omitted.

Figure 63:
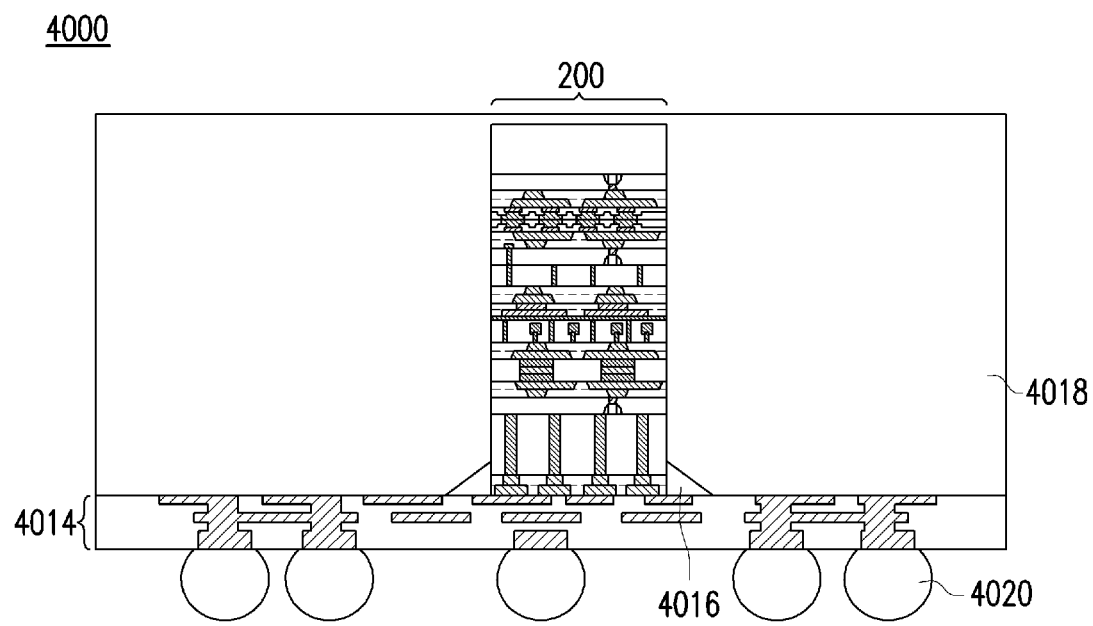
FIGS. 63 through 65 illustrate cross-sectional views of packages in accordance with some embodiments.

FIG. 63 illustrates a flip-chip chip-level package (FCCSP) 4000, which includes the integrated circuit package 200 discussed above with reference to FIG. 19A bonded to a package component 4014. Package component 4014 may be formed of or comprise an interconnect structure comprising redistribution layers, a package substrate, an interposer, a printed circuit board, or the like. The bonding may include hybrid bonding, solder (flip-chip) bonding, metal-to-metal direct bonding, or the like. An underfill 4016 may be dispensed in the gap between the integrated circuit package 200 and the package component 4014. An encapsulant 4018 may further be dispensed to encapsulate the integrated circuit package 200. External connectors 4020, such as BGA connectors, may be coupled to conductive features of the package component 4014.

Figure 64:
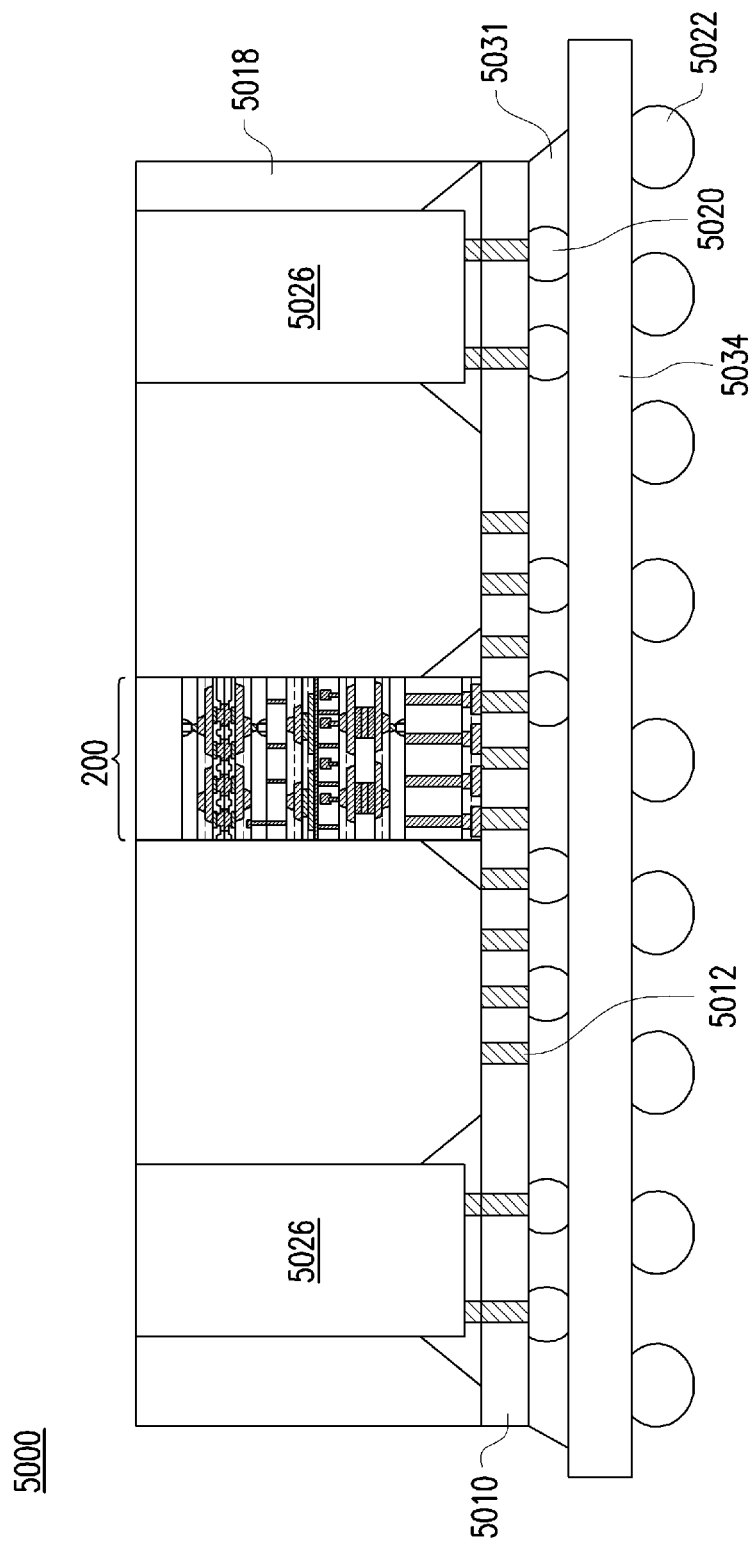

FIG. 64 illustrates a Chip-on-Wafer-on-Substrate (CoWoS) structure 5000, which includes the integrated circuit package 200 bonding to a package component 5010. Package component 5010 may be an interposer chip, a device chip, or the like. Through vias 5012 are formed in package component 5010, and penetrate through the substrate of package component 5010. Package component 5010 is further bonded to package component 5034, which may be a package substrate, a printed circuit board, or the like. Through vias 5012 may be coupled to conductive features of package component 5034 by connectors 5020, such as controlled collapse chip connection (C4) bumps. In accordance with some embodiments, package components 5026, which may be device chips, stacked device chips, dummy silicon, packages, memory cubes, or the like, are further bonded to package component 5010, and are electrically connected to integrated circuit package 200, for example, through the redistribution lines in package component 5010. Underfill 5031 and encapsulant 5018 are further dispensed. External connectors 5022, such as BGA connectors, may be coupled to conductive features of the package component 5034.

Figure 65:
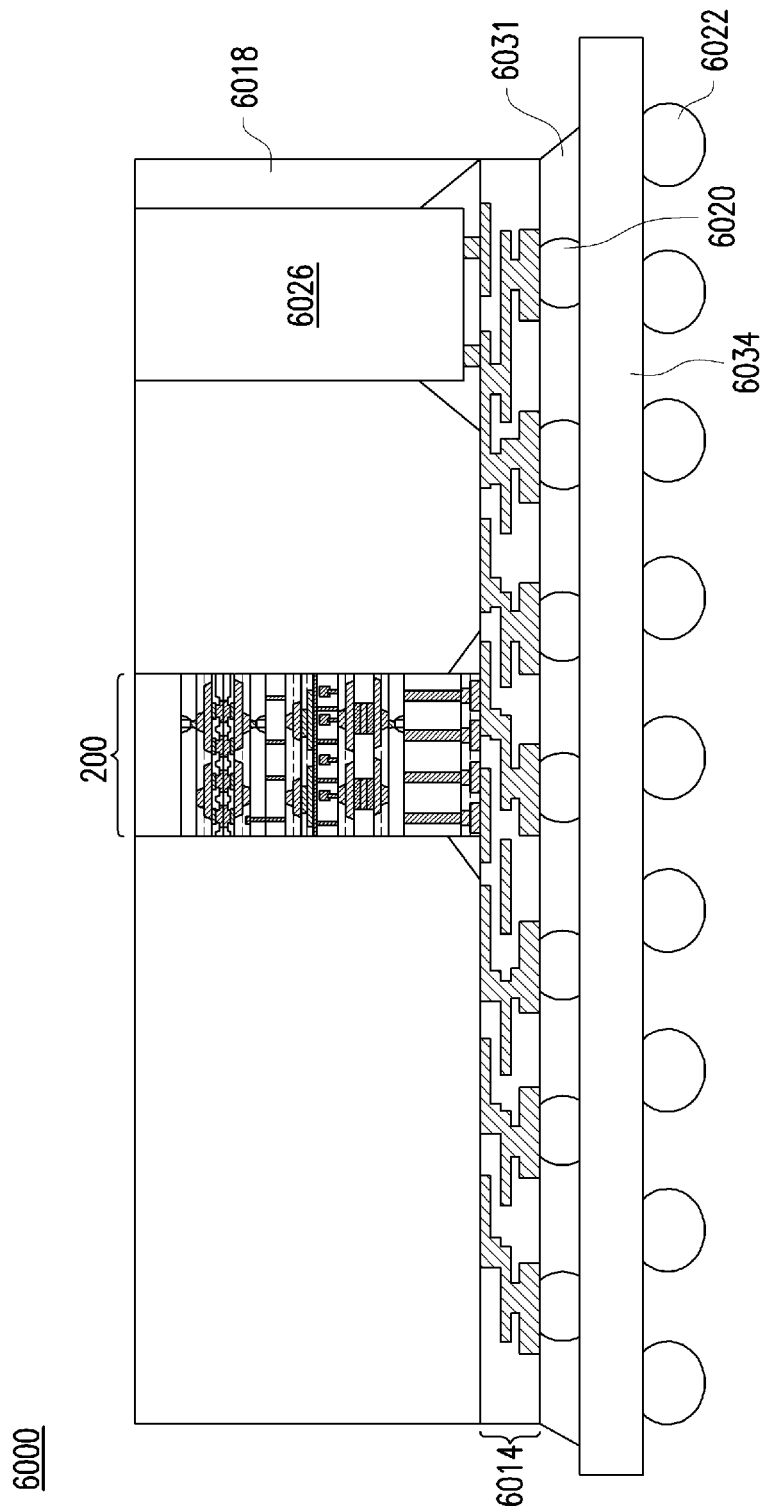

FIG. 65 illustrates a Chip-on-Wafer-on-Substrate (CoWoS) structure, in which the integrated circuit package 200 acts as a chip, and is electrically connected to a package component 6014. The package component 6014 may be an interposer wafer, hence the resulting structure is referred to as a Chip-on-Wafer (CoW) structure. In some embodiments, the package component 6014 may be formed of or comprise an interconnect structure comprising redistribution layers, a package substrate, an interposer, a printed circuit board, or the like. The resulting CoW structure is then sawed in to packages, and one of the packages is bonded to package substrate 6034. Conductive features of the package component 6014 such as conductive pads may be coupled to conductive features of package substrate 6034 by connectors 6020, such as controlled collapse chip connection (C4) bumps. Interposer 6014 may be free from active devices, and may be free from or include passive devices. Underfill 6031 is dispensed between interposer 6014 and substrate 6034. Furthermore, package component 6026, which may be a device chip, stacked chips, dummy silicon, a package, a memory cube, or the like, is bonded to package component 6014. Encapsulant 6018 encapsulates integrated circuit package 200 and package component 6026 therein. External connectors 6022, such as BGA connectors, may be coupled to conductive features of the package substrate 6034.

Embodiments may achieve advantages. Better system power efficiency and thermal management may be challenging in multiple stacking tiers (such as three or more tiers) of a 3D integrated circuit (3DIC) package. Topmost chips in the 3DIC package may be bonded in a face-to-face (F2F) stacking, and the other bondings of the 3DIC package may be face-to-back (F2B) stackings. The bonding may use bumpless bonds and/or metal (such as e.g. Cu) micro bump flip chip bonds. Bonding pitches of the 3DIC package may be arranged in a monotonically increasing order from the topmost tier to the bottommost tier, where the topmost bonding tier has the finest bond pitch and the bottommost bonding tier has the coarsest bond pitch. By integrating the power rail, or power distribution network (PDN), on the back side of at least one power rail chip located in the middle of the 3DIC package, the power efficiency and thermal management of the stacking system may be improved. The PDN may be integrated with functional chips located above and below the power rail chip through bumpless bonds and/or micro bump bonds at each bonding tier interface.

In accordance with an embodiment, a semiconductor device includes: a first die, the first die including a first substrate, a first interconnect structure on a backside of the first substrate, a second interconnect structure on an active side of the first substrate, and a first plurality of bonding pads on the second interconnect structure, the first plurality of bonding pads having a first pitch; a second die on the first die, the second die including a second substrate, a third interconnect structure on an active side of the second substrate, the third interconnect structure including a first via structure having a width that increases as the first via structure extends away from the second substrate, the first via structure including a first diffusion barrier layer and a first conductive material over the first diffusion barrier layer, a fourth interconnect structure on a backside of the second substrate, the fourth interconnect structure including a second via structure having a width that increases as the second via structure extends away from the second substrate, the second via structure including a second diffusion barrier layer and a second conductive material over the second diffusion barrier layer, a power distribution network (PDN) structure on the fourth interconnect structure such that the fourth interconnect structure is interposed between the PDN structure and the second substrate, a second plurality of bonding pads on the PDN structure, the second plurality of bonding pads bonded to the first plurality of bonding pads, and a third plurality of bonding pads on the third interconnect structure, the third plurality of bonding pads having a second pitch, the second pitch being less than the first pitch; and a third die on the second die, wherein the second die is interposed between the first die and the third die, the third die including a third substrate and a fourth plurality of bonding pads on an active side of the third substrate, the fourth plurality of bonding pads bonded to the third plurality of bonding pads. In an embodiment, sidewalls of the first substrate, the second substrate, and the third substrate are laterally aligned. In an embodiment, the semiconductor device further includes a dielectric material adjacent sidewalls of the second substrate, the dielectric material being interposed between the first die and the fourth interconnect structure. In an embodiment, conductive lines of the fourth interconnect structure have a first width in a top down view, conductive lines of the PDN structure have a second width in the top down view, and the second width is greater than the first width. In an embodiment, the first die is bonded to the second die by metal-metal bonds between respective pads of the first plurality of bonding pads and respective pads of the second plurality of bonding pads. In an embodiment, the fourth interconnect structure further includes embedded power component devices.

In accordance with another embodiment, a semiconductor device includes: a first die, the first die including a first substrate, a first plurality of through substrate vias (TSVs), each TSV of the first plurality of TSVs extending through the first substrate, a first interconnect structure on a first side of the first substrate, a first device layer on a second side of the first substrate, and a second interconnect structure on the first device layer, wherein the first substrate is interposed between the first interconnect structure and the second interconnect structure; a second die on the first die, the second die being directly bonded to the first die by first bonds, the first bonds having a first pitch, the second die including a second substrate, a third interconnect structure on a first side of the second substrate, the third interconnect structure including a first dielectric layer and a first interconnect extending through the first dielectric layer, the first interconnect including a first via and a first line, the first line having a first thickness, a first surface of the first dielectric layer being level with a first surface of the first via, a second surface of the first dielectric layer being level with a second surface of the first line, the first surface of the first dielectric layer being closer to the second substrate than the second surface of the first dielectric layer, a power distribution network (PDN) layer on the third interconnect structure, a conductive line of the PDN layer having a second thickness, the second thickness being greater than the first thickness, an power component layer on the PDN layer, a second plurality of through substrate vias (TSVs), each TSV of the second plurality of TSVs extending through the second substrate, and a fourth interconnect structure on a second side of the second substrate, the fourth interconnect structure including a second dielectric layer and a second interconnect extending through the second dielectric layer, the second interconnect including a second via and a second line, a first surface of the second dielectric layer being level with a first surface of the second via, a second surface of the second dielectric layer being level with a second surface of the second line, the first surface of the second dielectric layer being closer to the second substrate than the second surface of the second dielectric layer; and a third die directly bonded to the second die by second bonds, the second bonds having a second pitch smaller than the first pitch, the third die including a third substrate, a second device layer on a first side of the third substrate, and a fifth interconnect structure on the second device layer, wherein the second device layer is interposed between the third substrate and the fifth interconnect structure. In an embodiment, conductive features of the third interconnect structure have a third pitch, conductive features of the PDN layer have a fourth pitch, and the fourth pitch is larger than the third pitch. In an embodiment, the first die is directly bonded to the second die using metal-metal bonds and oxide-oxide bonds. In an embodiment, the first die is directly bonded to the second die using solder regions. In an embodiment, the semiconductor device further includes an underfill disposed between the first die and the second die. In an embodiment, the semiconductor device further includes an encapsulant along sidewalls of the first substrate. In an embodiment, the encapsulant is interposed between the first interconnect structure and the third interconnect structure. In an embodiment, the second die is free of active devices. In an embodiment, sidewalls of the first via and the first line are covered by a first diffusion barrier layer and sidewalls of the second via and the second line are covered by a second diffusion barrier layer.

In accordance with yet another embodiment, a method of forming a semiconductor device includes: forming a first bonding layer and a first plurality of bonding pads on a first surface of a first wafer; forming a first semi-global interconnect on a second wafer, the second wafer having a first plurality of through substrate vias (TSVs) embedded in a first substrate under the first semi-global interconnect, the forming the first semi-global interconnect including forming a first dielectric layer over the first substrate and forming a first via in the first dielectric layer with a damascene process, the first via having a first width that increases as the first via extends away from the first substrate; forming a second bonding layer and a second plurality of bonding pads on the first semi-global interconnect; bonding the first wafer to the second wafer, the bonding including bonding the first bonding layer to the second bonding layer and bonding each bonding pad of the first plurality of bonding pads with a respective bonding pad of the second plurality of bonding pads; removing a top portion of the first substrate to expose respective ends of each TSV of the first plurality of TSVs; forming a second semi-global interconnect over the remaining portion of the first substrate, including forming a second dielectric layer over the first substrate and forming a second via in the second dielectric layer with a damascene process, the second via having a second width that increases as the second via extends away from the first substrate; forming a power distribution network (PDN) layer over the second semi-global interconnect, a third via of the PDN layer having a third width, the third width being greater than the first width; forming a third bonding layer and a third plurality of bonding pads over the second semi-global interconnect on a second surface of the second wafer, the second surface of the second wafer being opposite the first surface of the second wafer; forming a fourth bonding layer and a fourth plurality of bonding pads on a first surface of a third wafer; and bonding the second wafer to the third wafer, the bonding including bonding the third bonding layer to the fourth bonding layer and bonding each bonding pad of the third plurality of bonding pads with the a respective bonding pad of the fourth plurality of bonding pads. In an embodiment, the method further includes: removing a top portion of a third substrate of the third wafer, the removing exposing each TSV of a second plurality of TSVs embedded in the third substrate; forming a global interconnect structure over the remaining portion of the third substrate; and forming a plurality of connectors on the global interconnect structure. In an embodiment, the first plurality of bonding pads and the second plurality of bonding pads have a first pitch, the third plurality of bonding pads and the fourth plurality of bonding pads have a second pitch, and the first pitch is greater than the second pitch. In an embodiment, forming the first via includes forming a first diffusion barrier layer along sidewalls of a first opening in the first dielectric layer and wherein forming the second via includes forming a second diffusion barrier layer along sidewalls of a second opening in the second dielectric layer. In an embodiment, the method further includes forming a power component layer on the PDN layer.

In accordance with yet another embodiment, a semiconductor device includes: a first die, the first die including: a first substrate; a first interconnect structure on a first side of the first substrate; and a first device layer on a second side of the first substrate; a second die on the first die, the second die including: a second substrate; a second interconnect structure on a first side of the second substrate, the second interconnect structure including a first line, the first line having a first thickness; and a power distribution network (PDN) layer on the second interconnect structure, a conductive line of the PDN layer having a second thickness, the second thickness being greater than the first thickness; and a third die on the second die, the third die including: a third substrate; and a second device layer on a first side of the third substrate. In an embodiment, the semiconductor device further includes: a front-side redistribution structure over the first die; an encapsulant under the front-side redistribution structure, the encapsulant encapsulating the first die, the second die, and the third die; a back-side redistribution structure under the encapsulant and the third die; and a through via coupled to the front-side redistribution structure and the back-side redistribution structure, the through via being encapsulated by the encapsulant. In an embodiment, the semiconductor device further includes: a package substrate attached to the back-side redistribution structure, wherein the package substrate is coupled to the through via through the back-side redistribution structure. In an embodiment, the semiconductor device further includes: a surface mount device attached to the front-side redistribution structure. In an embodiment, the semiconductor device further includes: a package substrate attached to the third die; and an encapsulant on the package substrate, the encapsulant encapsulating the first die, the second die, and the third die. In an embodiment, the semiconductor device further includes: an interposer attached to the third die; a package component attached to the interposer; and an encapsulant on the interposer, the encapsulant encapsulating the first die, the second die, the third die, and the package component. In an embodiment, the interposer includes a plurality of through vias. In an embodiment, the interposer includes a third interconnect structure. In an embodiment, the semiconductor device further includes: a package substrate under the interposer; and a plurality of connectors coupling the interposer to the package substrate.

In accordance with yet another embodiment, a semiconductor device includes: a first die, the first die including: a first substrate; a first plurality of bonding pads over the first substrate, the first plurality of bonding pads having a first pitch; a second die attached to the first die, the second die including: a second substrate; a first interconnect structure over an active side of the second substrate; a second interconnect structure over a backside of the second substrate; a power distribution network (PDN) structure over the second interconnect structure such that the second interconnect structure is interposed between the PDN structure and the second substrate; a second plurality of bonding pads over the PDN structure, the second plurality of bonding pads bonded to the first plurality of bonding pads; and a third plurality of bonding pads over the first interconnect structure, the third plurality of bonding pads having a second pitch, the second pitch being less than the first pitch; and a third die attached to the second die, wherein the second die is between the first die and the third die, the third die including: a third substrate; and a fourth plurality of bonding pads over an active side of the third substrate, the fourth plurality of bonding pads bonded to the third plurality of bonding pads. In an embodiment, the second die further includes a power component layer over the PDN structure. In an embodiment, the third die further includes a plurality of through vias embedded in the third substrate. In an embodiment, the third die further includes a global interconnect over a back side of the third substrate. In an embodiment, the semiconductor device further includes: a fourth die attached to the third die, wherein the third die is between the second die and the fourth die. In an embodiment, the bonding of the fourth plurality of bonding pads to the third plurality of bonding pads includes metal-metal bonds. In an embodiment, the bonding of the fourth plurality of bonding pads to the third plurality of bonding pads includes solder regions.

In accordance with yet another embodiment, a method of forming a semiconductor device includes: forming a first bonding layer and a first plurality of bonding pads over a first wafer; forming a second bonding layer and a second plurality of bonding pads over a first surface of a second wafer; bonding the first wafer to the second wafer, the bonding including bonding the first bonding layer to the second bonding layer and bonding each bonding pad of the first plurality of bonding pads with a respective bonding pad of the second plurality of bonding pads; forming a power distribution network (PDN) layer over a second surface of the second wafer, the second surface being opposite the first surface; forming a third bonding layer and a third plurality of bonding pads over the PDN layer; forming a fourth bonding layer and a fourth plurality of bonding pads over a third wafer; and bonding the second wafer to the third wafer, the bonding including bonding the third bonding layer to the fourth bonding layer and bonding each bonding pad of the third plurality of bonding pads with a respective bonding pad of the fourth plurality of bonding pads. In an embodiment, the method further includes: forming a deep trench capacitor over the PDN layer before forming the third bonding layer. In an embodiment, the method further includes: forming a voltage regulation circuit over the PDN layer before forming the third bonding layer. In an embodiment, the method further includes: forming a metal-insulator-metal capacitor over the PDN layer before forming the third bonding layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device comprising:
   a first die, the first die comprising:
      a first substrate;
      a first interconnect structure on a first side of the first substrate; and
      a first device layer on a second side of the first substrate;
   a second die on the first die, the second die comprising:
      a second substrate;
      a second interconnect structure on a first side of the second substrate, the second interconnect structure comprising a first line, the first line having a first thickness; and
      a power distribution network (PDN) layer on the second interconnect structure, a conductive line of the PDN layer having a second thickness, the second thickness being greater than the first thickness; and
   a third die on the second die, the third die comprising:
      a third substrate; and
      a second device layer on a first side of the third substrate.
2. The semiconductor device of claim 1, further comprising:
   a front-side redistribution structure over the first die;
   an encapsulant under the front-side redistribution structure, the encapsulant encapsulating the first die, the second die, and the third die;
   a back-side redistribution structure under the encapsulant and the third die; and a through via coupled to the front-side redistribution structure and the back-side redistribution structure, the through via being encapsulated by the encapsulant.

3. The semiconductor device of claim 2, further comprising a package substrate attached to the back-side redistribution structure, wherein the package substrate is coupled to the through via through the back-side redistribution structure.

4. The semiconductor device of claim 2, further comprising a surface mount device attached to the front-side redistribution structure.

5. The semiconductor device of claim 1, further comprising:
a package substrate attached to the third die; and
an encapsulant on the package substrate, the encapsulant encapsulating the first die, the second die, and the third die.

6. The semiconductor device of claim 1, further comprising:
an interposer attached to the third die;
a package component attached to the interposer; and
an encapsulant on the interposer, the encapsulant encapsulating the first die, the second die, the third die, and the package component.

7. The semiconductor device of claim 6, wherein the interposer comprises a plurality of through vias.

8. The semiconductor device of claim 6, wherein the interposer comprises a third interconnect structure.

9. The semiconductor device of claim 6, further comprising:
a package substrate under the interposer; and
a plurality of connectors coupling the interposer to the package substrate.

10. A semiconductor device comprising:
a first die, the first die comprising:
a first substrate;
a first plurality of bonding pads over the first substrate, the first plurality of bonding pads having a first pitch;
a second die attached to the first die, the second die comprising:
a second substrate;
a first interconnect structure over an active side of the second substrate;
a second interconnect structure over a backside of the second substrate;
a power distribution network (PDN) structure over the second interconnect structure such that the second interconnect structure is interposed between the PDN structure and the second substrate;
a second plurality of bonding pads over the PDN structure, the second plurality of bonding pads bonded to the first plurality of bonding pads; and
a third plurality of bonding pads over the first interconnect structure, the third plurality of bonding pads having a second pitch, the second pitch being less than the first pitch; and a third die attached to the second die, wherein the second die is between the first die and the third die, the third die comprising:
a third substrate; and
a fourth plurality of bonding pads over an active side of the third substrate, the fourth plurality of bonding pads bonded to the third plurality of bonding pads.

11. The semiconductor device of claim 10, wherein the second die further comprises a power component layer over the PDN structure.

12. The semiconductor device of claim 10, wherein the third die further comprises a plurality of through vias embedded in the third substrate.

13. The semiconductor device of claim 12, wherein the third die further comprises a global interconnect over a back side of the third substrate.

14. The semiconductor device of claim 10, further comprising a fourth die attached to the third die, wherein the third die is between the second die and the fourth die.

15. The semiconductor device of claim 10, wherein the bonding of the fourth plurality of bonding pads to the third plurality of bonding pads comprises metal-metal bonds.

16. The semiconductor device of claim 10, wherein the bonding of the fourth plurality of bonding pads to the third plurality of bonding pads comprises solder regions.

17. A method of forming a semiconductor device, the method comprising:
forming a first bonding layer and a first plurality of bonding pads over a first wafer;
forming a second bonding layer and a second plurality of bonding pads over a first surface of a second wafer;
bonding the first wafer to the second wafer, the bonding comprising bonding the first bonding layer to the second bonding layer and bonding each bonding pad of the first plurality of bonding pads with a respective bonding pad of the second plurality of bonding pads;
forming a power distribution network (PDN) layer over a second surface of the second wafer, the second surface being opposite the first surface;
forming a third bonding layer and a third plurality of bonding pads over the PDN layer;
forming a fourth bonding layer and a fourth plurality of bonding pads over a third wafer; and
bonding the second wafer to the third wafer, the bonding comprising bonding the third bonding layer to the fourth bonding layer and bonding each bonding pad of the third plurality of bonding pads with a respective bonding pad of the fourth plurality of bonding pads.

18. The method of claim 17, further comprising forming a deep trench capacitor over the PDN layer before forming the third bonding layer.

19. The method of claim 17, further comprising forming a voltage regulation circuit over the PDN layer before forming the third bonding layer.

20. The method of claim 17, further comprising forming a metal-insulator-metal capacitor over the PDN layer before forming the third bonding layer.

* * * * *